(12) United States Patent
Liao et al.

(10) Patent No.: US 11,532,627 B2
(45) Date of Patent: Dec. 20, 2022

(54) SOURCE/DRAIN CONTACT STRUCTURE

(71) Applicant: Taiwan Semiconductor Manufacturing Co., Ltd., Hsinchu (TW)

(72) Inventors: Yi-Bo Liao, Hsinchu (TW); Yu-Xuan Huang, Hsinchu (TW); Wei Ju Lee, Hsinchu (TW); Hou-Yu Chen, Hsinchu County (TW); Chun-Fu Cheng, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/093,230

(22) Filed: Nov. 9, 2020

(65) Prior Publication Data
US 2021/0366907 A1 Nov. 25, 2021

Related U.S. Application Data

(60) Provisional application No. 63/028,770, filed on May 22, 2020.

(51) Int. Cl.
*H01L 27/092* (2006.01)
*H01L 29/06* (2006.01)
(Continued)

(52) U.S. Cl.
CPC .. *H01L 27/0924* (2013.01); *H01L 21/823412* (2013.01); *H01L 21/823418* (2013.01);
(Continued)

(58) Field of Classification Search
CPC ............ H01L 21/02603; H01L 21/768; H01L 21/76816; H01L 21/823412; H01L 21/823418; H01L 21/823431; H01L 21/823475; H01L 21/823807; H01L 21/823814; H01L 21/823821; H01L 21/823871; H01L 21/845; H01L 23/52; H01L 23/528; H01L 23/5386; H01L 24/18; H01L 24/82; H01L 27/0886;
(Continued)

(56) References Cited

U.S. PATENT DOCUMENTS 9,818,872 B2 11/2017 Ching et al.
9,887,267 B2 2/2018 Lee et al.
(Continued)

FOREIGN PATENT DOCUMENTS

KR 20190072674 A 6/2019

*Primary Examiner* — David C Spalla
(74) *Attorney, Agent, or Firm* — Haynes and Boone, LLP

(57) ABSTRACT

A semiconductor device according to the present disclosure includes a first interconnect structure, a first transistor over the first interconnect structure, a second transistor over the first transistor, and a second interconnect structure over the second transistor. The first transistor includes first nanostructures and a first source region adjoining the first nanostructures. The second transistor includes second nanostructures and a second source region adjoining the second nanostructures. The first source region is coupled to a first (Continued)

power rail in the first interconnect structure, and the second source region is coupled to a second power rail in the second interconnect structure.

20 Claims, 57 Drawing Sheets

(51) Int. Cl.
  *H01L 29/66* (2006.01)
  *H01L 29/78* (2006.01)
  *H01L 21/8234* (2006.01)
  *H01L 23/538* (2006.01)

(52) U.S. Cl.
  CPC .. *H01L 21/823431* (2013.01); *H01L 23/5386* (2013.01); *H01L 29/0673* (2013.01); *H01L 29/66795* (2013.01); *H01L 29/7851* (2013.01)

(58) Field of Classification Search
  CPC ........... H01L 27/0924; H01L 27/10879; H01L 27/1211; H01L 29/0665; H01L 29/0669; H01L 29/0673; H01L 29/41791; H01L 29/66439; H01L 29/66795; H01L 29/775; H01L 29/7848; H01L 29/785; H01L 29/7851; H01L 29/7853; H01L 29/7855; H01L 2029/7858
  See application file for complete search history.

(56) References Cited

U.S. PATENT DOCUMENTS

| | | | |
|---|---|---|---|
| 9,899,398 | B1 | 2/2018 | Colinge et al. |
| 10,032,627 | B2 | 7/2018 | Simin et al. |
| 10,109,721 | B2 | 10/2018 | Lin et al. |
| 10,157,799 | B2 | 12/2018 | Ching et al. |
| 10,192,819 | B1 * | 1/2019 | Chanemougame ........................ H01L 29/41725 |
| 10,199,502 | B2 | 2/2019 | Huang et al. |
| 10,290,546 | B2 | 5/2019 | Chiang et al. |
| 10,475,902 | B2 | 11/2019 | Lee et al. |
| 2016/0211276 | A1 | 7/2016 | Liu |
| 2017/0077096 | A1 | 3/2017 | Wu |
| 2018/0175036 | A1 | 6/2018 | Ching et al. |
| 2018/0315709 | A1 | 11/2018 | Schultz |
| 2018/0315838 | A1 * | 11/2018 | Morrow ................ H01L 23/485 |
| 2019/0148376 | A1 * | 5/2019 | Chanemougame ........................ H01L 21/8221 257/532 |
| 2019/0214469 | A1 * | 7/2019 | Paul ................ H01L 29/78654 |
| 2020/0075574 | A1 * | 3/2020 | Smith ................ B82Y 10/00 |
| 2020/0126987 | A1 | 4/2020 | Rubin et al. |
| 2021/0184000 | A1 * | 6/2021 | Ramaswamy .. H01L 21/823842 |

* cited by examiner

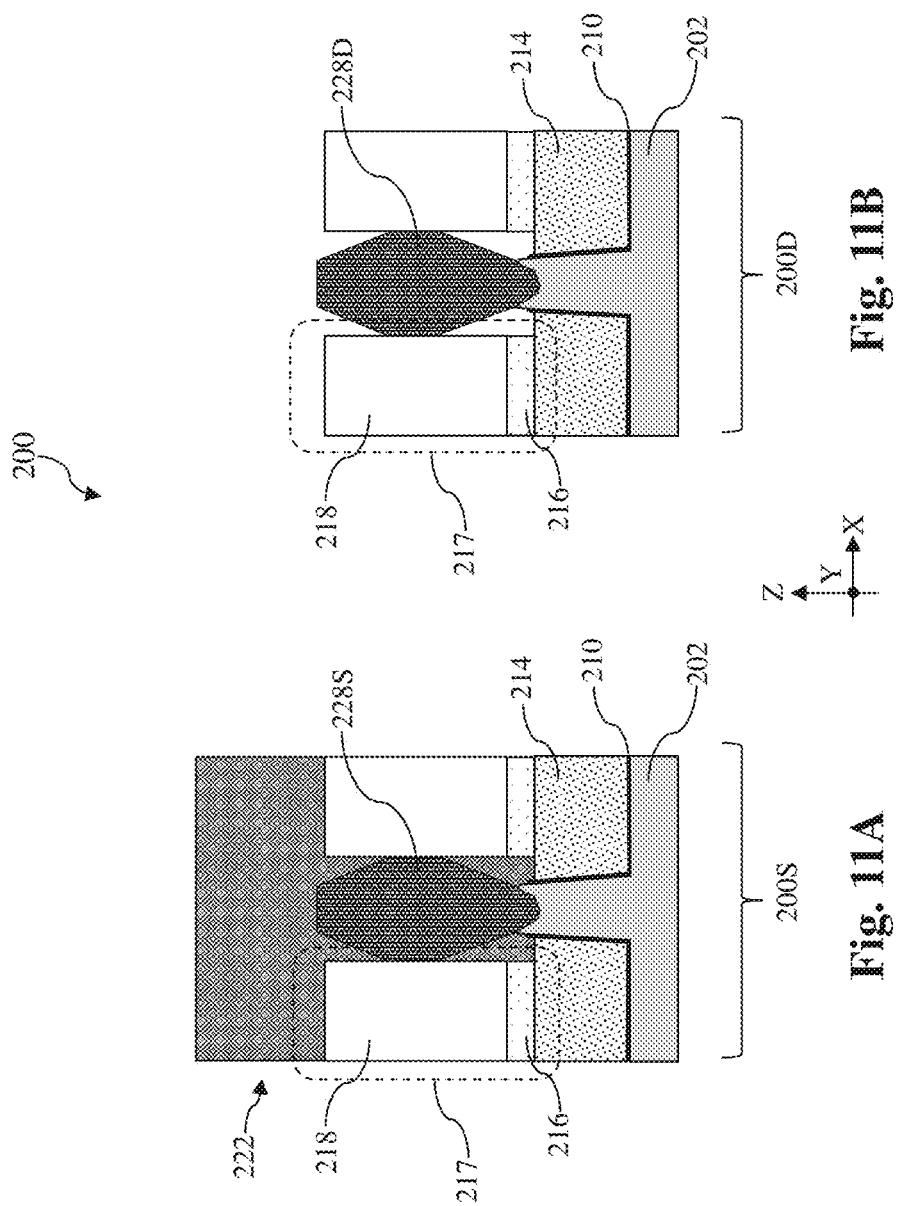

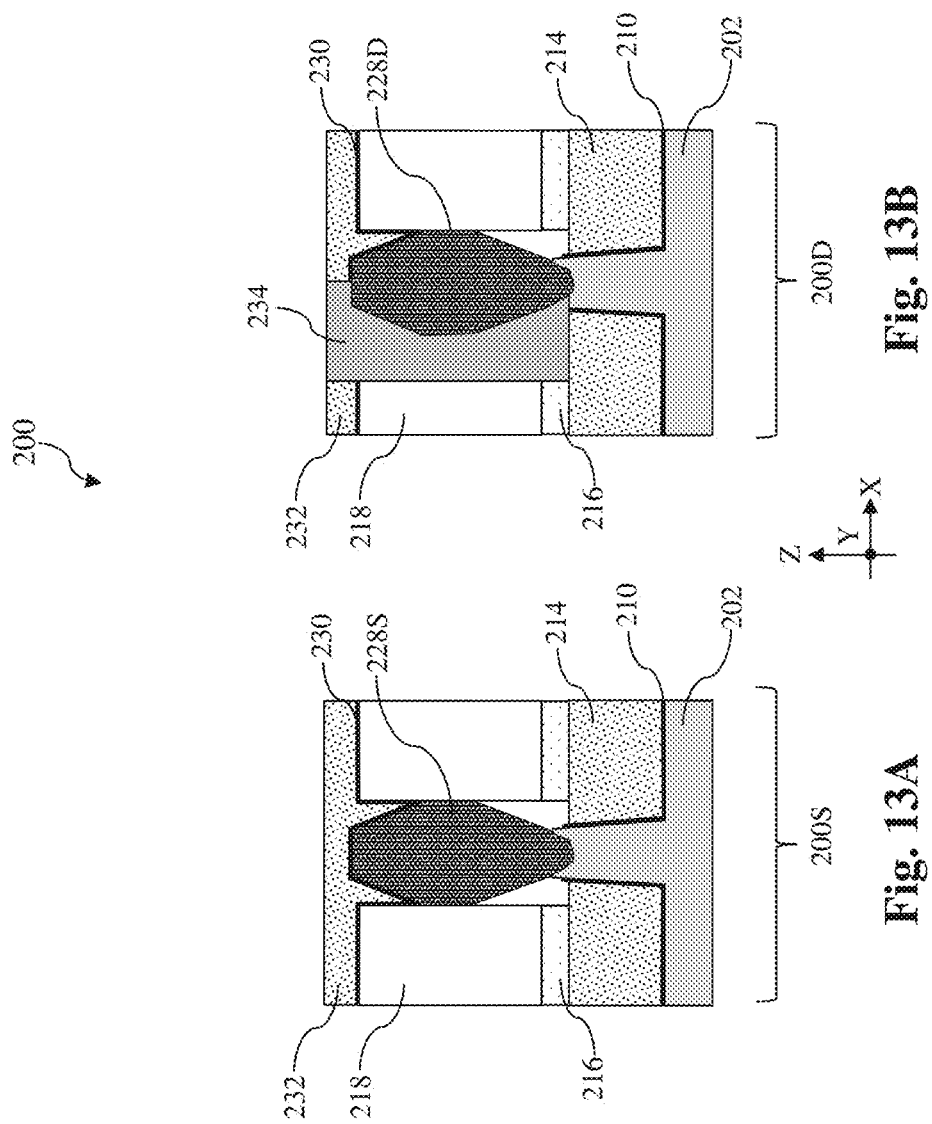

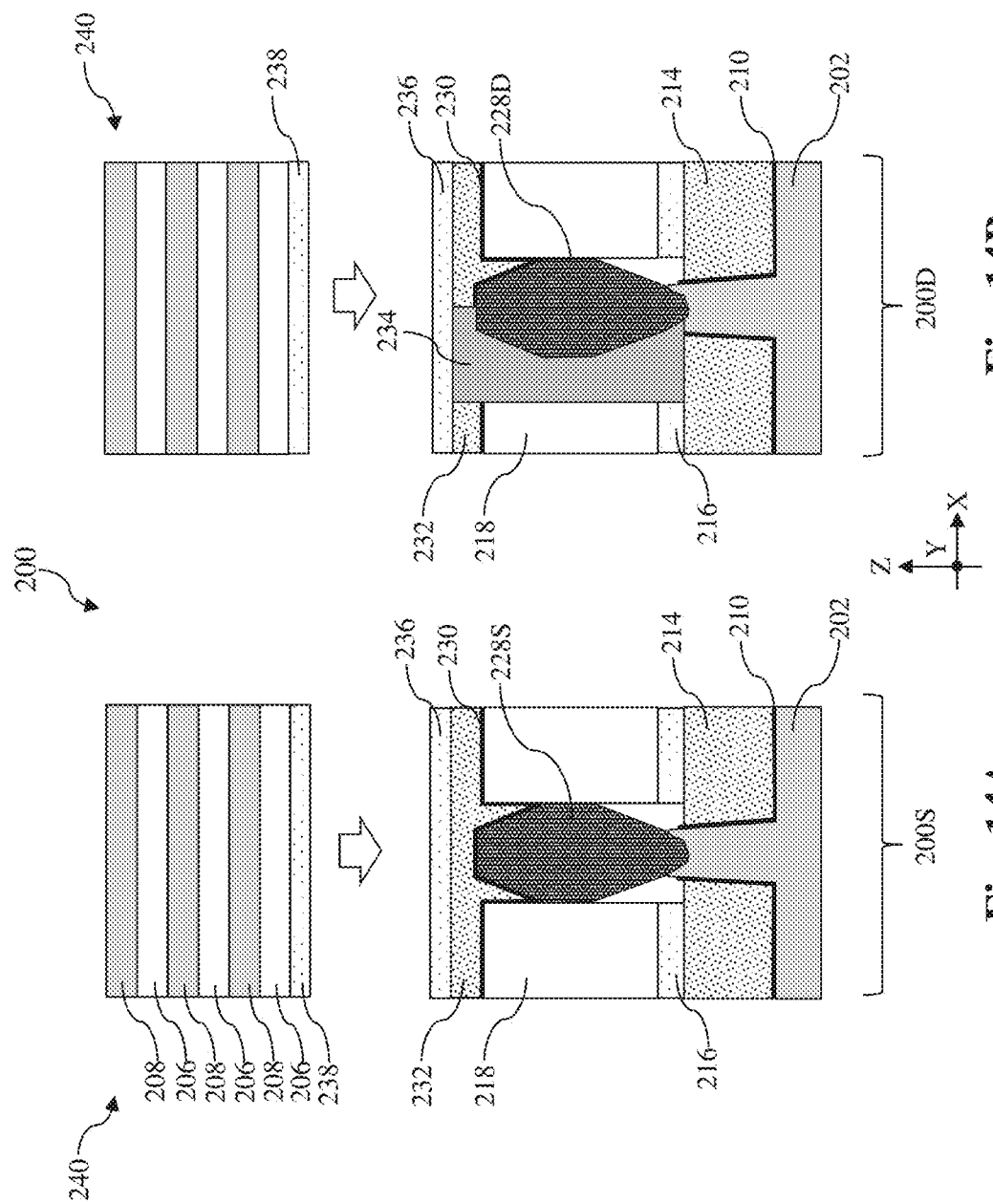

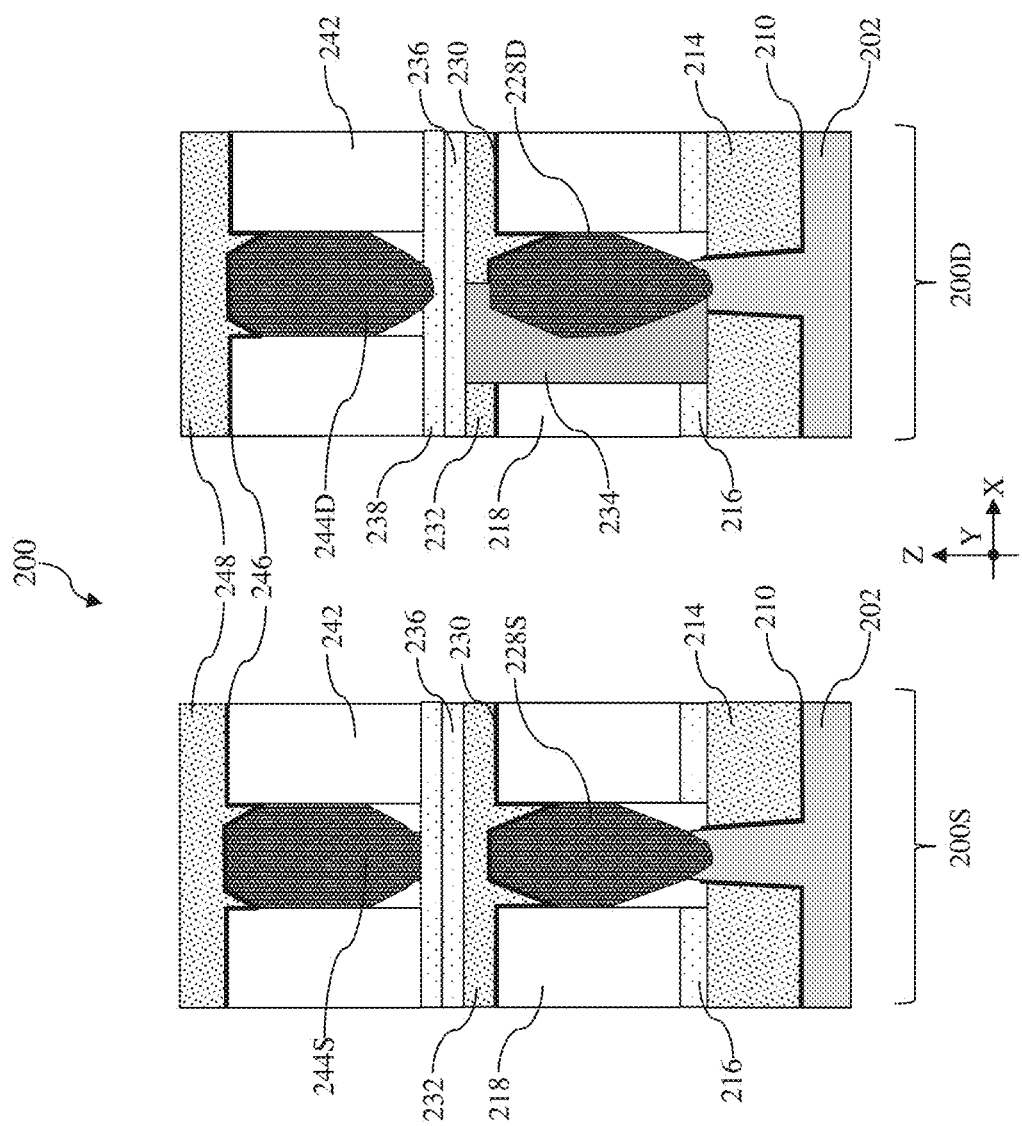

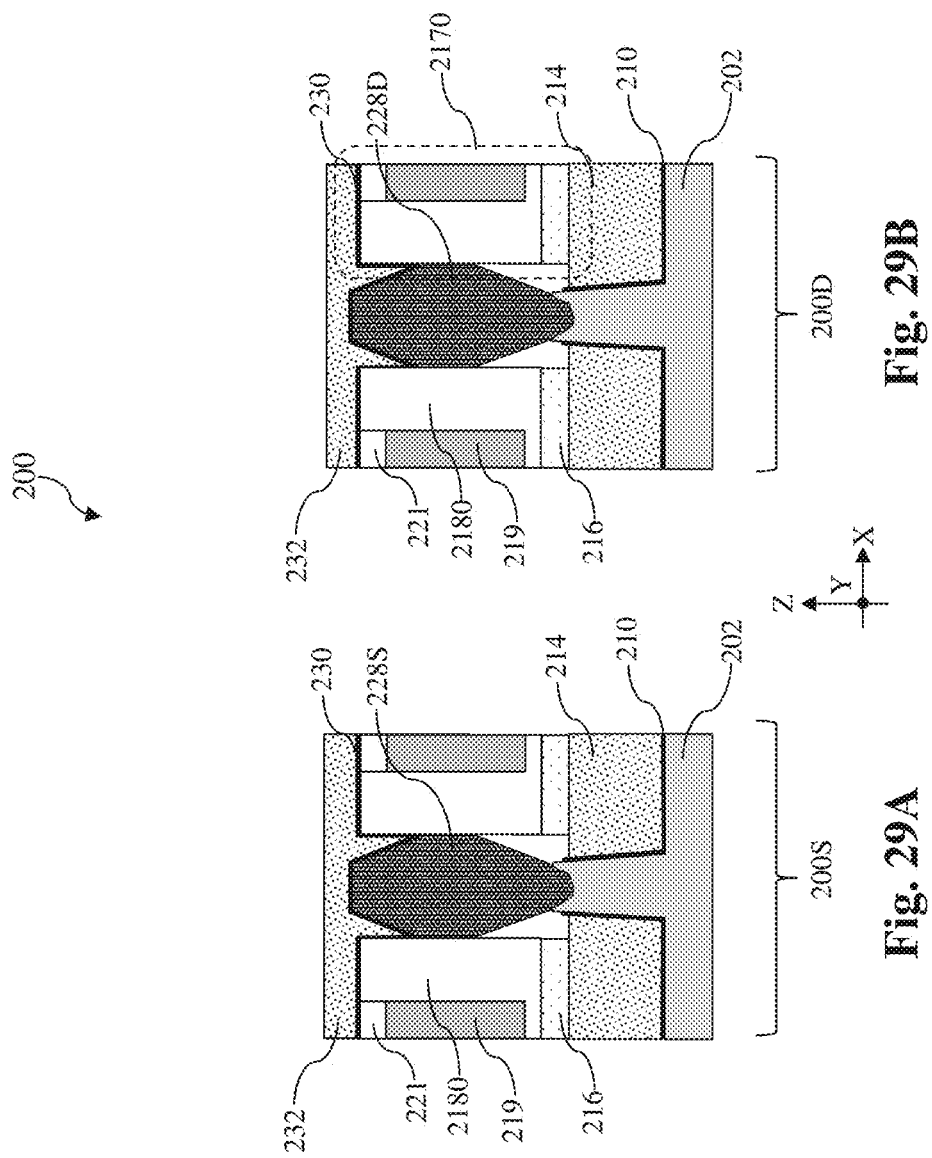

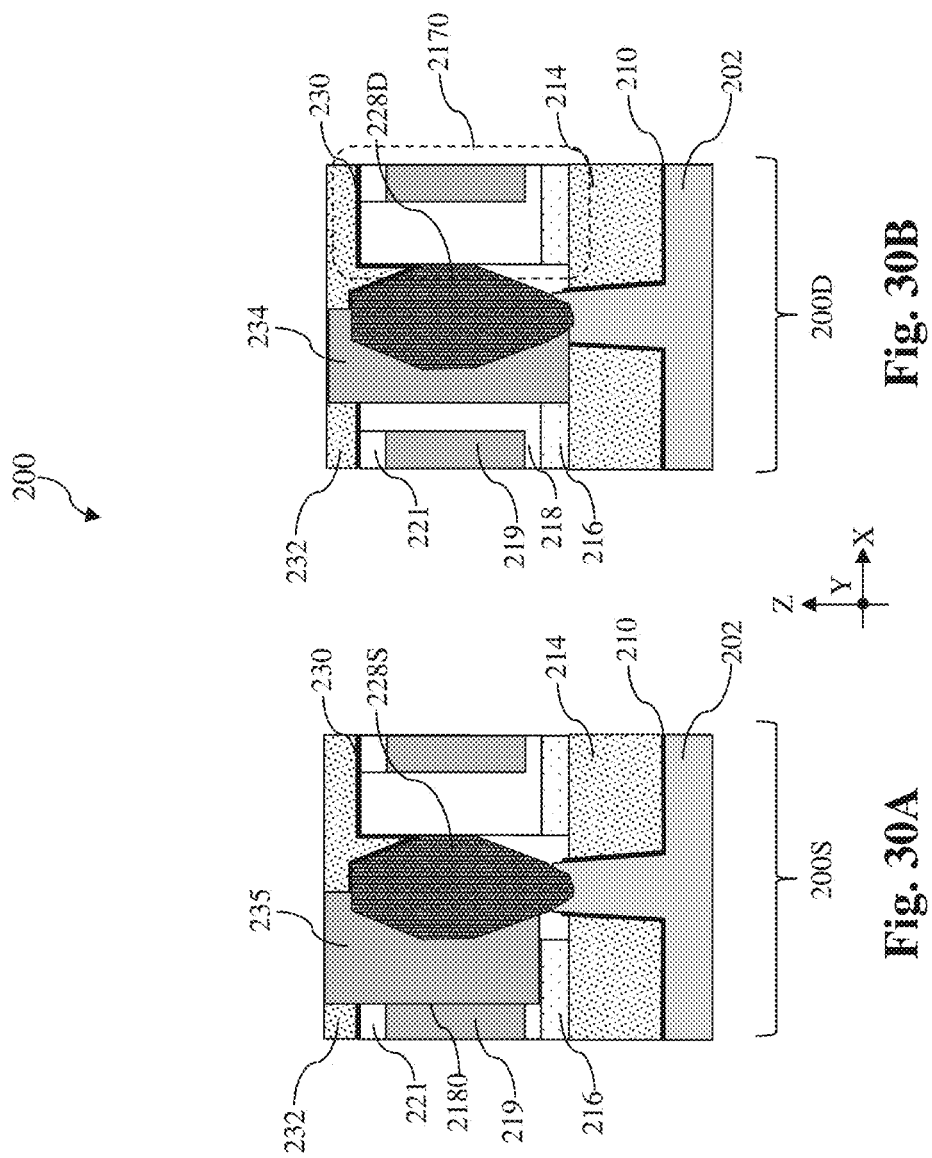

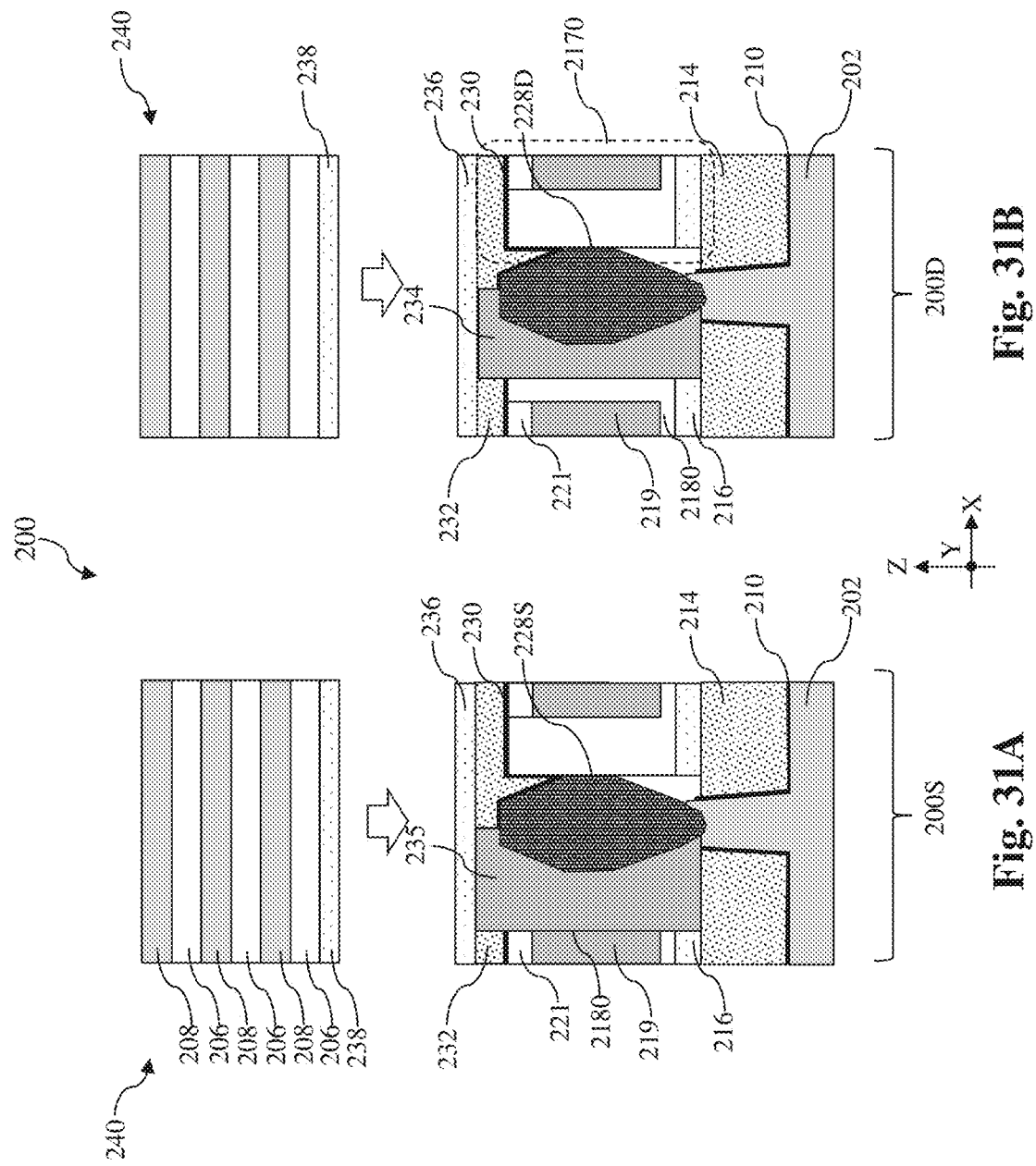

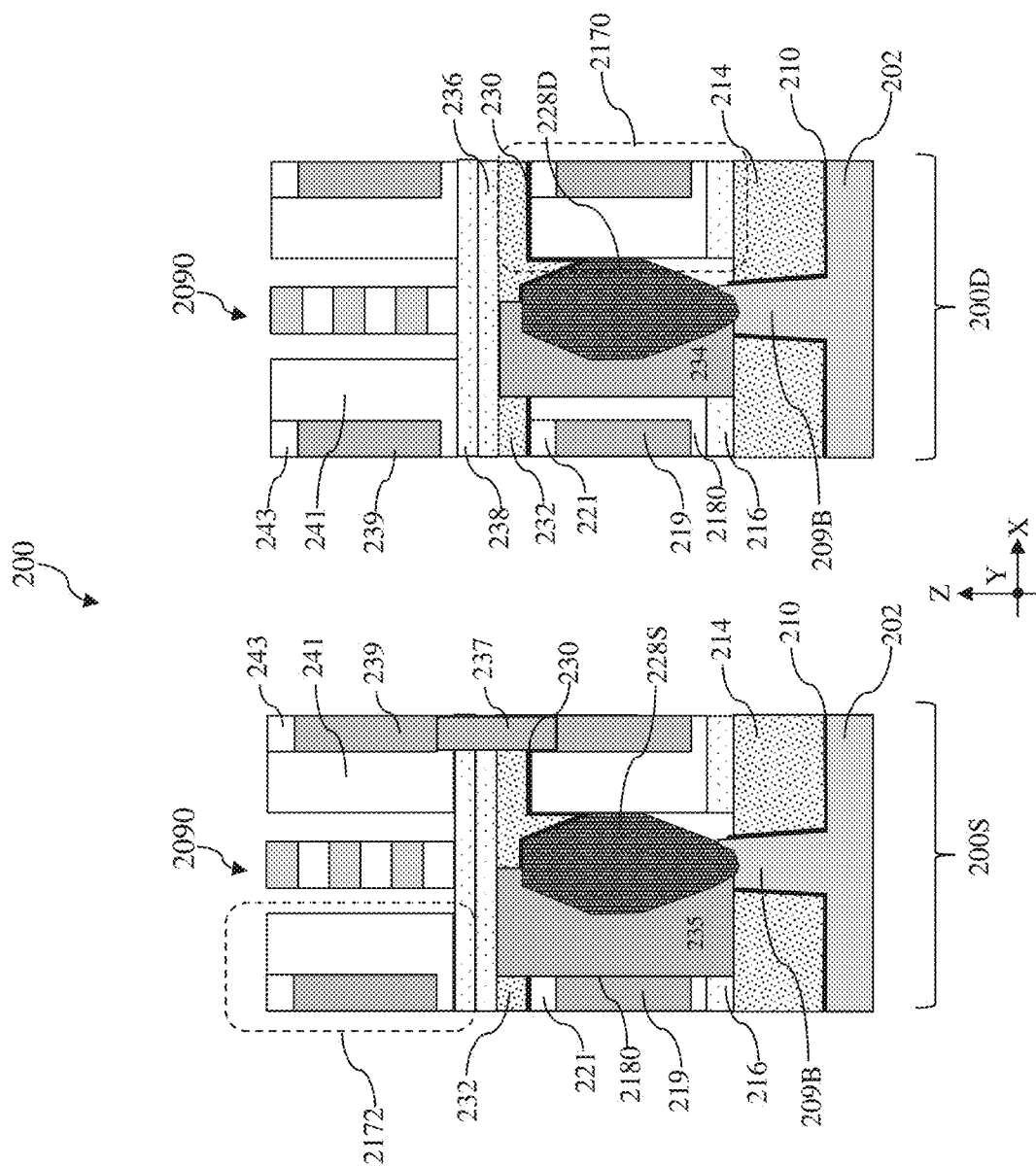

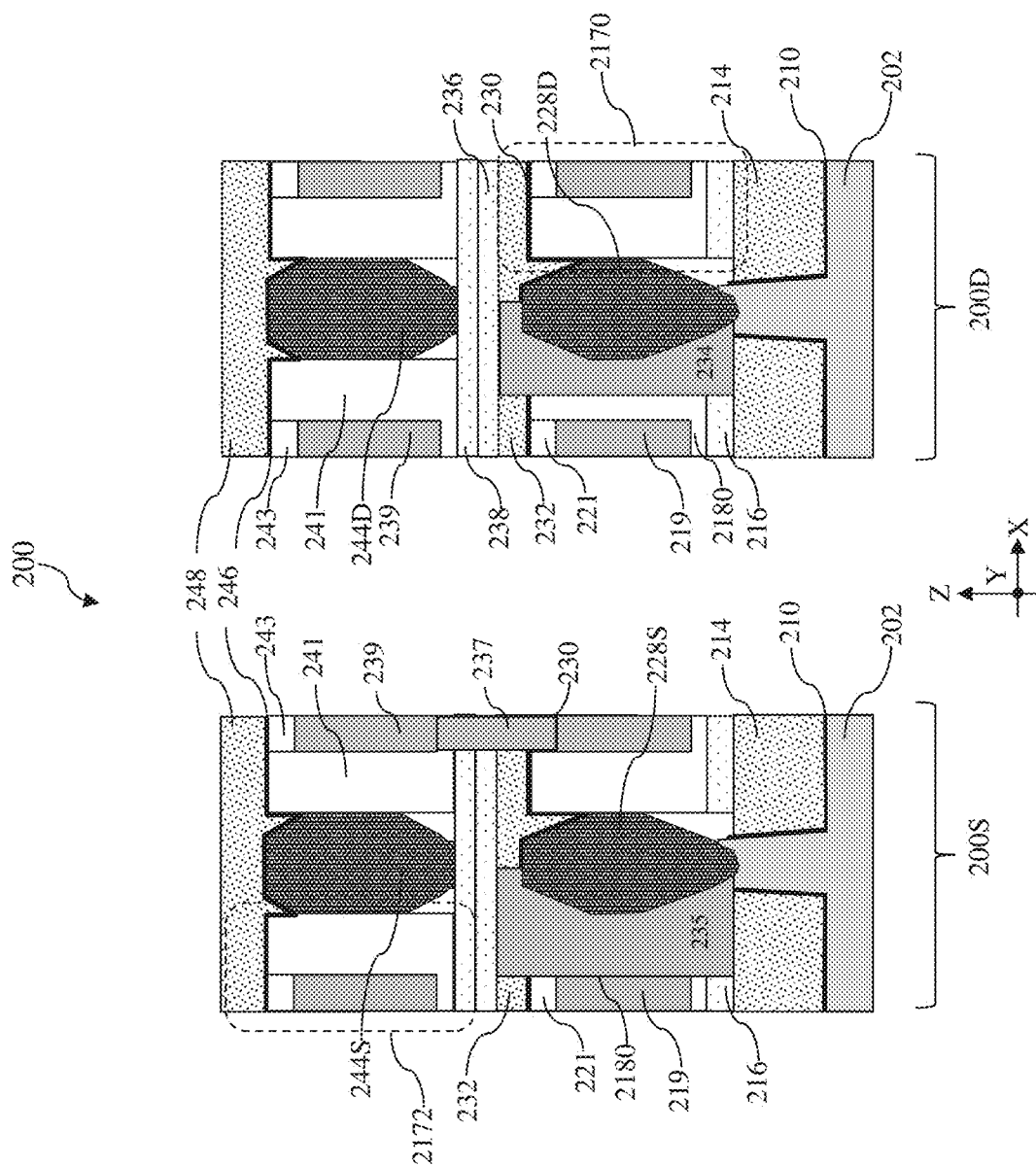
Fig. 33A / Fig. 33B

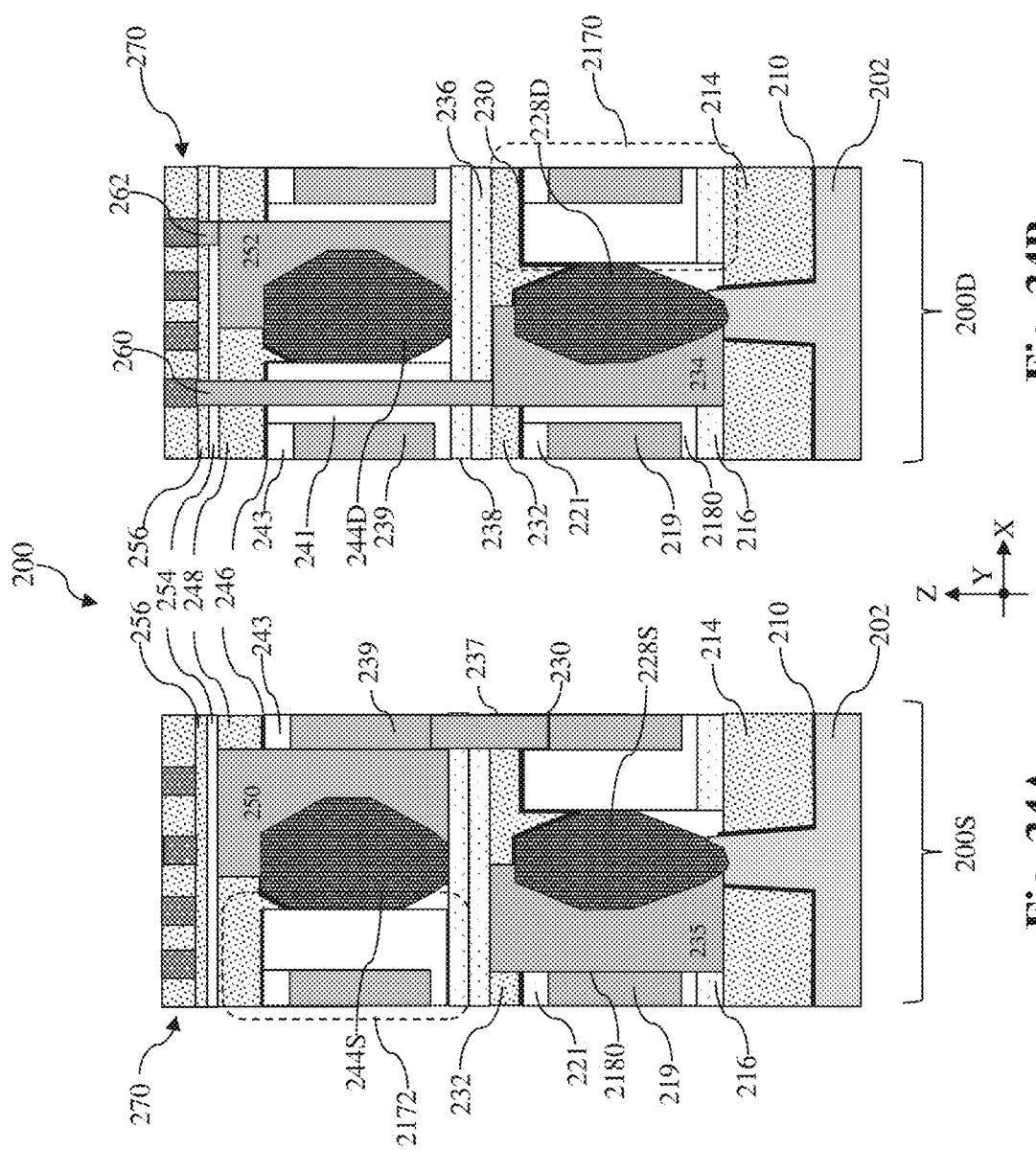

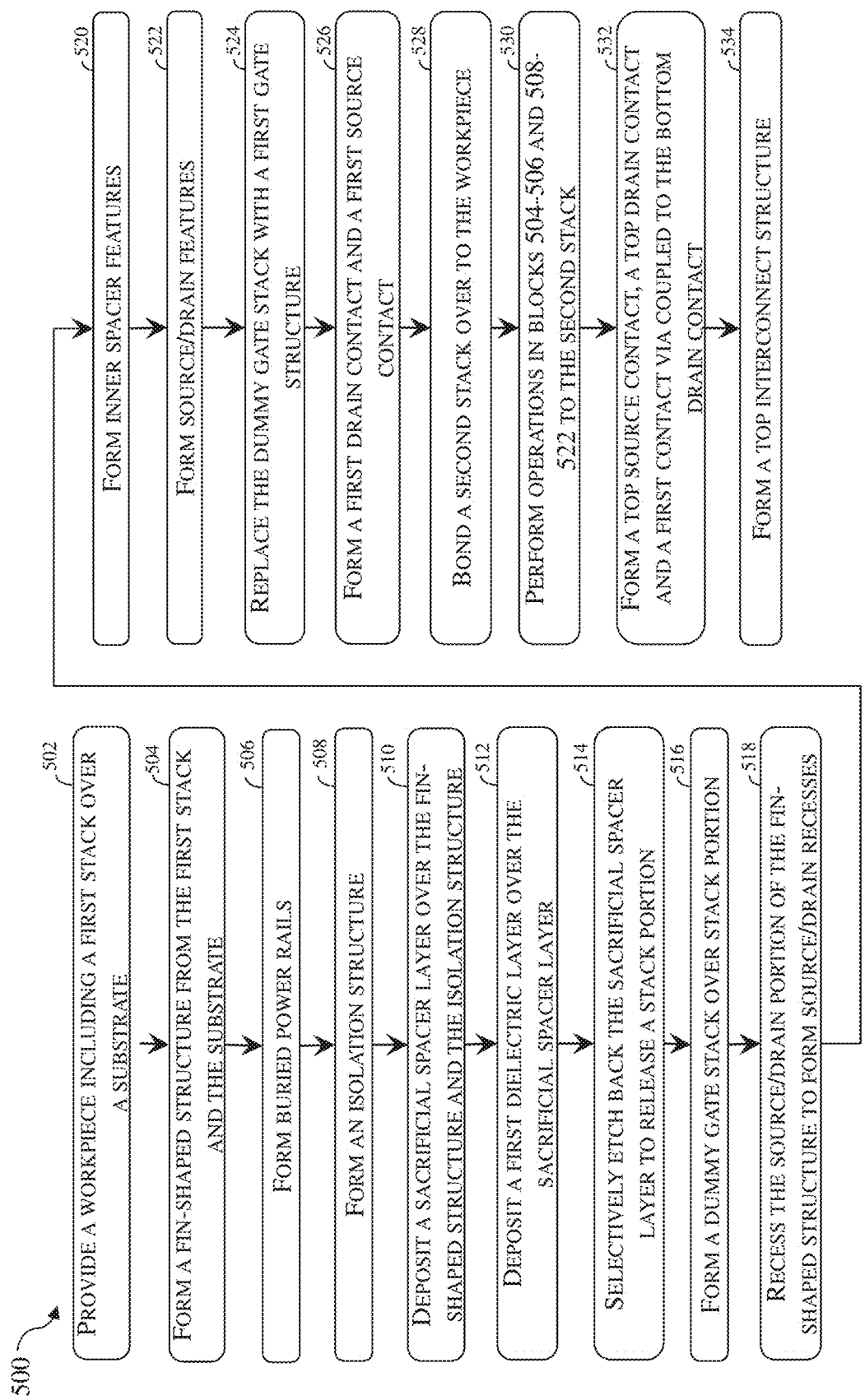

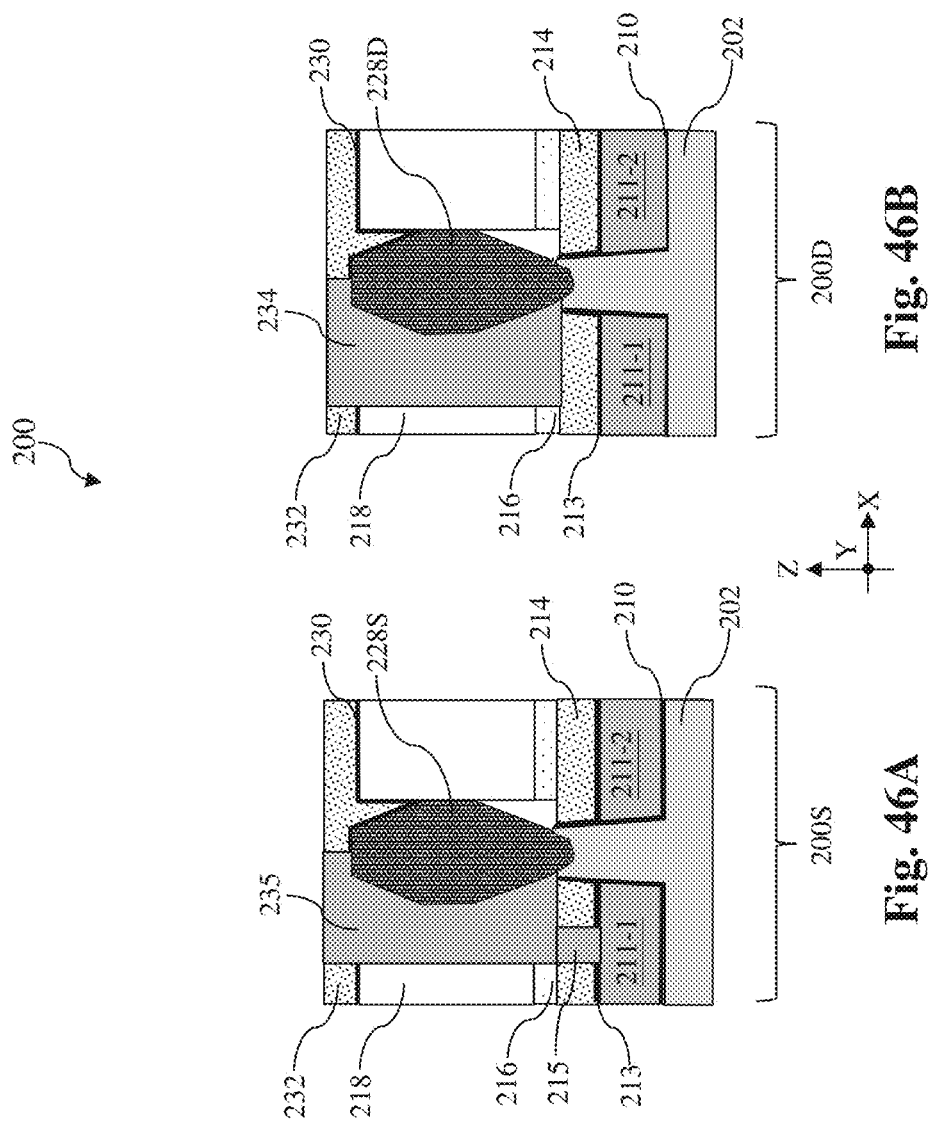

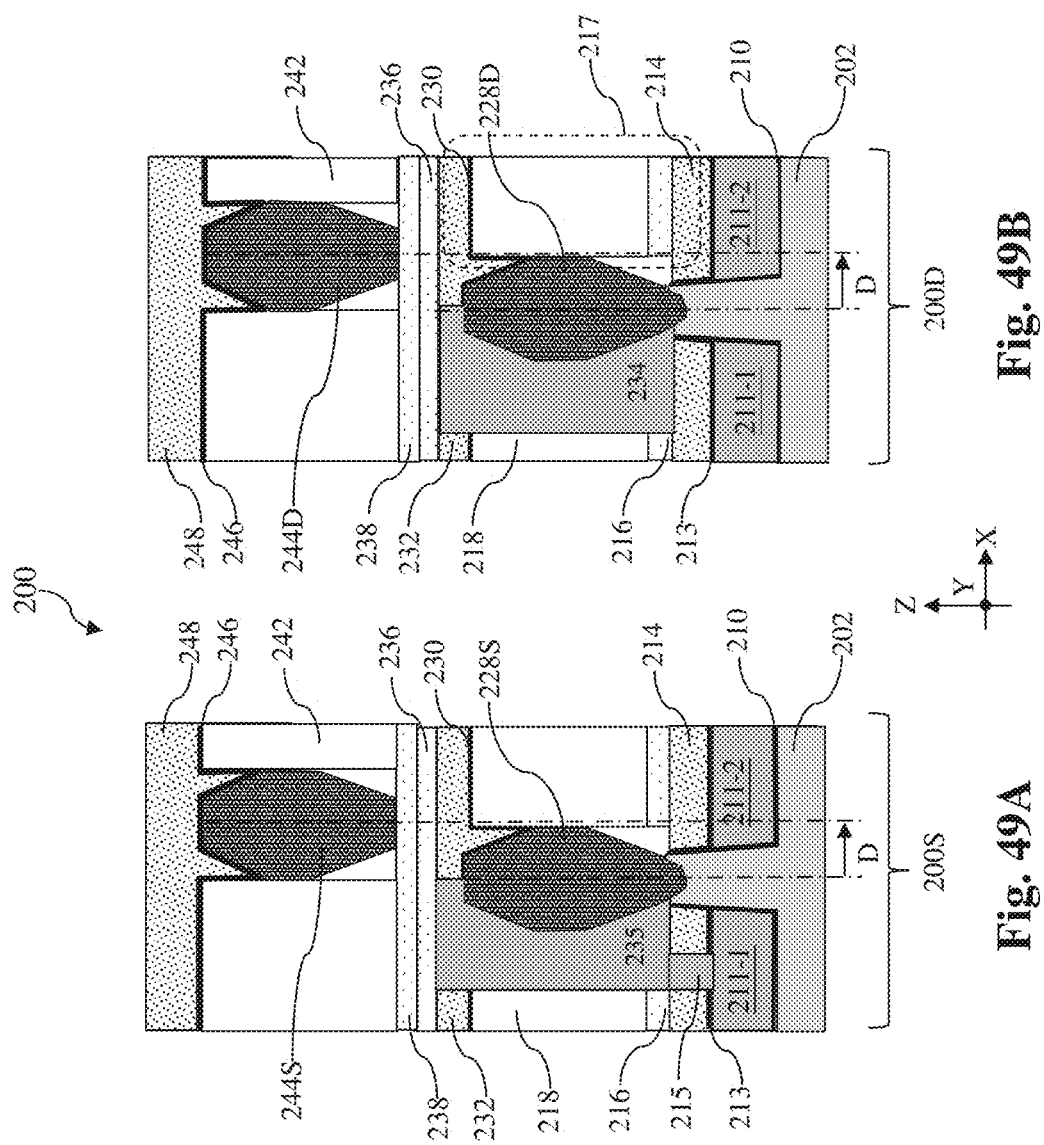

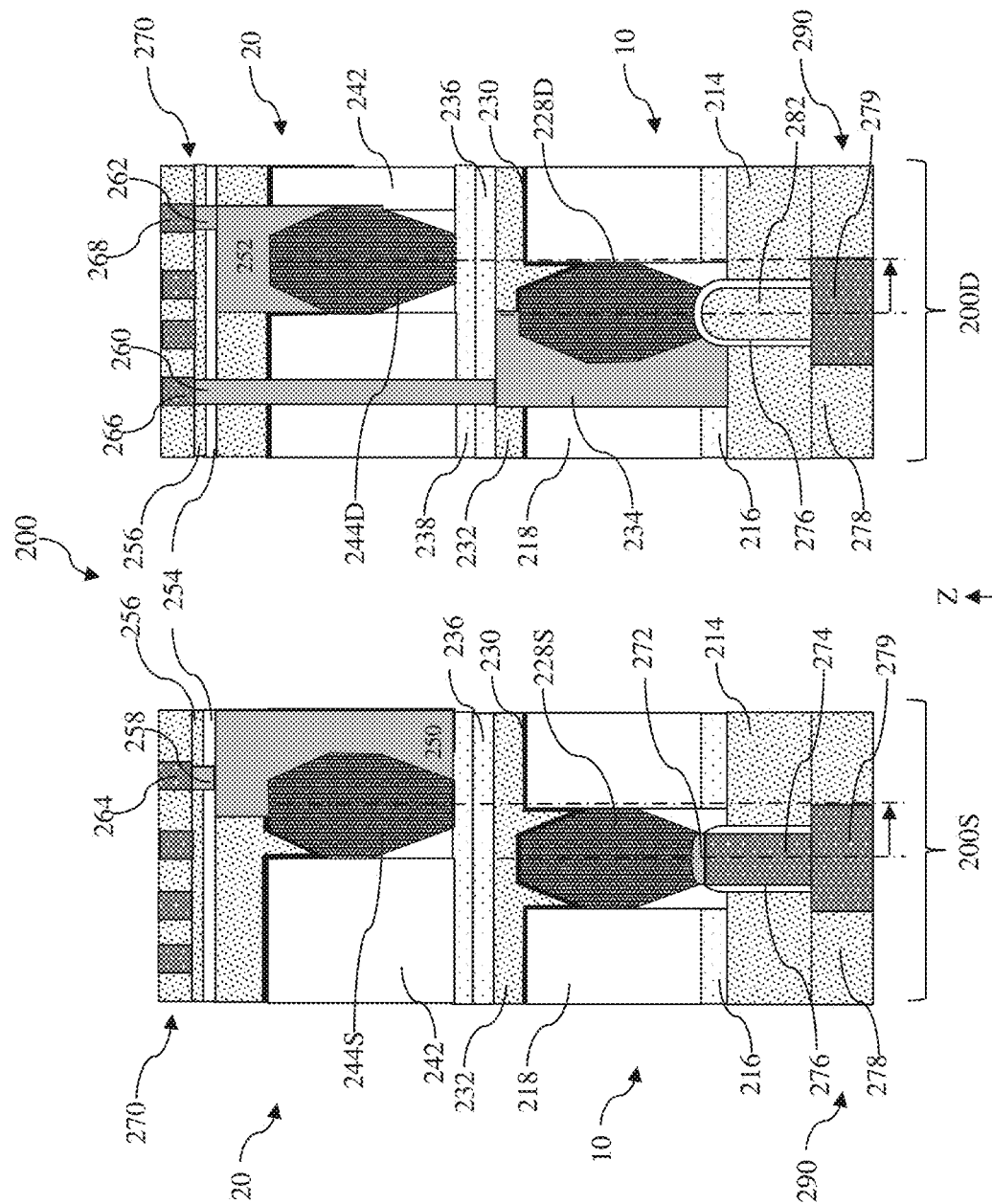

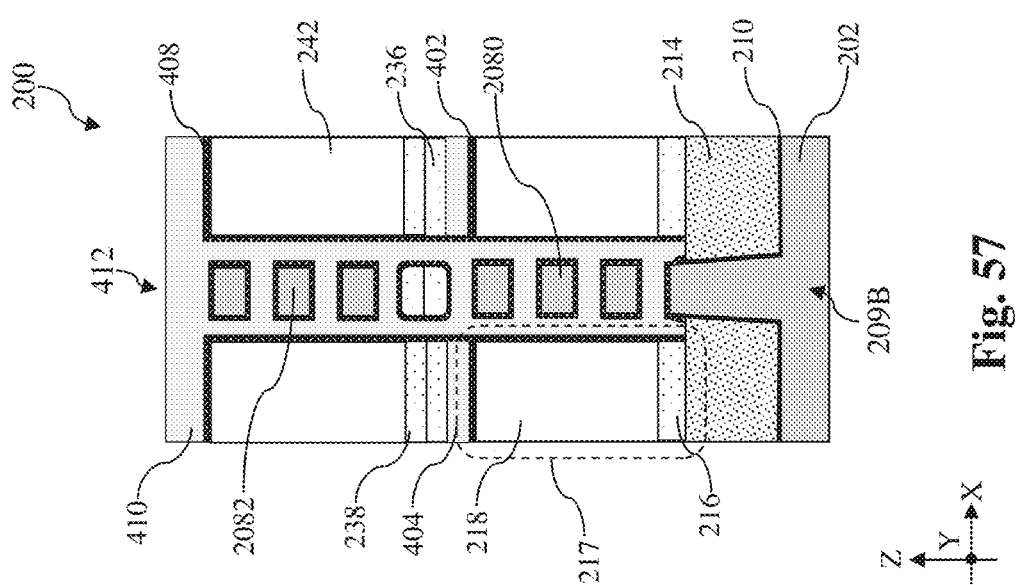

SOURCE/DRAIN CONTACT STRUCTURE

PRIORITY DATA

This application claims priority to U.S. Provisional Patent Application No. 63/028,770 filed on May 22, 2020, entitled "SOURCE/DRAIN CONTACT STRUCTURE", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

Implementation of multi-gate transistors reduces device dimensions and increase device packing density, which poses challenges in forming power and signal routing. While existing source/drain contact structures are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-10, 11A-17A, and 11B-17B illustrate fragmentary cross-sectional views of a workpiece during a fabrication process according to the method of FIG. 1, according to one or more aspects of the present disclosure.

FIGS. 19-28, 29A-35A, and 29B-35B illustrate fragmentary cross-sectional views of a workpiece during a fabrication process according to the method of FIG. 18, according to one or more aspects of the present disclosure.

FIG. 36 illustrates a flow chart of a method for forming a semiconductor device having a backside power rail, according to one or more aspects of the present disclosure.

FIGS. 37-44, 45A-50A, and 45B-50B illustrate fragmentary cross-sectional views of a workpiece during a fabrication process according to the method of FIG. 36, according to one or more aspects of the present disclosure.

FIGS. 51A and 51B illustrate fragmentary cross-sectional views of a semiconductor device, according to one or more aspects of the present disclosure.

FIGS. 53-57 illustrate fragmentary cross-sectional view of a workpiece at various stages in the method in FIG. 52, according to one or more aspects of the present disclosure.

DETAILED DESCRIPTION

Figure 1:
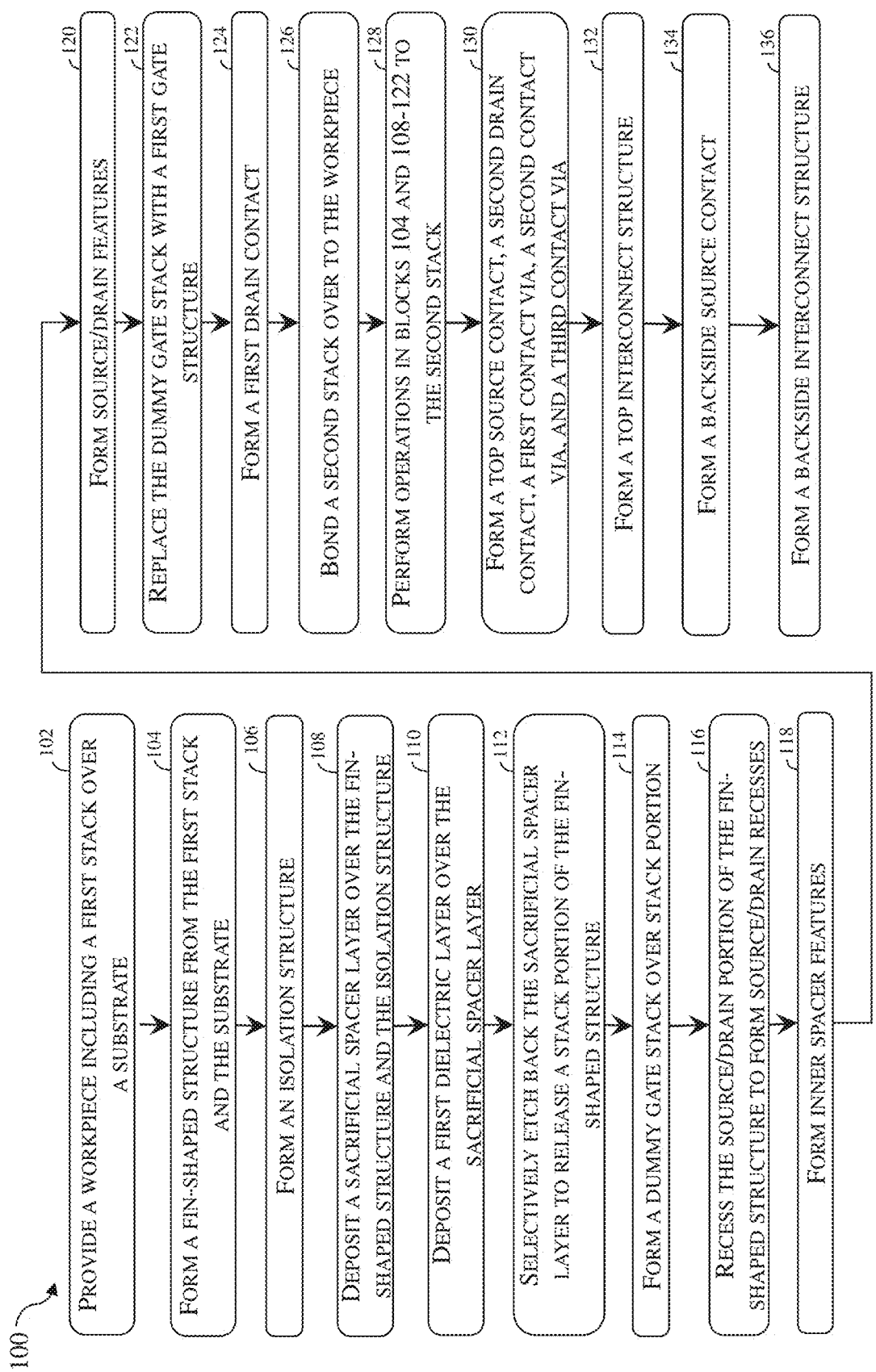
FIG. 1 illustrates a flow chart of a method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

High packing density achieved by adoption of MBC transistors creates challenges in forming satisfactory power and signal routing structures and features. To meet these challenges, the present disclosure provides embodiments that utilizes different combination of contact structure schemes to achieve flexibility and density in power and signal routing. When a second MBC transistor is disposed over a first MBC transistor, contact structure schemes according to the present disclosure include, for example, dual interconnect structures, hybrid fins with embedded conductive features, and offset device stacking. In "dual interconnect structures", a source feature of the first MBC transistor is coupled to a power rail in a first interconnect structure by a backside source contact and a source feature of the second MBC transistor is coupled to a power rail in a second interconnect structure over the second MBC transistor. In "hybrid fins with embedded conductive features," a conductive feature is embedded in each of the hybrid fins to provide contact modules that serve as conductive path ways to interconnect structures. In "offset device stacking," the source/drain regions of the first MBC transistor and the second MBC transistor are offset to one another to increase spacing between contact vias and drain features.

Figures 17A, 17B:
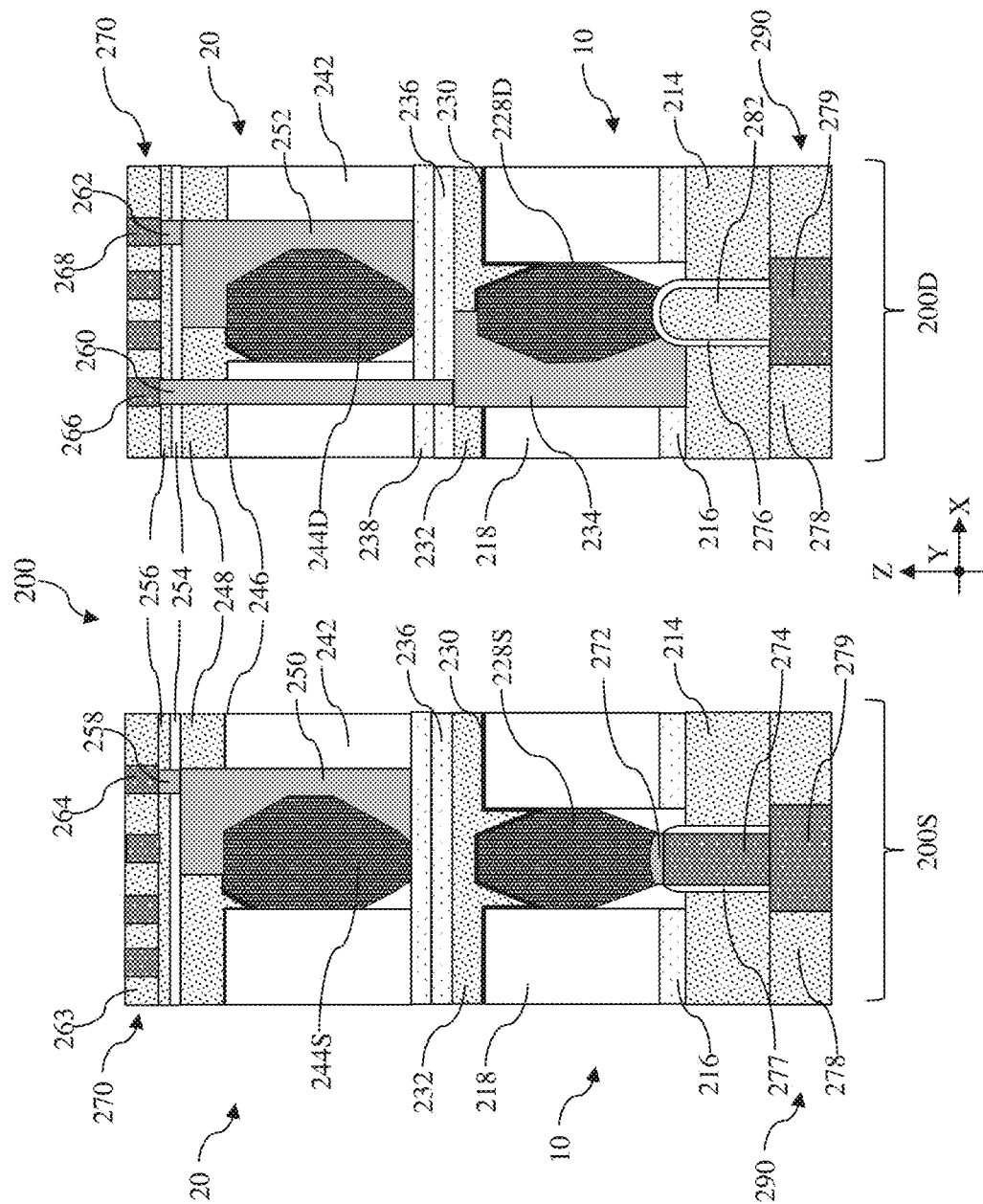
Figure 18:
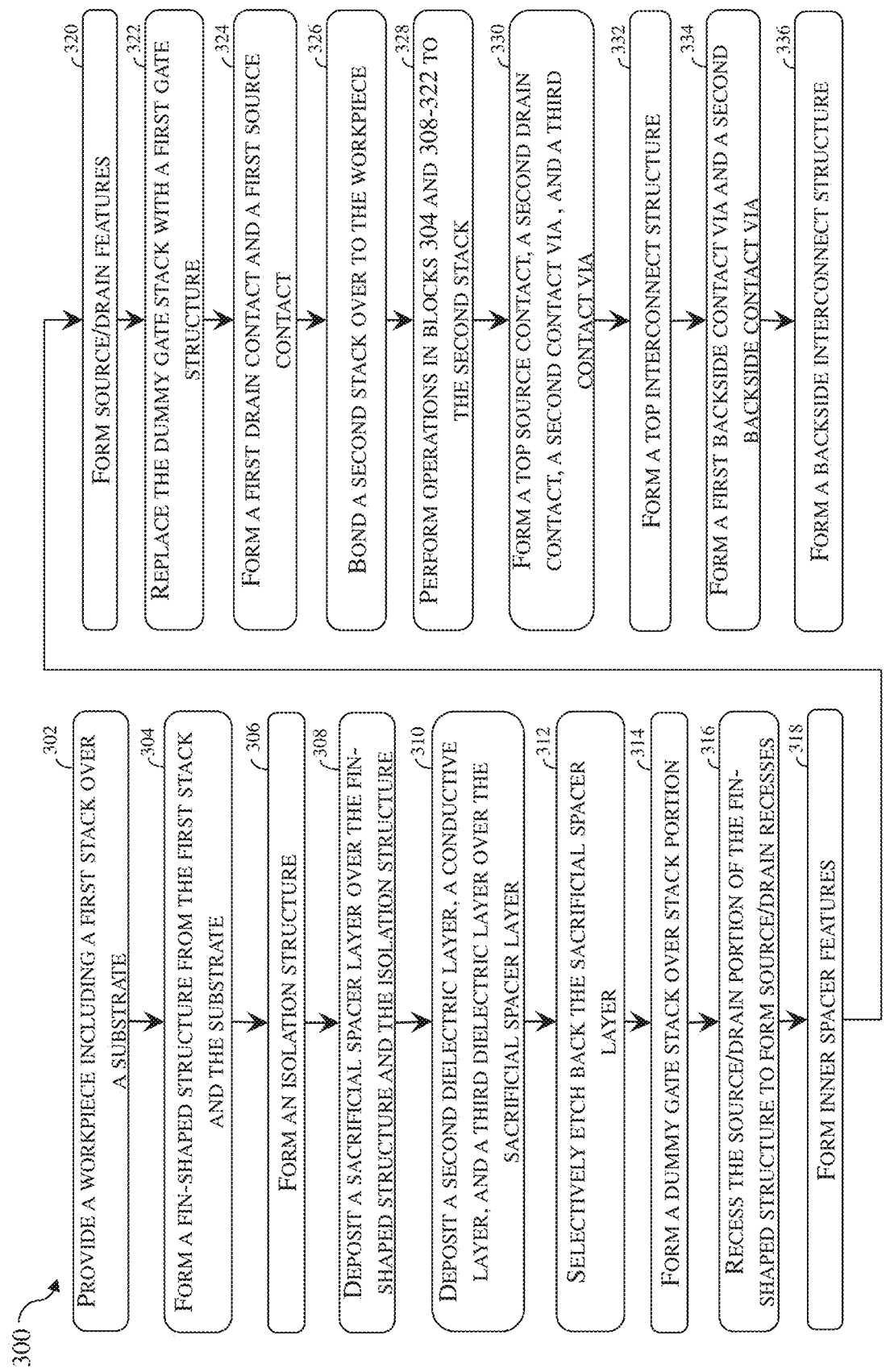
FIG. 18 illustrates a flow chart of a method for forming a semiconductor device having a backside power rail, according to one or more aspects of the present disclosure.
Figure 52:
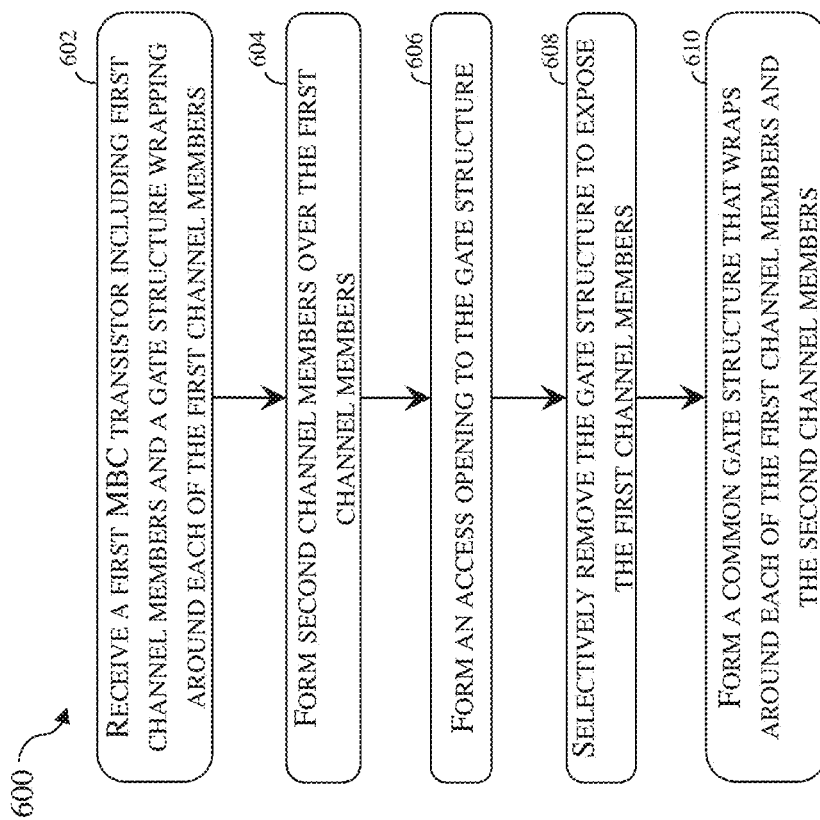
FIG. 52 illustrates a flow chart of a method for forming a common gate structure, according to one or more aspects of the present disclosure.

The various aspects of the present disclosure will now be described in more detail with reference to the figures. In that regard, FIGS. 1, 18 and 36 are flowcharts illustrating methods 100, 300 and 500 of forming a semiconductor device from a workpiece according to embodiments of the present disclosure. Methods 100, 300 and 500 are merely examples and are not intended to limit the present disclosure to what is explicitly illustrated in methods 100, 300 and 500. Additional steps can be provided before, during and after the methods 100, 300 and 500, and some steps described can be replaced, eliminated, or moved around for additional embodiments of the methods. Not all steps are described herein in detail for reasons of simplicity. Methods 100, 300 and 500 are described below in conjunction with FIGS. 2-10, 11A-17A, 11B-17B, 19-28, 29A-35A, 29B-35B, 37-44, 45A-50A, 45B-50B, which are fragmentary cross-sectional views of the workpiece at different stages of fabrication according to embodiments of methods 100, 300 and 500. For better illustration of various aspects of the present disclosure, each of the figures ending with the capital letter A illustrates a fragmentary cross-sectional view of a source region and each of the figures ending with the capital letter B illustrates a fragmentary cross-sectional view of a drain region. Additionally, the present disclosure provides a method 600 for forming a common gate structure that activate two vertically aligned MBC transistors. Method 600, illustrated in FIG. 52, is described below in conjunction with cross-sectional views in FIGS. 53-57. Method 600 may be used with at least methods 100 and 300.

Figure 2:
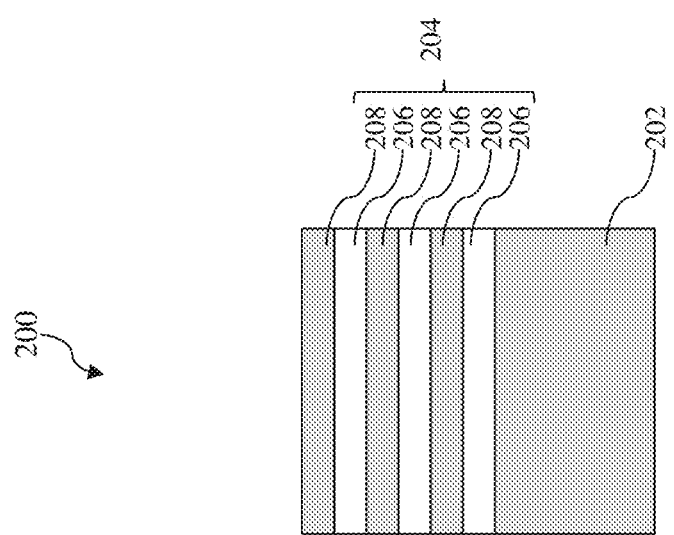

Referring to FIGS. 1 and 2, method 100 includes a block 102 where a workpiece 200 is provided. It is noted that because the workpiece 200 will be fabricated into a semiconductor device, the workpiece 200 may also be referred to as the semiconductor device 200 as the context requires. The workpiece 200 may include a substrate 202. Although not explicitly shown in the figures, the substrate 202 may include an n-type well region and a p-type well region for fabrication of transistors of different conductivity types. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For avoidance of doubts, the X direction, the Y direction and the Z direction are perpendicular to one another.

As shown in FIG. 2, the workpiece 200 also includes a first stack 204 disposed over the substrate 202. The first stack 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 are epitaxy layers and may be deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. As shown in FIG. 2, the sacrificial layers 206 and the channel layers 208 are deposited alternatingly, one-after-another, to form the first stack 204. It is noted that three (3) layers of the sacrificial layers 206 and three (3) layers of the channel layers 208 are alternately and vertically arranged as illustrated in FIG. 2, which is for illustrative purposes only and not intended to be limiting beyond what is specifically recited in the claims. It can be appreciated that any number of sacrificial layers 206 and channel layers 208 can be formed in the first stack 204. The number of layers depends on the desired number of channels members for the device 200. In some embodiments, the number of the channel layers 208 is between 2 and 10.

Figure 3:
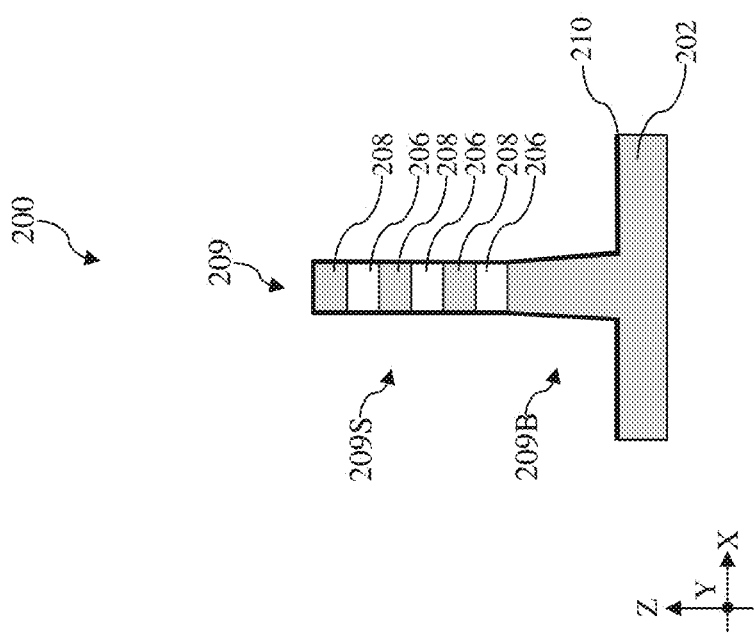

Referring to FIGS. 1 and 3, method 100 includes a block 104 where a first fin-shaped structure 209 is formed from the first stack 204. In some embodiments, the first stack 204 and a portion of the substrate 202 are patterned to form the first fin-shaped structure 209. For patterning purposes, a hard mask layer may be deposited over the first stack 204. The hard mask layer may be a single layer or a multilayer. In one example, the hard mask layer includes a silicon oxide layer and a silicon nitride layer over the silicon oxide layer. As shown in FIG. 3, the first fin-shaped structure 209 extends vertically along the Z direction from the substrate 202 and extends lengthwise along the Y direction. The first fin-shaped structure 209 includes a base portion 209B formed from the substrate 202 and a stack portion 209S formed from the first stack 204. The first fin-shaped structure 209 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the first fin-shaped structure 209 by etching the first stack 204 and the substrate 202. The etching process can include dry etching, wet etching, reactive ion etching (RIE), and/or other suitable processes. In some implementations shown in FIG. 3, after the first fin-shaped structure 209 is formed, a first liner 210 may be deposited conformally over the workpiece 200. The first liner 210 may include silicon nitride and may be deposited using chemical vapor deposition (CVD) or atomic layer deposition (ALD).

Figure 4:
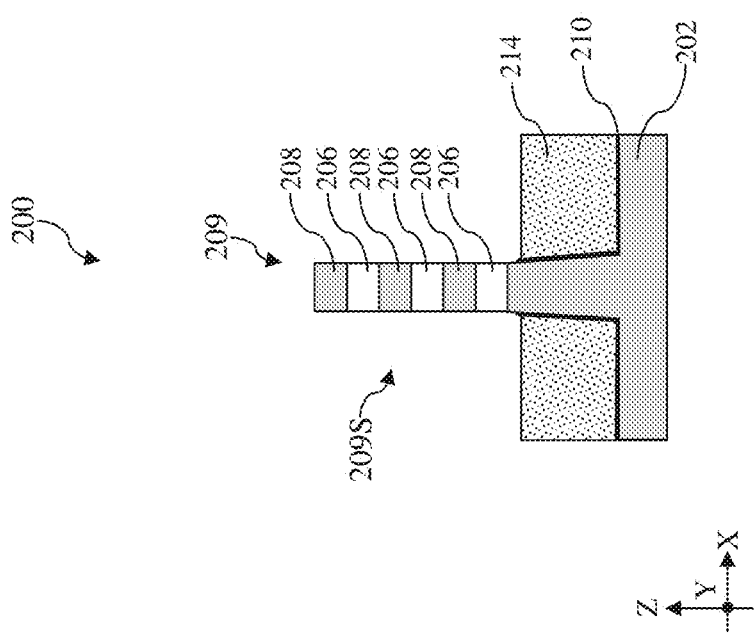

Referring to FIGS. 1 and 4, method 100 includes a block 106 where an isolation feature 214 is formed. The isolation feature 214 may also be referred to as a shallow trench isolation (STI) feature 214. In an example process, a dielectric material for the isolation feature 214 is deposited over the first liner 210 using CVD, subatmospheric CVD (SACVD), flowable CVD, atomic layer deposition (ALD), physical vapor deposition (PVD), spin-on coating, and/or other suitable process. Then the deposited dielectric material is planarized and recessed until the first fin-shaped structure 209 rises above the isolation feature 214. That is, after the recess of the isolation feature 214, the base portion 209B of the first fin-shaped structure 209 is surrounded by the isolation feature 214. The dielectric material for the isolation feature 214 may include silicon oxide, silicon oxynitride, fluorine-doped silicate glass (FSG), a low-k dielectric, combinations thereof, and/or other suitable materials. After the isolation feature 214 is recessed, the first liner 210 is selectively recessed until the stack portion 209S of the first fin-shaped structure 209 is exposed.

Figure 5:
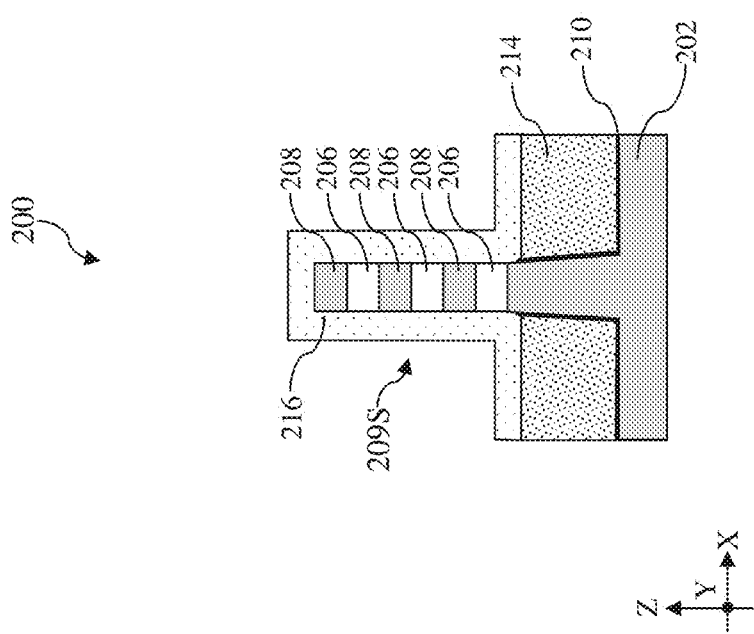

Referring to FIGS. 1 and 5, method 100 includes a block 108 where a sacrificial spacer layer 216 is deposited over the first fin-shaped structure 209 and the isolation feature 214. In some embodiments, the sacrificial spacer layer 216 may include silicon oxide and may be conformally deposited over the workpiece 200. The sacrificial spacer layer 216 is disposed on and along top surfaces of the isolation feature 214 as well as the top surface and sidewalls of the stack portion 209S.

Figure 6:
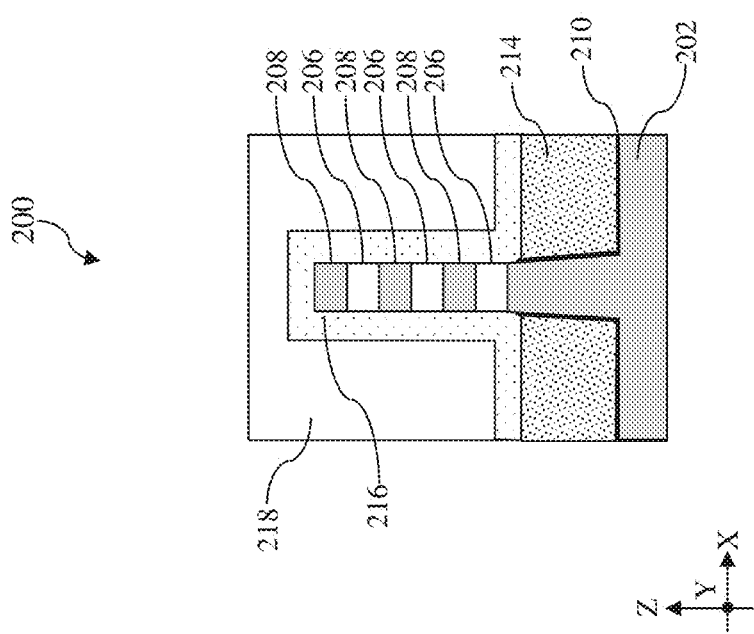

Referring to FIGS. 1 and 6, method 100 includes a block 110 where a first dielectric layer 218 is deposited over the sacrificial spacer layer 216. The first dielectric layer 218 may include silicon nitride, hafnium oxide, aluminum oxide, zirconium oxide, or a dielectric material that allows selective etching of the sacrificial spacer layer 216. The first dielectric layer 218 may be deposited using CVD. Although not explicitly shown in the figures, a planarization process, such as a chemical mechanical polishing (CMP) process, may be performed to the workpiece 200 to expose the top surface of the stack portion 209S. The planarization process also exposes top surfaces of the sacrificial spacer layer 216.

Figure 7:
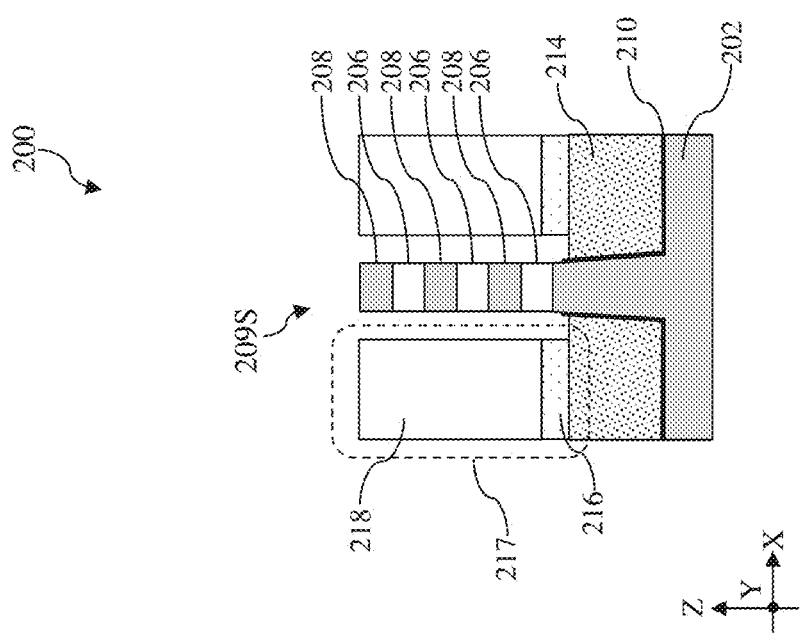

Referring to FIGS. 1 and 7, method 100 includes a block 112 where the sacrificial spacer layer 216 is selectively etched back to release the stack portion 209S of the first fin-shaped structure 209. As shown in FIG. 7, at block 112, vertical portions of the sacrificial spacer layer 216 that extends along sidewalls of the stack portion 209S are selectively removed without substantially damaging the stack portion 209S and the first dielectric layer 218. In an example where the sacrificial spacer layer 216 is formed of silicon oxide and the first dielectric layer 218 is formed of silicon nitride, the sacrificial spacer layer 216 may be selectively etched using diluted hydrofluoric acid (DHF) or buffered hydrofluoric acid (BHF). Here, BHF includes hydrofluoric acid and ammonium fluoride. Upon conclusion of the operations at block 112, hybrid fins 217 are formed on both sides of the stack portion 209S and extend lengthwise parallel to the stack portion 209S. Each of the hybrid fin 217 includes the sacrificial spacer layer 216 and the first dielectric layer 218 over the sacrificial spacer layer 216.

Figure 8:
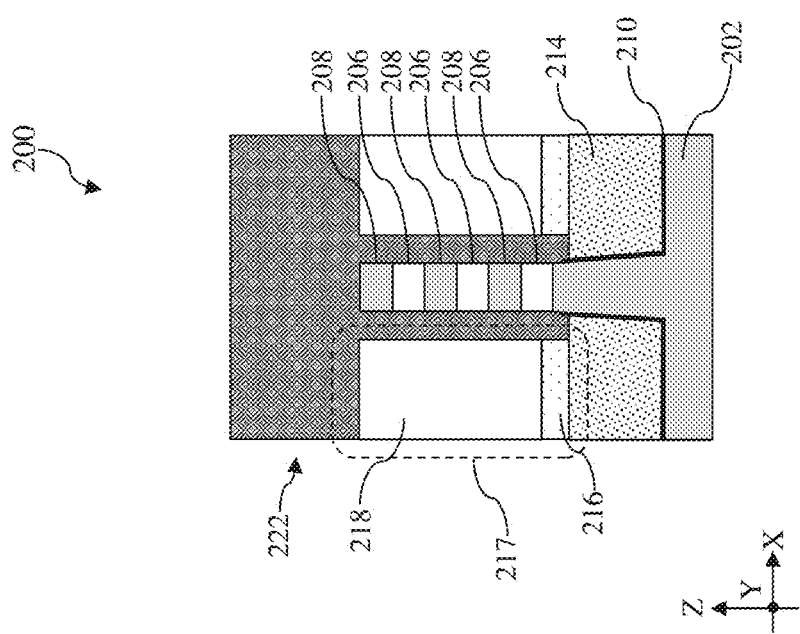

Referring to FIGS. 1 and 8, method 100 includes a block 114 where a dummy gate stack 222 is formed over the stack portion 209S and the hybrid fins 217. In some embodiments, a gate replacement process (or gate-last process) is adopted where the dummy gate stack 222 serves as placeholders for a functional gate structure. Other processes and configuration are possible. To form the dummy gate stack 222, a dummy dielectric layer, a dummy gate electrode layer, and a gate-top hard mask layer are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer may include silicon oxide, the dummy gate electrode layer may include polysilicon, and the gate-top hard mask layer may be a multi-layer that includes silicon oxide and silicon nitride. Using photolithography and etching processes, the gate-top hard mask layer is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask as the etch mask, the dummy dielectric layer and the dummy gate electrode layer are then etched to form the dummy gate stack 222. As shown in FIG. 8, the dummy gate stack 222 is formed over the isolation feature 214, the hybrid fins 217, and a portion of the first fin-shaped structures 209. The dummy gate stack 222 extends lengthwise along the X direction to wrap over the first fin-shaped structure 209. The portion of the first fin-shaped structure 209 underlying the dummy gate stack 222 is a channel region. The channel region and the dummy gate stack 222 also define source/drain regions that are not vertically overlapped by the dummy gate stack 222. The channel region is disposed between two source/drain regions along the Y direction.

Although not explicitly shown, operations at block 114 may include formation of a gate spacer layer over the top surface and sidewalls of the dummy gate stack 222. In some embodiments, the formation of the gate spacer layer includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Figure 9:
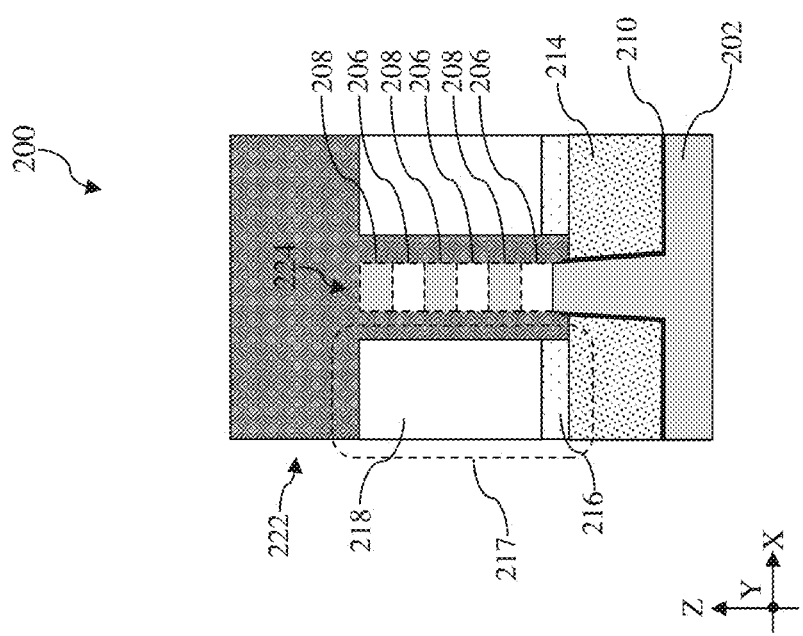

Referring to FIGS. 1 and 9, method 100 includes a block 116 where source/drain portions of the first fin-shaped structure 209 are recessed to form source/drain recesses 224. It is noted that the cross-section in FIG. 9 cuts across a source region or a drain region of the first fin-shaped structure 209 and the channel region of the first fin-shaped structure is out of the cross-sectional plane. For illustration purposes, structures in the channel region is also illustrated with dotted lines in FIG. 9. In an example process, after the deposition of the gate spacer layer, the workpiece 200 is etched in an etch process that selectively recesses the source/drain regions of the first fin-shaped structure 209. The selective recess of the source/drain regions results in source/drain trenches 224 between hybrid fins 217. The etch process at block 116 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As shown in FIG. 9, sidewalls of the sacrificial layers 206 and the channel layers 208 in the channel region are exposed in the source/drain trenches 224.

Figure 10:
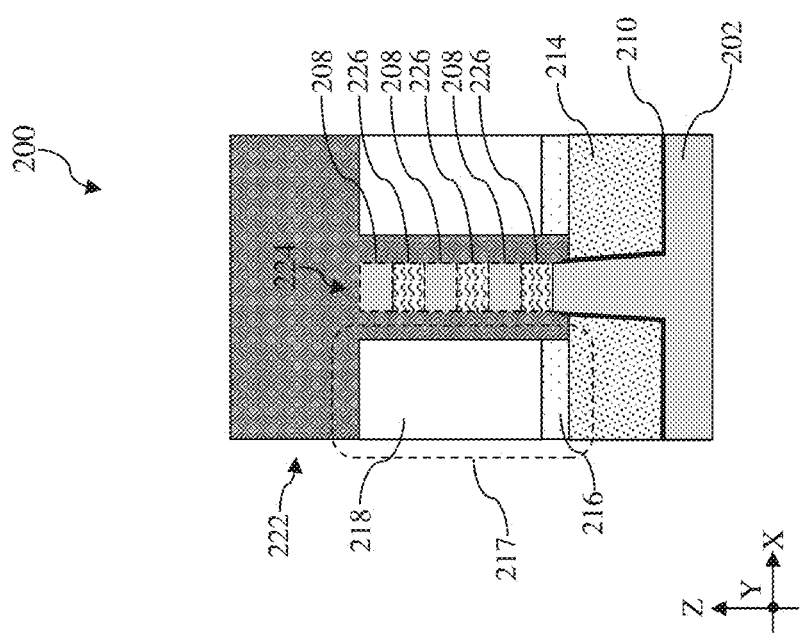

Referring to FIGS. 1 and 10, method 100 includes a block 118 where inner spacer features 226 are formed. At block 118, the sacrificial layers 206 exposed in the source/drain trenches 224 are selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer and sidewalls of the channel layers 208, thereby forming the inner spacer features 226 as shown in FIG. 10. In some embodiments, the etch back process at block 118 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas (e.g., $CF_3I$), other suitable gases and/or plasmas, and/or combinations thereof.

Referring to FIGS. 1, 11A and 11B, method 100 include a block 120 where a first source feature 228S and a first drain feature 228D are formed in the source/drain trenches 224. It is noted that the source region 200S and the drain region 200D are separately illustrated in FIGS. 11A and 11B, respectively. Similarly, the source region 200S is shown in FIGS. 12A-17A and the drain region 200D is illustrated in FIGS. 12B-17B. In some embodiments, the first source feature 228S and the first drain feature 228D may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The first source feature 228S and the first drain feature 228D are therefore coupled to the channel layers 208 or the released channel. Depending on the conductivity type of the to-be-formed MBC transistor, the first source feature 228S and the first drain feature 228D may be n-type source/drain features or p-type source/drain features. Example n-type source/drain features may include Si, GaAs, GaAsP, SiP, or other suitable material and may be in-situ doped during the epitaxial process by introducing an n-type dopant, such as phosphorus (P), arsenic (As), or ex-situ doped using an implantation process (i.e., a junction implant process). Example p-type source/drain features may include Si, Ge, AlGaAs, SiGe, boron-doped SiGe, or other suitable material and may be in-situ doped during the epitaxial process by introducing a p-type dopant, such as boron (B), or ex-situ doped using an implantation process (i.e., a junction implant process).

Figures 12A, 12B:
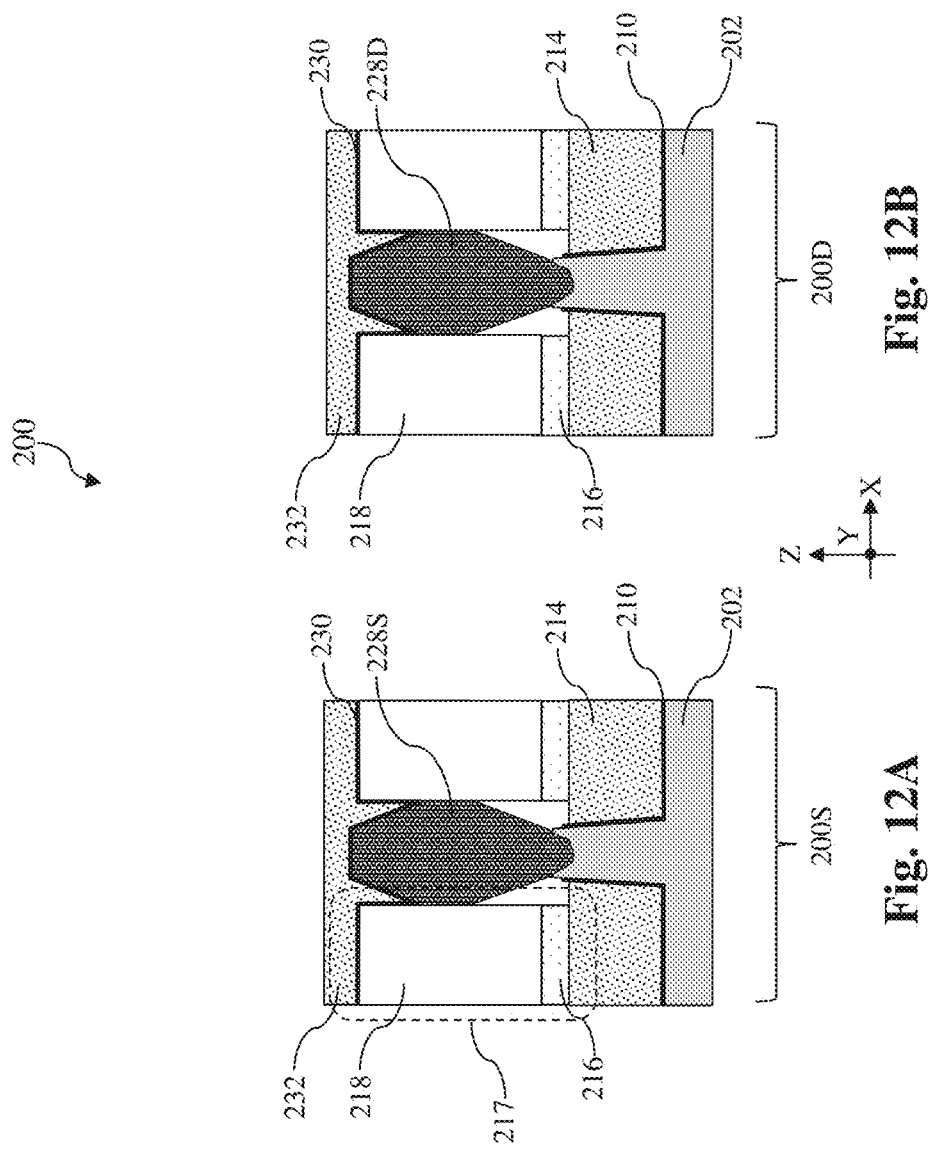

Referring to FIGS. 1, 12A and 12B, method 100 include a block 122 where the dummy gate stack 222 is replaced with a first gate structure (not shown). Operations at block 122 include deposition of a first contact etch stop layer (CESL) 230, deposition of a first interlayer dielectric (ILD) layer 232, removal of the dummy gate stack 222, selective removal of the sacrificial layers 206 to release channel members, formation of the first gate structure, and a planarization of the workpiece 200 to remove excess materials. The first CESL 230 may include silicon nitride, silicon oxynitride, and/or other materials known in the art and may be formed by ALD, plasma-enhanced chemical vapor deposition (PECVD) process and/or other suitable deposition or oxidation processes. As shown in FIGS. 12A and 12B, the first CESL 230 may be deposited on top surfaces of the first source feature 228S, the first drain features, and the hybrid fins 217. The first ILD layer 232 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 232 may be deposited by a PECVD process or other suitable deposition technique. In some embodiments, after formation of the first ILD layer 232, the workpiece 200 may be annealed to improve integrity of the first ILD layer 232. To remove excess materials and to expose top surfaces of the dummy gate stacks 222, a planarization process, such a chemical mechanical polishing (CMP) process may be performed.

With the exposure of the dummy gate stack 222, block 122 proceeds to removal of the dummy gate stack 222. The removal of the dummy gate stack 222 may include one or more etching processes that are selective to the material in the dummy gate stack 222. For example, the removal of the dummy gate stack 222 may be performed using as a selective wet etch, a selective dry etch, or a combination thereof. After the removal of the dummy gate stack 222, sidewalls of the channel layers 208 and sacrificial layers 206 in the channel region, which is disposed between the source region 200S and the drain region 200D, are exposed. Thereafter, the sacrificial layers 206 in the channel region are selectively removed to release the channel layers 208 as the channel members. Here, because the dimensions of the channel members are nanoscale, the channel members may also be referred to as nanostructures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a silicon germanium oxide removal. For example, the oxidation may be provided by ozone clean and then silicon germanium oxide removed by an etchant such as NH$_4$OH.

With the channel members released, the first gate structure (view thereof blocked by the first source feature 228S) is deposited to wrap around each of the channel members in the channel region. The gate structure includes an interfacial layer around and in contact with the channel members, a gate dielectric layer over the interfacial layer, and a gate electrode layer over the gate dielectric layer. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The gate dielectric layer is then deposited over the interfacial layer using ALD, CVD, and/or other suitable methods. The gate dielectric layer may be formed of high-K dielectric materials. As used and described herein, high-k dielectric materials include dielectric materials having a high dielectric constant, for example, greater than that of thermal silicon oxide (~3.9). The gate dielectric layer may include hafnium oxide. Alternatively, the gate dielectric layer may include other high-K dielectrics, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), (Ba,Sr)TiO$_3$ (BST), silicon nitride (SiN), silicon oxynitride (SiON), combinations thereof, or other suitable material.

The gate electrode layer is then deposited over the gate dielectric layer using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different gate electrode layers may be formed separately for n-type transistors and p-type transistors, which may include different metal layers (e.g., for providing different n-type and p-type work function metal layers).

Referring to FIGS. 1, 13A and 13B, method 100 includes a block 124 where a first drain contact 234 is formed. In an example process, lithography processes are used to form a contact opening that exposes the first drain feature 228D. To reduce contact resistance, a silicide layer may be formed on the first drain feature 228D by depositing a metal layer over the first drain feature 228D and performing an anneal process to bring about silicidation between the metal layer and the first drain feature 228D. Suitable metal layer may include titanium (Ti), tantalum (Ta), nickel (Ni), cobalt (Co), or tungsten (W). The silicide layer may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer, a metal fill layer may be deposited into the contact opening. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to provide a planar top surface, setting the stage for subsequent processes.

Referring to FIGS. 1, 14A and 14B, method 100 includes a block 126 where a second stack 240 are bonded over to the workpiece 200. In some embodiments, a capping layer 236 is blanketly deposited over the workpiece 200. In some implementations, the capping layer 236 includes silicon oxide and may also be referred to as a capping oxide layer 236. Like the first stack 204, the second stack 240 also include a plurality of channel layers 208 interleaved by a plurality of sacrificial layers 206. In the embodiments shown in FIGS. 14A and 14B, the first stack 204 and the second stack 240 have the same number of channel layers 208 and sacrificial layers. However, the present disclosure is not so limited that the first stack 204 and the second stack 240 may have different configurations, such as different numbers of layers or different thicknesses of layers. To facilitate bonding, a base layer 238 is formed on a bottom surface of the second stack 240. The second stack and the base layer 238 may be regarded as another substrate, as opposed to the substrate 202. In some implementations, the base layer 238 includes silicon oxide and may also be referred to as a base oxide layer 238. It is noted that, for avoidance of doubts, the second stack 240 separately shown in FIGS. 14A and 14B is one and the same. In some embodiments, the second stack 240 may be directly bonded to the workpiece 200 by utilizing the interface between the capping layer 236 and the base layer 238. In an example direct bonding process, both the capping layer 236 and the base layer 238 are cleaned using RCA SC-1 (ammonia, hydrogen peroxide and water) and/or RCA SC-2 (hydrochloric acid, hydrogen peroxide and water). The cleaned capping layer 236 and base layer 238 are then mated and pressed together. The direct bonding may be strengthened by an anneal process.

Referring to FIGS. 1, 15A and 15B, method 100 includes a block 128 where operations in blocks 104, 108-122 are performed to the second stack 240. Due to the similarity in process steps, operations at block 128 are only summarized for simplicity. At block 104, the second stack 240 is patterned to form a second fin-shaped structure (view thereof blocked by other structures). Because the second fin-shaped structure is insulated by the capping layer 236 and the base layer 238, operations at block 106 may be omitted. At blocks 108, 110 and 112, top hybrid fins 242 are formed on both sides of the second fin-shaped structure and extend parallel to the second fin-shaped structure. At block 114, a counterpart dummy gate stack is formed over the channel region of the second fin-shaped structure to serve as a placeholder for a functional second gate structure. At block 116, the source/drain portion of the second fin-shaped structure are recessed to form source/drain recesses, similar to the source/drain trenches 224. At block 118, the sacrificial layers 206 in the channel region are selectively and partially etched to form inner spacer recesses and inner spacer features are formed in such inner spacer recesses. At block 120, a second source feature 244S and a second drain feature 244D are formed in the source/drain recesses. At block 122, the dummy gate stack over the second fin-shaped structure is replaced by a second gate structure. The sacrificial layers 206 in the channel region are selectively removed to release the channel layers 208 as channel members and the second gate structure wraps around each of the channel members. Before the replacement of the dummy gate stack, a second CESL 246 and a second ILD layer 248 are sequentially deposited over the top hybrid fins 242, the second source feature 244S and the second drain feature 244D.

Figures 16A, 16B:
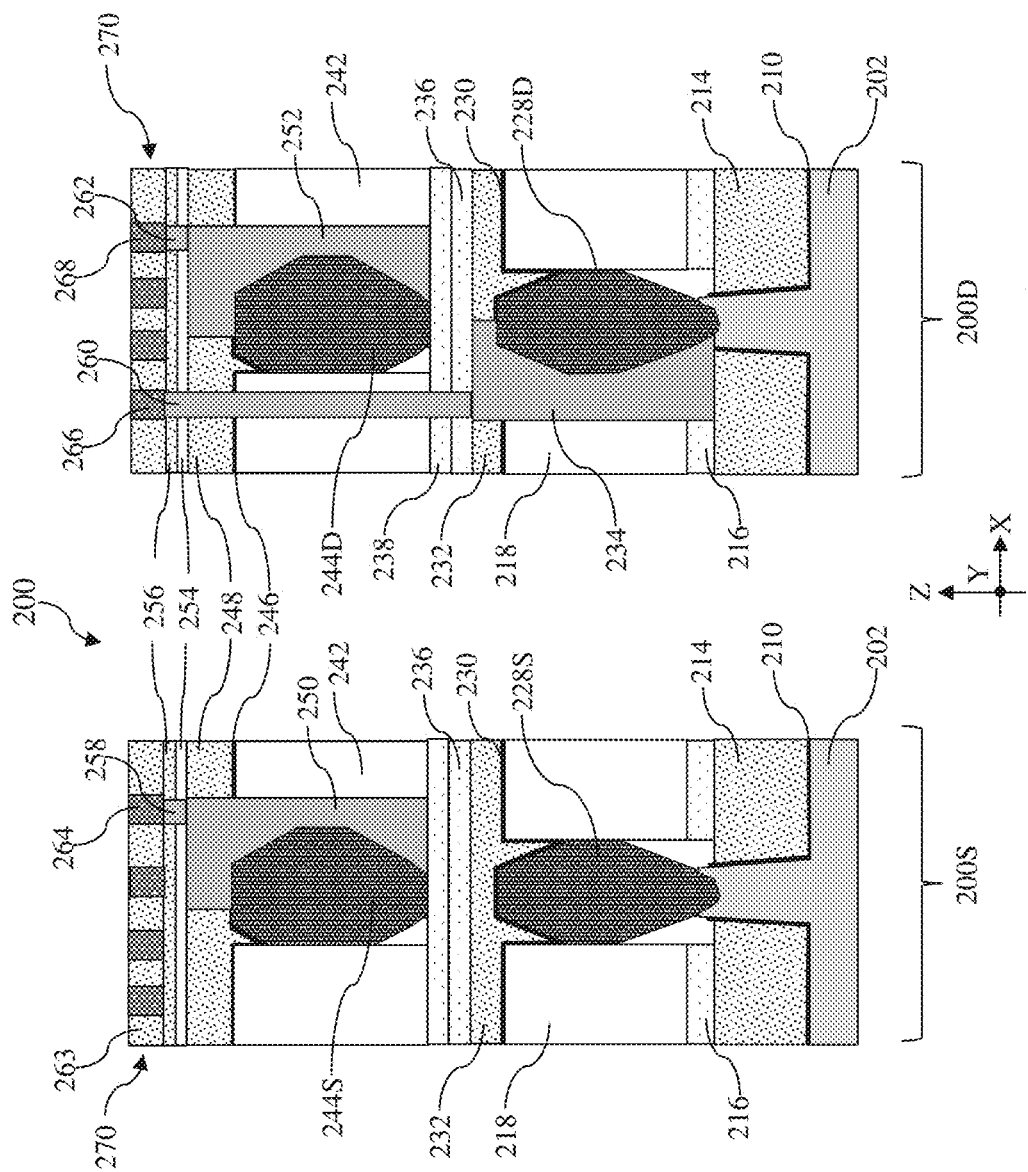

Referring to FIGS. 1, 16A and 16B, method 100 includes a block 130 where a top source contact 250, a second drain contact 252, a first contact via 258, a second contact via 260, and a third contact via 262 are formed. As shown in FIG. 17A, the top source contact 250 is formed over and in contact with the second source feature 244S. Similar to the first drain contact 234, a contact opening is first made to expose the second source feature 244S, a silicide layer is formed on the second source feature 244S, and a metal fill layer is deposited to fill the rest of the contact opening. In a similar fashion, a second drain contact 252 is formed over and in contact with the second drain feature 244D. After the formation of the top source contact 250 and the second drain contact 252, an etch stop layer (ESL) 254 and a third ILD layer 256 are deposited over the top source contact 250 and the second drain contact 252 to passivate the same.

Formation of the first contact via 258, the second contact via 260, and the third contact via 262 may include formation of a via opening through at least the ESL 254 and the third ILD layer 256 and deposition of a metal fill layer. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). In some embodiments, each of the first contact via 258, the second contact via 260, and the third contact via 262 may include a liner between the metal fill layer and neighboring dielectric material to improve electrical integrity. Such liner may include titanium (Ti), tantalum (Ta), titanium nitride (TiN), cobalt nitride (CoN), nickel nitride (NiN), or tantalum nitride (TaN). Because formation of the second contact via 260 requires forming a via opening that extends through not only the ESL 254 and the third ILD layer 256 but also the second ILD layer 248, the CESL 246, the top hybrid fin 242, the base layer 238, and the capping layer 236, the via opening for the second contact via 260 is not simultaneously formed with via openings for the first contact via 258 and the third contact via 262. In some other embodiments, the via opening for the second contact via 260 is separately formed and is etched in several etch stages.

Referring to FIGS. 1, 16A and 16B, method 100 includes a block 132 where a top interconnect structure 270 is formed. The top interconnect structure 270 includes a first passivation layer 263 and conductive features in the first passivation layer 263. In the depicted embodiments, the conductive features include a top power rail 264, a first conductive line 266 and a second conductive line 268. The top power rail 264 is in direct contact with the first contact via 258. Put differently, the first contact via 258 electrically couples the top power rail 264 and the second source feature 244S. Here, the top power rail 264 (or other power rail) is referred to as such because it supplies a positive supply voltage. In an example process, the first passivation layer 263 is deposited over the workpiece 200, the first passivation layer 263 is then patterned, and a conductive material is deposited over the patterned first passivation layer 263. Although the top interconnect structure 270 in FIGS. 16A and 16B includes only one interconnect layer, the top interconnect structure 270 may include more interconnect layers and may include all interconnect layers over the workpiece 200. As shown in FIG. 16B, the second contact via 260 is in direct contact with the first conductive line 266 and the third contact via 262 is in direct contact with the second conductive line 268.

Referring to FIGS. 1, 17A and 17B, method 100 includes a block 134 where a backside source contact 274 is formed. Although not so illustrated in FIGS. 17A and 17B, operations at block 134 may be performed while the workpiece 200 is bonded to a carrier substrate and flipped upside-down. In an example process, the substrate 202 is ground or planarized by a grinding process and/or a chemical mechanical polishing (CMP) process until the isolation feature 214 is exposed. With a first patterned hard mask covering the source region 200S, the base portion 209B in the drain region 200D is selectively removed to expose the first drain feature 228D. A first nitride liner 276 and a dielectric filler 282 may be deposited over the first drain feature 228D to insulate the same. In some instances, the first nitride liner 276 may include silicon nitride, silicon oxynitride, or silicon carbonitride and the dielectric filler 282 may include silicon oxide. The first patterned mask is then removed and a second patterned mask is formed to cover the drain region 200D. A backside contact opening is formed to expose the first source feature 228S. A second nitride liner 277 is deposited over the backside contact opening and is etched back to expose the first source feature 228S. A backside silicide layer 272 and a backside source contact 274 are formed in the backside contact opening, as illustrated in FIG. 17A. The backside silicide layer 272 may include titanium silicide (TiSi), titanium silicon nitride (TiSiN), tantalum silicide (TaSi), tungsten silicide (WSi), cobalt silicide (CoSi), or nickel silicide (NiSi). The backside source contact 274 may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN).

Referring to FIGS. 1, 17A and 17B, method 100 includes a block 136 where a backside interconnect structure 290 is formed. In the depicted embodiment, the backside interconnect structure 290 includes a first backside power rail 279 in a second passivation layer 278. The first backside power rail 279 is in direct contact with the backside source contact 274. As a result, the first backside power rail 279 is coupled to the first source feature 228S while it is insulated from the first drain feature 228D by the first nitride liner 276 and the dielectric filler 282. Here, like the top power rail 264, the first backside power rail 279 is referred to as such because it supplies a positive supply voltage. In an example process, the second passivation layer 278 is deposited over the exposed isolation feature 214, the second passivation layer 278 is then patterned, and a conductive material is deposited over the patterned second passivation layer 278.

Reference is now made to FIGS. 17A and 17B. Upon conclusion of the operations in method 100, a first MBC transistor 10 and a second MBC transistor 20 over the first MBC transistor 10 are formed. The first MBC transistor 10 includes channel members sandwiched between the first source feature 228S and the first drain feature 228D. A first gate structure (its view blocked by the first source feature 228S) of the first MBC transistor 10 wraps around each of its channel members. The second MBC transistor 20 includes channel members sandwiched between the second source feature 244S and the second drain feature 244D. A second gate structure (its view blocked by the second source feature 244S and the second drain feature 244D) of the second MBC transistor 20 wraps around each of its channel members. The first source feature 228S is coupled to the first backside power rail 279 by way of the backside source contact 274. The first backside power rail 279 is disposed in the backside interconnect structure 290. The second source feature 244S is coupled to the top power rail 264 by way of the top source contact 250 and the first contact via 258. The top power rail 264 is disposed in the top interconnect structure 270. Both the first drain feature 228D and the second drain feature 244D are electrically coupled to conductive features in the top interconnect structure 270 but are insulated from the backside interconnect structure 290. The first drain feature 228D is coupled to the first conductive line 266 by way of the first drain contact 234 and the second contact via 260. The second contact via 260 extends through the top hybrid fin 242 along the Z direction. The second drain feature 244D is coupled to the second conductive line 268 by way of the third contact via 262.

Attention is now turned to method 300. FIG. 18 illustrates a flow chart of method 300, according to various aspects of the present disclosure. Throughout the present disclosure, similar reference numerals denote similar features in terms of composition and formation. Some details of operations in method 300 may be simplified or omitted if similar details have been described in conjunction with method 100.

Figure 19:
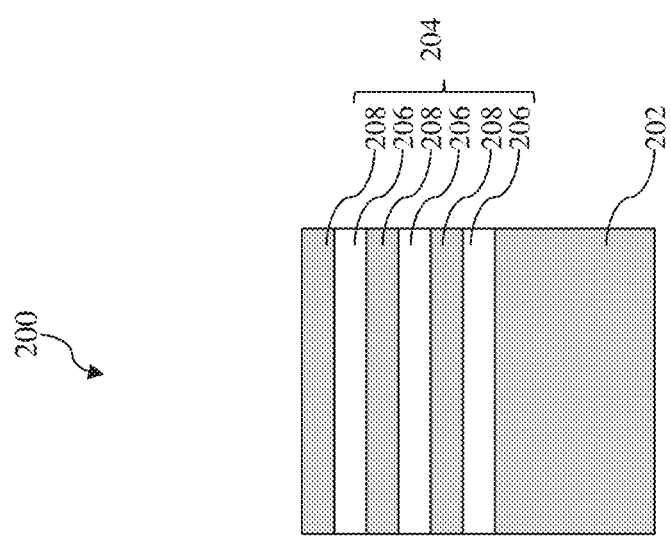

Referring to FIGS. 18 and 19, method 300 includes a block 302 where a workpiece 200 is provided. The workpiece 200 includes a substrate 202 and a first stack 204 over the substrate 202. Because the substrate 202 and the first stack 204 have been described above, detailed descriptions thereof are omitted here.

Figure 20:
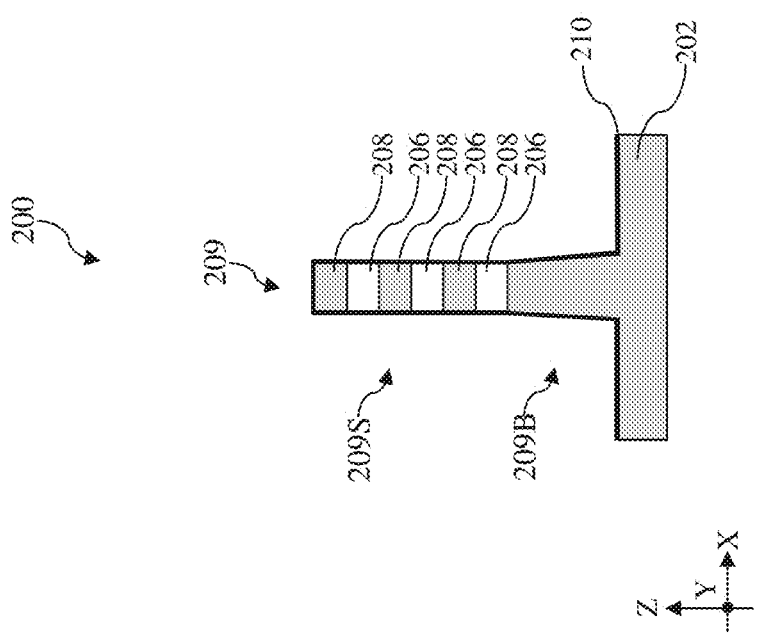

Referring to FIGS. 18 and 20, method 300 includes a block 304 where a first fin-shaped structure 209 is formed from the first stack 204. Because operations at block 304 are similar to those at block 104, detailed descriptions thereof are omitted for brevity.

Figure 21:
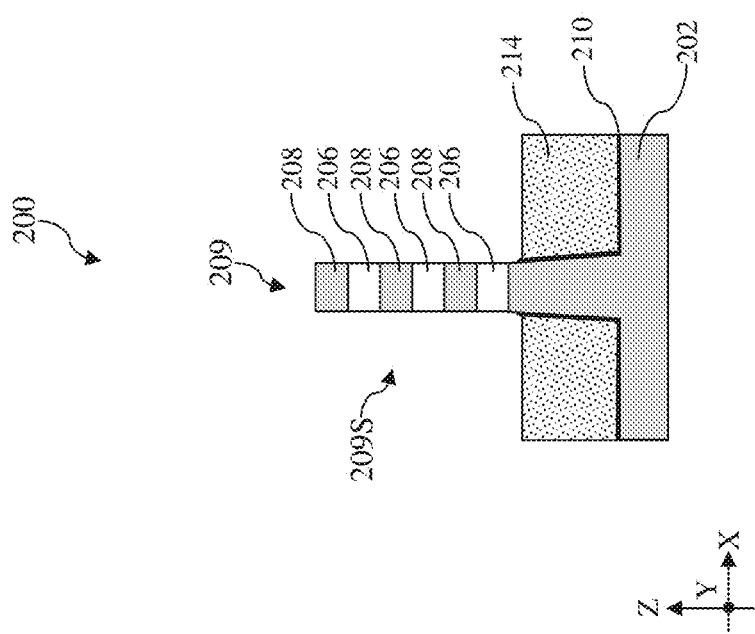

Referring to FIGS. 18 and 21, method 300 includes a block 306 where an isolation feature 214 is formed. Because operations at block 306 are similar to those at block 106, detailed descriptions thereof are omitted for brevity.

Figure 22:
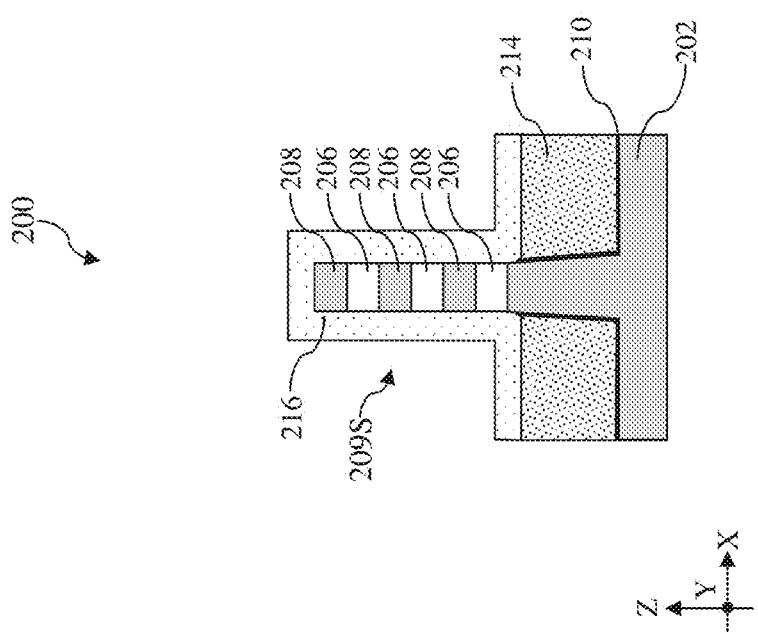

Referring to FIGS. 18 and 22, method 300 includes a block 308 where a sacrificial spacer layer 216 is deposited over the first fin-shaped structure 209 and the isolation feature 214. Because operations at block 308 are similar to those at block 108, detailed descriptions thereof are omitted for brevity.

Figure 23:
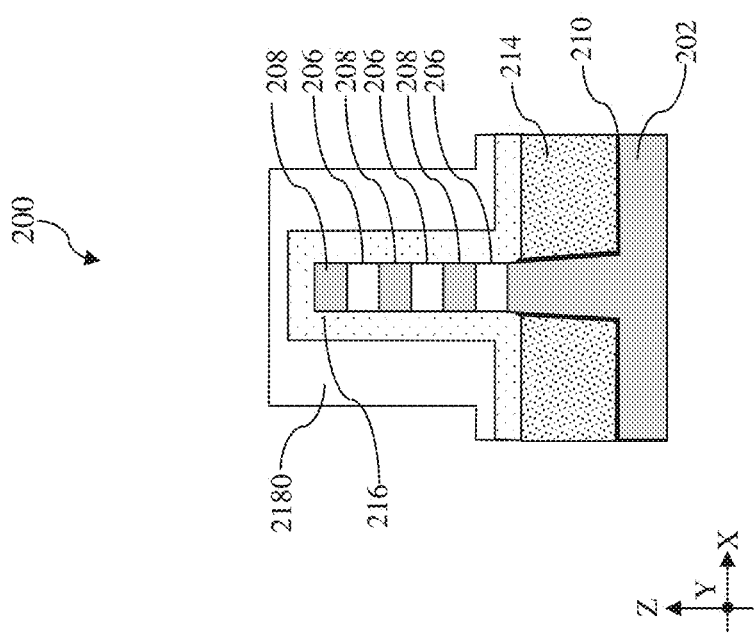
Figure 24:
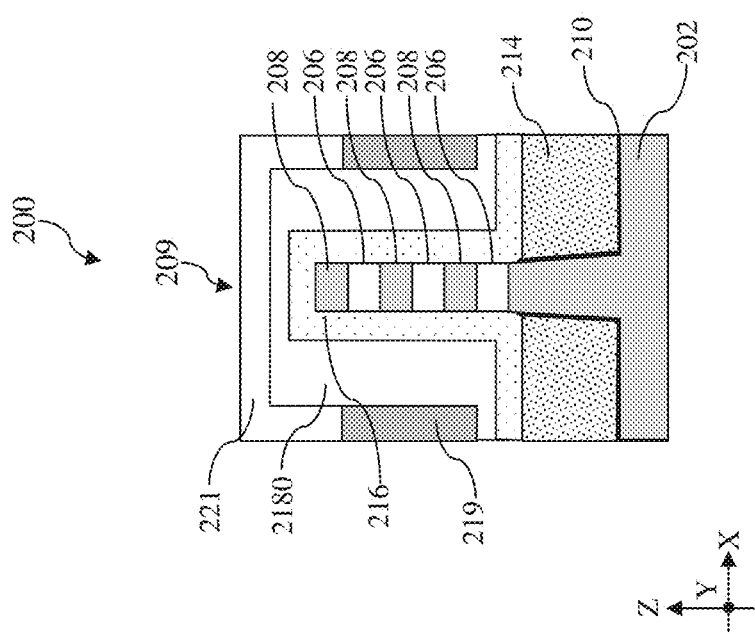

Referring to FIGS. 18, 23 and 24, method 300 includes a block 310 where a second dielectric layer 2180, a conductive layer 219, and a third dielectric layer 221 are deposited over the sacrificial spacer layer 216. The second dielectric layer 2180 may be conformally deposited over the workpiece 200, including over the sacrificial spacer layer 216. As shown in FIG. 23, different from the first dielectric layer 218, the second dielectric layer 2180 does not completely fill the trenches defined by sidewalls of the sacrificial spacer layer 216. After the conformal deposition of the second dielectric layer 2180, a conductive layer 219 is deposited over the second dielectric layer 2180 to completely fill the trenches defined by sidewalls of the sacrificial spacer layer 216. The conductive layer 219 may include a conductive material, such as titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). The conductive layer 219 is then recessed until the top surface of the conductive layer 219 is below that of the second dielectric layer 2180. As a result, isolated conductive features 219 are formed on both sides of the first fin-shaped structure 209, as illustrated in FIG. 24. The third dielectric layer 221 is then deposited on the conductive features 219 and the second dielectric layer 2180. As a result, the conductive features 219 are buried or embedded in the second dielectric layer 2180 and the third dielectric layer 221. The second dielectric layer 2180 and the third dielectric layer 221 may include silicon nitride, hafnium oxide, aluminum oxide, zirconium oxide, or a dielectric material that allows selective etching of the sacrificial spacer layer 216. The second dielectric layer 2180 and the third dielectric layer 221 may be deposited using CVD or ALD. Although not explicitly shown in the figures, a planarization process, such as a chemical mechanical polishing (CMP) process, may be performed to the workpiece 200 to expose the top surface of the first fin-shaped structure 209. The planarization process also exposes top surfaces of the sacrificial spacer layer 216.

Figure 25:
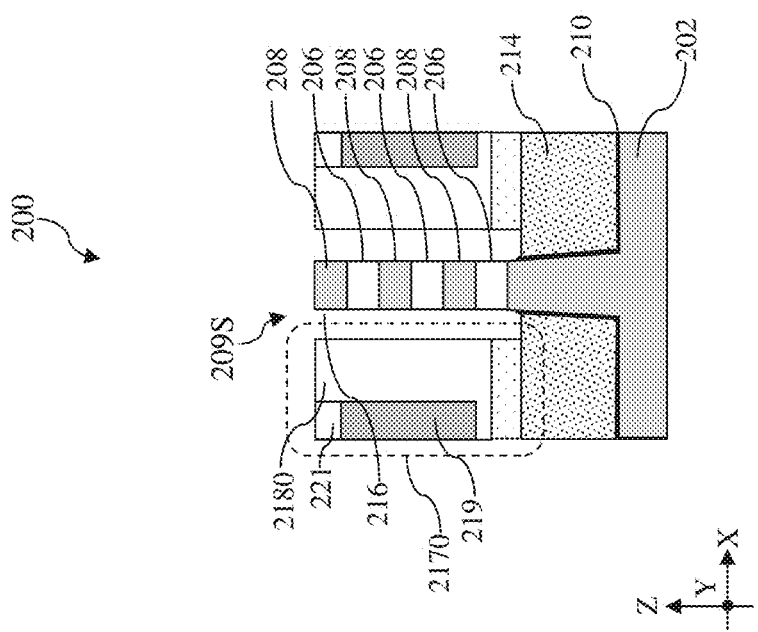

Referring to FIGS. 18 and 25, method 300 includes a block 312 where the sacrificial spacer layer 216 is selectively etched back to release the stack portion 209S of the first fin-shaped structure 209. Because operations at block 312 are similar to those at block 112, detailed descriptions thereof are omitted for brevity. With respect to method 300, modular hybrid fins 2170 are formed as a result of the operations at block 312. The modular hybrid fins 2170 extend parallel to the first fin-shaped structure 209. Each of the modular hybrid fins 2170 includes a conductive feature 219 embedded therein. As will be described further below, the modular hybrid fins 2170 may serve as a contact module to provide routing pathways when needed. When modular hybrid fins are implemented, contact vias may have smaller aspect ratios as they can originate and end at embedded conductive features in modular hybrid fins.

Figure 26:
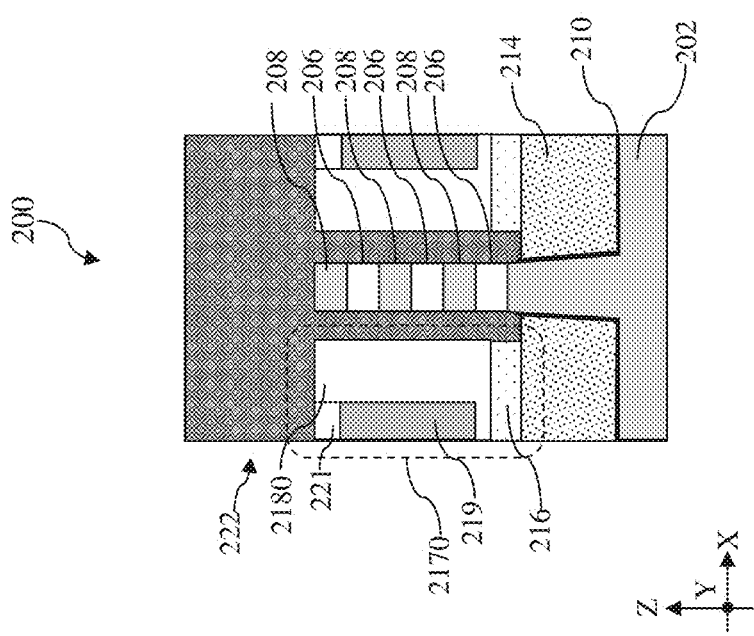

Referring to FIGS. 18 and 26, method 300 includes a block 314 where a dummy gate stack 222 is formed over the stack portion 209S and the modular hybrid fins 2170. Because operations at block 314 are similar to those at block 114, detailed descriptions thereof are omitted for brevity.

Figure 27:
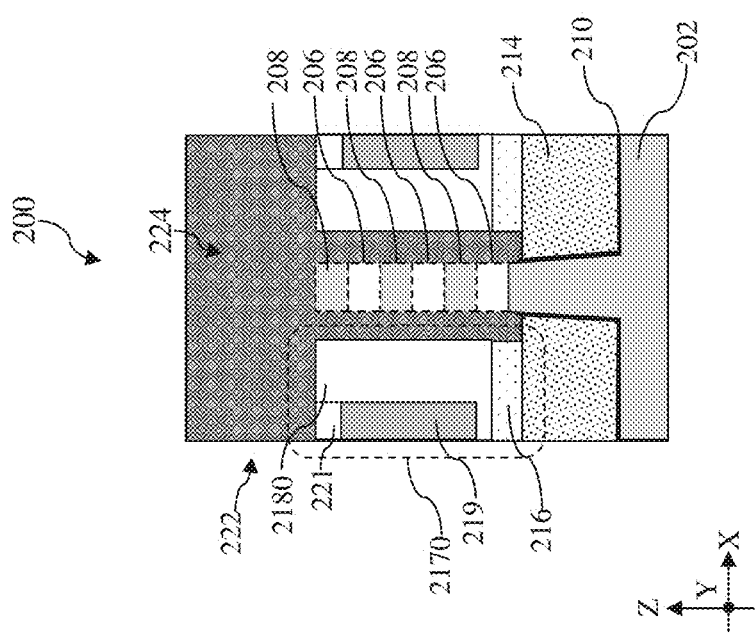

Referring to FIGS. 18 and 27, method 300 includes a block 316 where source/drain portions of the first fin-shaped structure 209 are recessed to form source/drain recesses 224. Because operations at block 316 are similar to those at block 116, detailed descriptions thereof are omitted for brevity.

Figure 28:
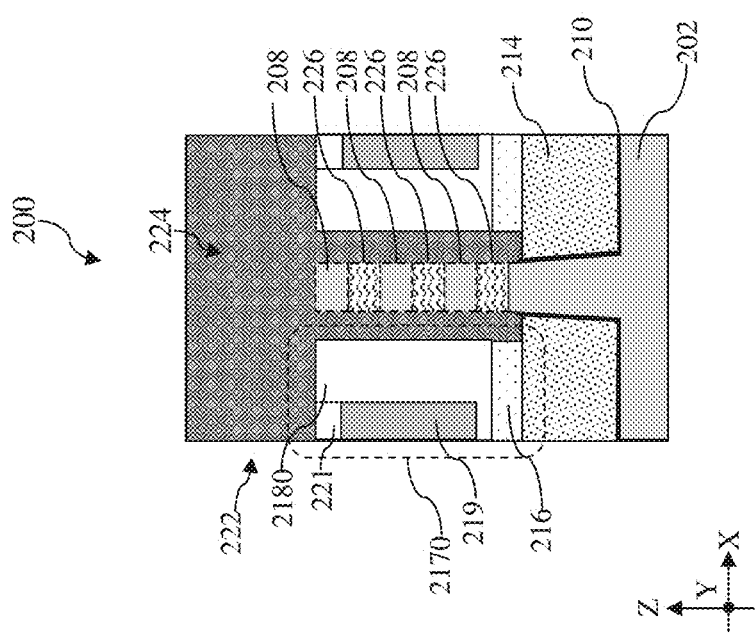

Referring to FIGS. 18 and 28, method 300 includes a block 318 where inner spacer features 226 are formed. Because operations at block 318 are similar to those at block 118, detailed descriptions thereof are omitted for brevity.

Referring to FIGS. 18, 29A and 29B, method 300 include a block 320 where a first source feature 228S and a first drain feature 228D are formed in the source/drain trenches 224. It is noted that the source region 200S and the drain region 200D are separately illustrated in FIGS. 29A and 29B, respectively. Similarly, the source region 200S is shown in FIGS. 30A-35A and the drain region 200D is illustrated in FIGS. 30B-35B. Because operations at block 320 are similar to those at block 120, detailed descriptions thereof are omitted for brevity.

Referring to FIGS. 18, 29A and 29B, method 300 include a block 322 where the dummy gate stack 222 is replaced with a first gate structure (its view blocked by the first source feature 228S). Because operations at block 322 are similar to those at block 122, detailed descriptions thereof are omitted for brevity.

Referring to FIGS. 18, 30A and 30B, method 300 includes a block 324 where a first source contact 235 and a first drain contact 234 are formed. In an example process, lithography processes are used to form contact openings that exposes the first source feature 228S and the first drain feature 228D. To reduce contact resistance, a silicide layer may be formed on the first source feature 228S and the first drain feature 228D by depositing a metal layer over the first source feature 228S and the first drain feature 228D and performing an anneal process to bring about silicidation between the metal layer and the first source feature 228S as well as between the metal layer and the first drain feature 228D. Suitable metal layer may include titanium (Ti), tantalum (Ta), nickel (Ni), cobalt (Co), or tungsten (W). The silicide layer may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer, a metal fill layer may be deposited into the contact opening. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to provide a planar top surface, setting the stage for subsequent processes. It is noted that the position and X-direction dimension of the first source contact 235 are selected such that its sidewall is in contact with or merges with the adjacent conductive feature 219. In contrast, the position and X-direction dimension of the first drain contact 234 are selected such that its sidewall, or any part of it, is spaced apart from the adjacent conductive feature 219.

Referring to FIGS. 18, 31A and 31B, method 300 includes a block 326 where a second stack 240 are bonded over to the workpiece 200. Because operations at block 326 are similar to those at block 126, detailed descriptions thereof are omitted for brevity.

Referring to FIGS. 18, 32A, 32B, 33A, and 33B, method 300 includes a block 328 where operations in blocks 304, 308-322 are performed to the second stack 240. Due to the similarity in process steps, operations at block 328 are only summarized for simplicity. Referring to FIGS. 32A and 32B, at block 304, the second stack 240 is patterned to form a second fin-shaped structure 2090. As shown in FIGS. 32A and 32B, the second fin-shaped structure 2090 is vertically aligned with the first fin-shaped structure 209. This is evidence by the vertical alignment between the second fin-shaped structure 2090 and the base portion 209B. Because the second fin-shaped structure 2090 is insulated by the capping layer 236 and the base layer 238, operations at block 306 may be omitted. Still referring to FIGS. 32A and 32B, at blocks 308, 310 and 312, top modular hybrid fins 2172 are formed on both sides of the second fin-shaped structure 2090 and extend lengthwise parallel to the second fin-shaped structure 2090. Each of the top modular hybrid fins 2172 includes top conductive features 239 embedded in fourth dielectric layer 241 and the fifth dielectric layer 243. The top conductive features 239 and conductive features 219 may have the same composition. The fourth dielectric layer 241 and the fifth dielectric layer 243 have the same composition as the second dielectric layer 2180. As shown in FIG. 32A, a bridging contact via 237 is formed to electrically couple a conductive feature 219 in a modular hybrid fin 2170 and a top conductive feature 239 in a top modular hybrid fin 2172. To form the bridging contact via 237, after the deposition of the fourth dielectric layer 241, a via hole is formed directly over the to-be-connected conductive feature 219. The bridging contact via 237 and the top conductive feature 239 connected thereto are formed simultaneously when the top conductive feature 239 is deposited.

Referring to FIGS. 33A and 33B, at block 314, a counterpart dummy gate stack is formed over the channel region of the second fin-shaped structure to serve as a placeholder for a functional second gate structure. At block 316, the source/drain portion of the second fin-shaped structure are recessed to form source/drain recesses, similar to the source/drain trenches 224. At block 318, the sacrificial layers 206 in the channel region are selectively and partially etched to form inner spacer recesses and inner spacer features are formed in such inner spacer recesses. At block 320, a second source feature 244S and a second drain feature 244D are formed in the source/drain recesses. At block 322, the dummy gate stack over the second fin-shaped structure is replaced by a second gate structure (not shown). The sacrificial layers 206 in the channel region are selectively removed to release the channel layers 208 as channel members and the second gate structure wraps around each of the channel members. Before the replacement of the dummy gate stack, a second CESL 246 and a second ILD layer 248 are sequentially deposited over the top modular hybrid fins 2172, the second source feature 244S and the second drain feature 244D.

Referring to FIGS. 18, 34A and 34B, method 300 includes a block 330 where a top source contact 250, a second drain contact 252, a second contact via 260, and a third contact via 262 are formed. As shown in FIG. 34A, the top source contact 250 is formed over and in contact with the second source feature 244S. A contact opening is first made to expose the second source feature 244S, a silicide layer is formed on the second source feature 244S, and a metal fill layer is deposited to fill the rest of the contact opening. In a similar fashion, a second drain contact 252 is formed over and in contact with the second drain feature 244D. After the formation of the top source contact 250 and the second drain contact 252, an etch stop layer (ESL) 254 and a third ILD layer 256 are deposited over the top source contact 250 and the second drain contact 252 to passivate the same. It is noted that the position and X-direction dimension of the top source contact 250 are selected such that its sidewall is in contact with or merges the top conductive feature 239 that is coupled to the bridging contact via 237. In contrast, the position and X-direction dimension of the second drain contact 252 are selected such that its sidewall, or any part of it, is spaced apart from the adjacent top conductive feature 239.

Formation of the second contact via 260 and the third contact via 262 may include formation of a via opening through at least the ESL 254 and the third ILD layer 256 and deposition of a metal fill layer. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). In some embodiments, each of the second contact via 260 and the third contact via 262 may include a liner between the metal fill layer and neighboring dielectric material to improve electrical integrity. Such liner may include titanium (Ti), tantalum (Ta), titanium nitride (TiN), cobalt nitride (CoN), nickel nitride (NiN), or tantalum nitride (TaN). Because formation of the second contact via 260 requires forming a via opening that extends through not only the ESL 254 and the third ILD layer 256 but also the second ILD layer 248, the second CESL 246, the fourth dielectric layer 241 (of the top modular hybrid fin 2172), the base layer 238, and the capping layer 236, the via opening for the second contact via 260 is not simultaneously formed with the via opening for the third contact via 262. In some other embodiments, the via opening for the second contact via 260 is separately formed and is etched in several etch stages. The second contact via 260 is spaced apart and isolated from the second drain feature 244D and the adjacent top conductive feature 239. It is noted, in method 300, no contact via is formed over the top source contact 250.

Figures 35A, 35B:
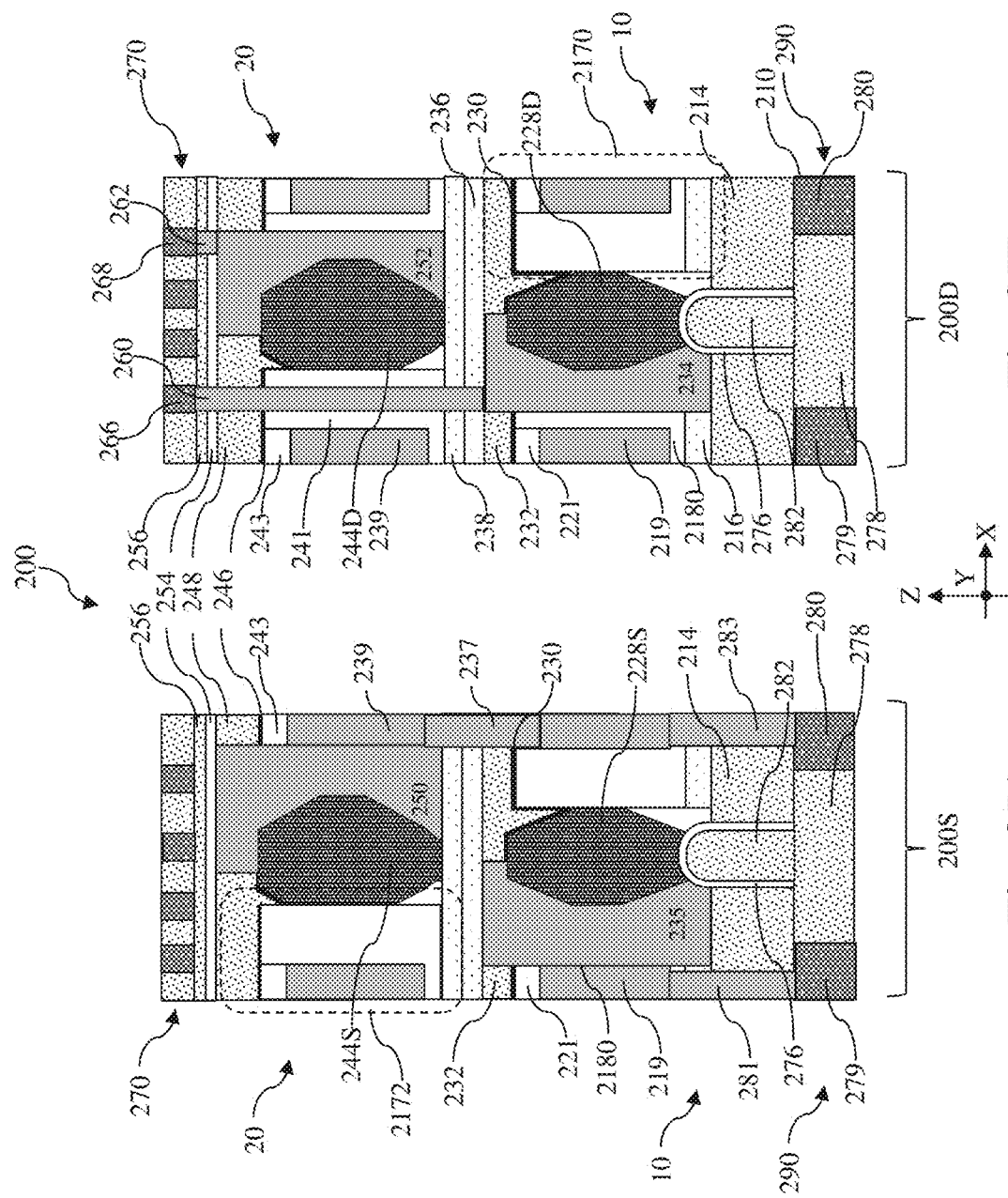

Referring to FIGS. 18, 34A and 34B, method 300 includes a block 332 where a top interconnect structure 270 is formed. The top interconnect structure 270 includes a first passivation layer 263 and conductive features in the first passivation layer 263. In the embodiments depicted in FIGS. 34A and 34B, the conductive features include a first conductive line 266 and a second conductive line 268. In an example process, the first passivation layer 263 is deposited over the workpiece 200, the first passivation layer 263 is then patterned, and a conductive material is deposited over the patterned first passivation layer 263. Although the top interconnect structure 270 in FIGS. 35A and 35B includes only one interconnect layer, the top interconnect structure 270 may include more interconnect layers and may include all interconnect layers over the workpiece 200. As shown in FIG. 35B, the second contact via 260 is in direct contact with the first conductive line 266 and the third contact via 262 is in direct contact with the second conductive line 268.

Referring to FIGS. 18, 35A and 35B, method 300 includes a block 334 where a first backside contact via 281 and a second backside contact via 283 are formed. Although not so illustrated in FIGS. 35A and 35B, operations at block 334 may be performed while the workpiece 200 is bonded to a carrier substrate and flipped upside-down. In an example process, the substrate 202 is ground or planarized by a grinding process and/or a chemical mechanical polishing (CMP) process until the isolation feature 214 is exposed. The base portion 209B in the isolation feature 214 is removed and replaced with a first nitride liner 276 and a dielectric filler 282, where the first nitride liner 276 and the dielectric filler 282 serve as a dielectric plug for isolation purposes. In some instances, the first nitride liner 276 may include silicon nitride, silicon oxynitride, or silicon carbonitride and the dielectric filler 282 may include silicon oxide. Backside contact openings are formed through the isolation feature 214, thereby exposing the conductive features 219 in the modular hybrid fins 2170. A metal fill layer is then deposited in the backside contact openings to form the first backside contact via 281 and the second backside contact via 283. Example metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). By way of the conductive feature 219 in contact with the first source contact 235, the first backside contact via 281 is electrically coupled to the first source contact 235. By way of the other conductive feature 219, the bridging contact via 237, and the top conductive feature 239 in contact with the top source contact 250, the second backside contact via 283 is electrically coupled to the top source contact 250.

Referring to FIGS. 18, 35A and 35B, method 300 includes a block 336 where a backside interconnect structure 290 is formed. In the depicted embodiment, the backside interconnect structure 290 includes a second passivation layer 278 and a first backside power rail 279 and a second backside power rail 280. The first backside power rail 279 is in direct contact with the first backside contact via 281 and the second backside power rail 280 is in direct contact with the second backside contact via 283. As a result, the first backside power rail 279 is coupled to the first source feature 228S and the second backside power rail 280 is coupled to the second source feature 244S. Here, like the top power rail 264, the first backside power rail 279 and the second backside power rail 280 are referred to as such because they supply a positive supply voltage. In an example process, the second passivation layer 278 is deposited over the exposed isolation feature 214, the second passivation layer 278 is then patterned, and a conductive material is deposited over the patterned second passivation layer 278.

Reference is now made to FIGS. 35A and 35B. Upon conclusion of the operations in method 300, a first MBC transistor 10 and a second MBC transistor 20 over the first MBC transistor 10 are formed. The first MBC transistor 10 includes channel members sandwiched between the first source feature 228S and the first drain feature 228D. A first gate structure (its view blocked by the first source feature 228S) of the first MBC transistor 10 wraps around each of its channel members. The second MBC transistor 20 includes channel members sandwiched between the second source feature 244S and the second drain feature 244D. A second gate structure (its view blocked by the second source feature 244S) of the second MBC transistor 20 wraps around each of its channel members. The first source feature 228S is coupled to the first backside power rail 279 by way of the first source contact 235, a conductive feature 219 in a modular hybrid fin 2170, and the first backside contact via 281. The second source feature 244S is coupled to the second backside power rail 280 by way of the top source contact 250, a top conductive feature 239 in a top modular hybrid fin 2172, the bridging contact via 237, a conductive feature 219 in a modular hybrid fin 2170, and the second backside contact via 283. The first backside power rail 279 and the second backside power rail 280 are both disposed in the backside interconnect structure 290. Both the first drain feature 228D and the second drain feature 244D are electrically coupled to conductive features in the top interconnect structure 270 but are insulated from the backside interconnect structure 290. The first drain feature 228D is coupled to the first conductive line 266 by way of the first drain contact 234 and the second contact via 260. The second contact via 260 extends through the fourth dielectric layer 241 of a top modular hybrid fin 2172 along the Z direction. The second drain feature 244D is coupled to the second conductive line 268 by way of the second drain contact 252 and the third contact via 262.

Attention is now turned to method 500. FIG. 36 illustrates a flow chart of method 500, according to various aspects of the present disclosure. Throughout the present disclosure, similar reference numerals denote similar features in terms of composition and formation. Some details of operations in method 500 may be simplified or omitted if similar details have been described above in conjunction with method 100 or method 300.

Figure 37:
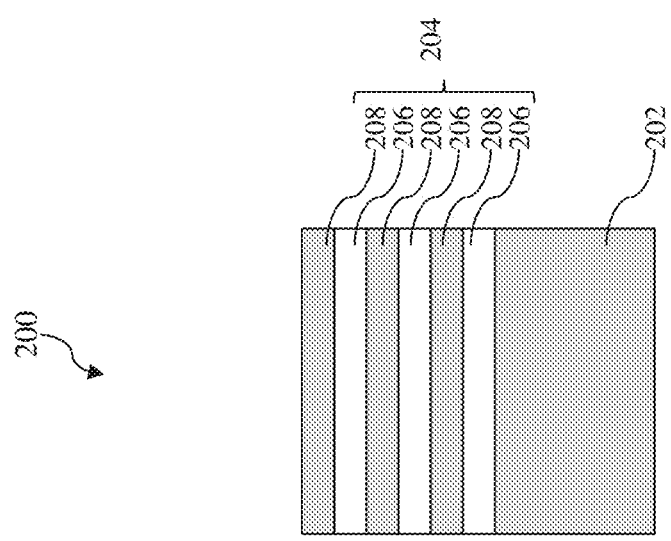

Referring to FIGS. 36 and 37, method 500 includes a block 502 where a workpiece 200 is provided. Because operations at block 502 are similar to those at block 102, detailed descriptions thereof are omitted for brevity.

Figure 38:
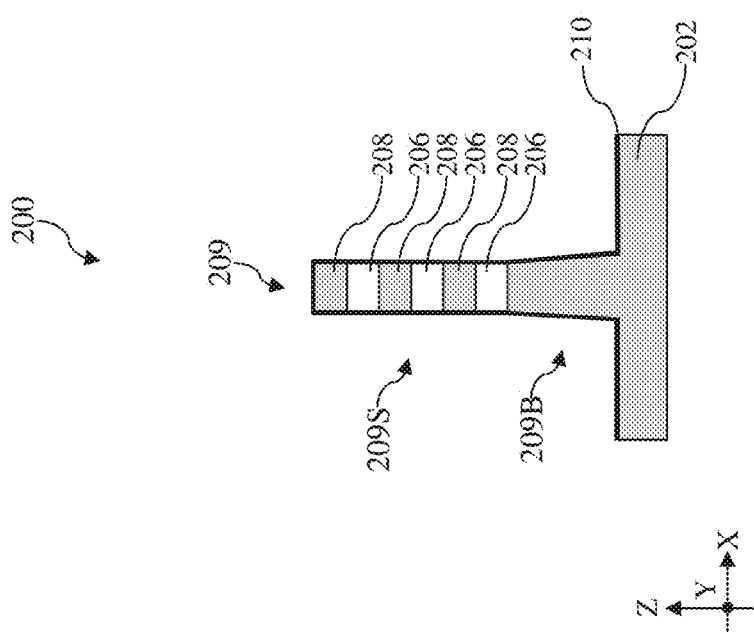

Referring to FIGS. 36 and 38, method 500 includes a block 504 where a first fin-shaped structure 209 is formed from the first stack 204. Because operations at block 504 are similar to those at block 104, detailed descriptions thereof are omitted for brevity.

Figure 39:
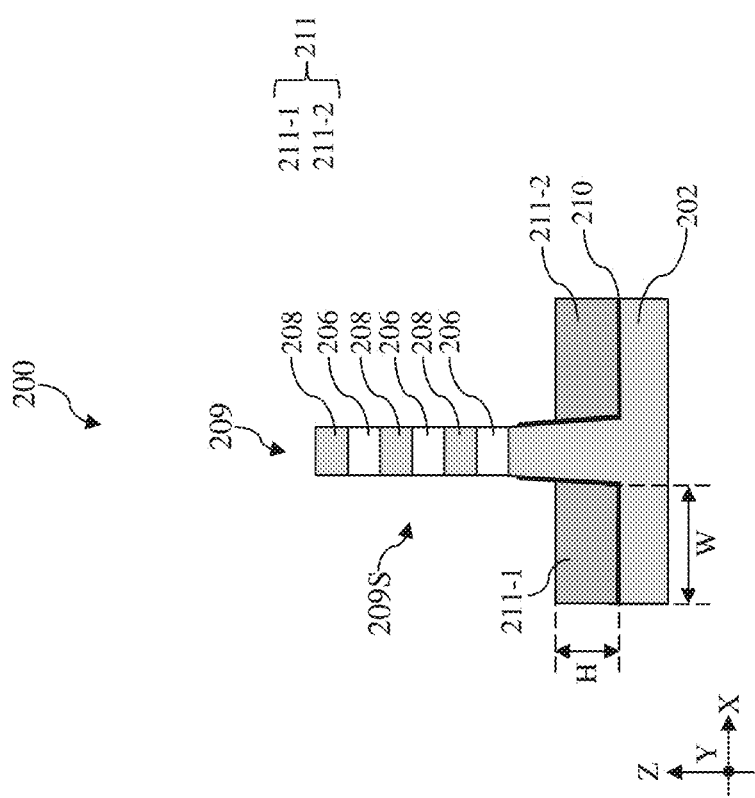

Referring to FIGS. 36 and 39, method 500 includes a block 506 where buried power rails 211 are formed. In some embodiments, before the first liner 210 is etched back, a metal layer for the buried power rails 211 is deposited over the workpiece 200 using metal-organic CVD or PVD. The first liner and the deposited metal layer are recessed to form buried power rails 211. The metal layer for the buried power rails 211 may include tungsten (W), ruthenium (Ru), copper (Cu), aluminum (Al), silver (Ag), molybdenum (Mo), rhenium (Re), iridium (Ir), cobalt (Co), or nickel (Ni). In the depicted embodiment, each of the buried power rails 211 includes a width W between about 40 nm and 80 nm and a height H between about 30 nm and about 50 nm. As shown in FIG. 39, the stack portion 209S of the first fin-shaped structure 209 may be exposed upon conclusion of block 506. As shown in FIG. 39, the buried power rails 211 includes a first buried power rail 211-1 and a second buried power rail 211-2.

Figure 40:
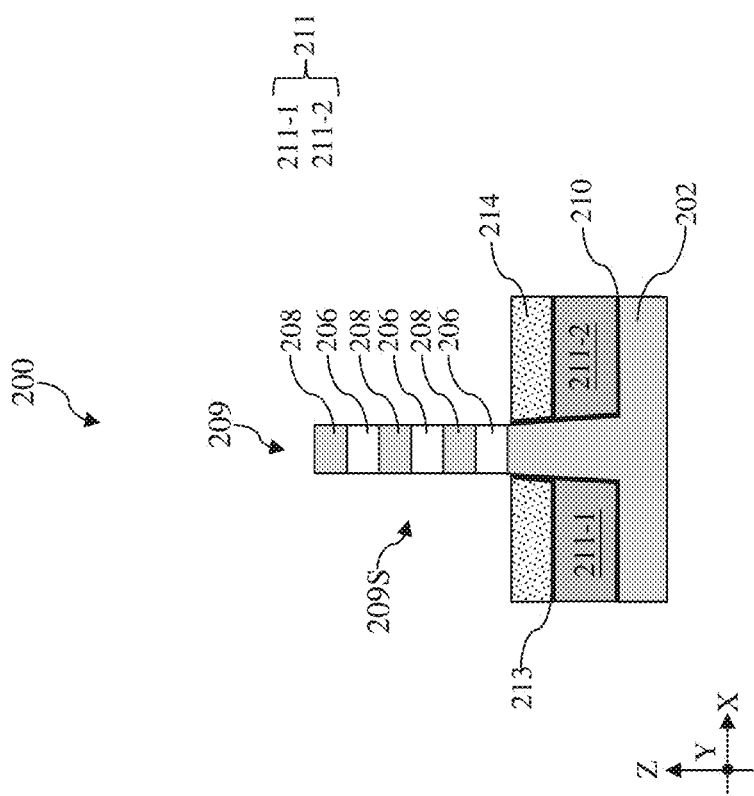
Figure 41:
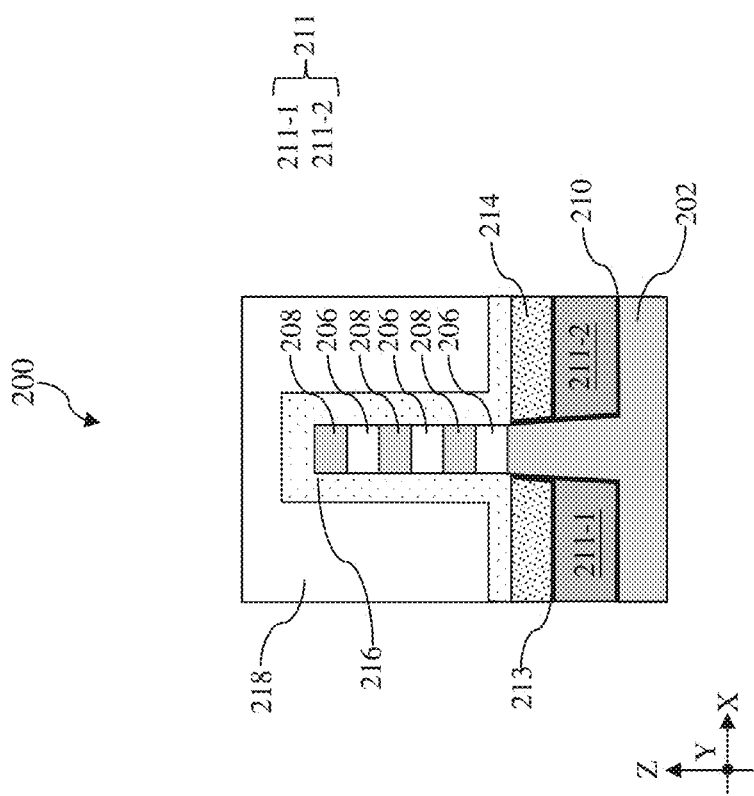

Referring to FIGS. 36 and 40, method 500 includes a block 508 where an isolation feature 214 is formed. In some embodiments, to protect the buried power rails 211 from oxidation, a second liner 213 is deposited over the buried power rails 211. The second liner 213 may be similar to the first liner 210 in terms of composition and formation. As shown in FIG. 41, the buried power rails 211 are surrounded by the first liner 210 and the second liner 213. The isolation feature 214 is then formed over the second liner 213. Because the formation of the isolation feature 214 has been described with respect to method 100, it will be omitted here for brevity. After the isolation feature 214 is formed, the second liner 213 is selectively recessed until the stack portion 209S of the first fin-shaped structure 209 is exposed.

Referring to FIGS. 36 and 41, method 500 includes a block 510 where a sacrificial spacer layer 216 is deposited over the first fin-shaped structure 209 and the isolation feature 214. Because operations at block 510 are similar to those at block 108, detailed descriptions thereof are omitted for brevity.

Referring to FIGS. 36 and 41, method 500 includes a block 512 where a first dielectric layer 218 is deposited over the sacrificial spacer layer 216. Because operations at block 512 are similar to those at block 110, detailed descriptions thereof are omitted for brevity.

Figure 42:
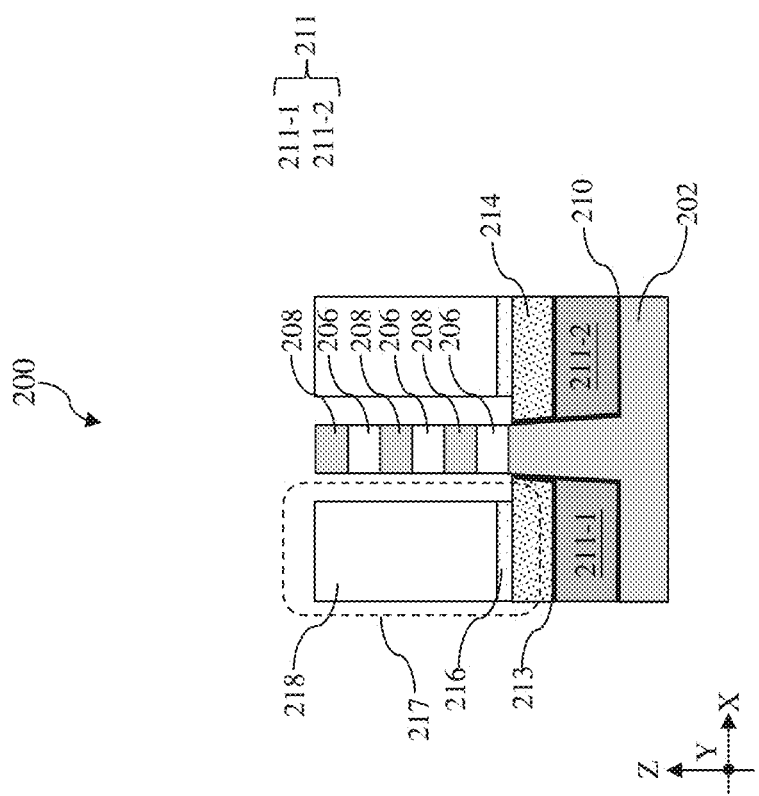

Referring to FIGS. 36 and 42, method 500 includes a block 514 where the sacrificial spacer layer 216 is selectively etched back to release the stack portion 209S of the first fin-shaped structure 209. Because operations at block 514 are similar to those at block 112, detailed descriptions thereof are omitted for brevity. Upon conclusion of the operations at block 514, hybrid fins 217 are formed on both sides of the stack portion 209S. Each of the hybrid fin 217 includes the sacrificial spacer layer 216 and the first dielectric layer 218 over the sacrificial spacer layer 216.

Figure 43:
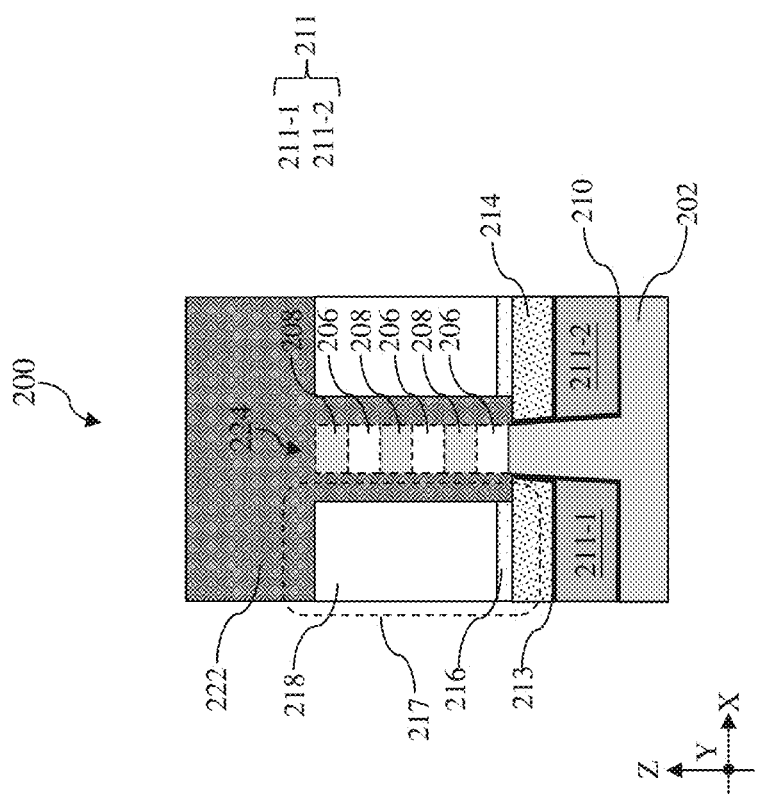

Referring to FIGS. 36 and 43, method 500 includes a block 516 where a dummy gate stack 222 is formed over the stack portion 209S and the hybrid fins 217. Because operations at block 516 are similar to those at block 114, detailed descriptions thereof are omitted for brevity.

Referring to FIGS. 36 and 43, method 500 includes a block 518 where source/drain portions of the first fin-shaped structure 209 are recessed to form source/drain recesses 224. Because operations at block 518 are similar to those at block 116, detailed descriptions thereof are omitted for brevity.

Figure 44:
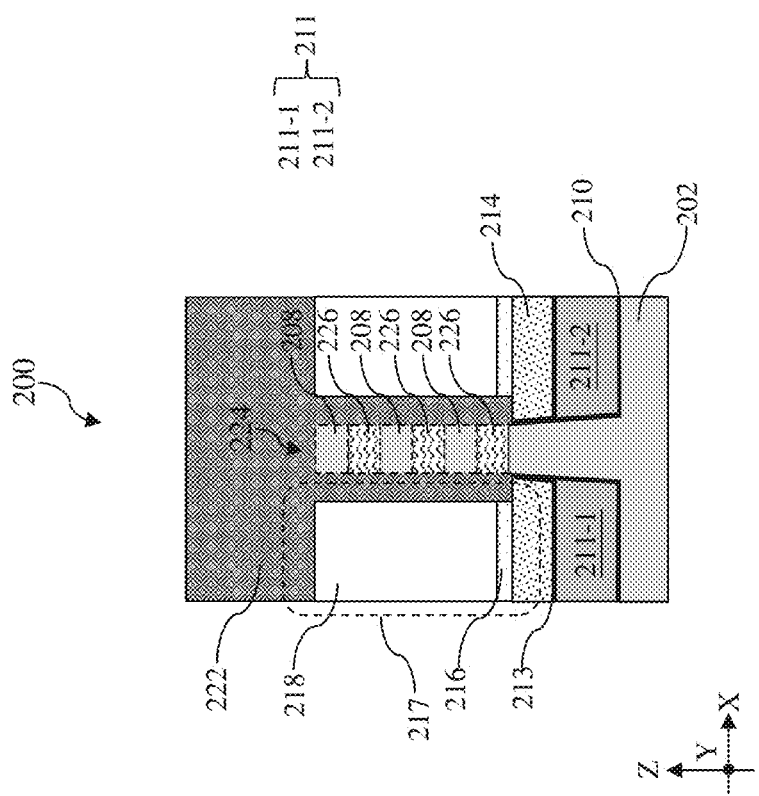

Referring to FIGS. 36 and 44, method 500 includes a block 520 where inner spacer features 226 are formed. Because operations at block 520 are similar to those at block 118, detailed descriptions thereof are omitted for brevity.

Figures 45A, 45B:
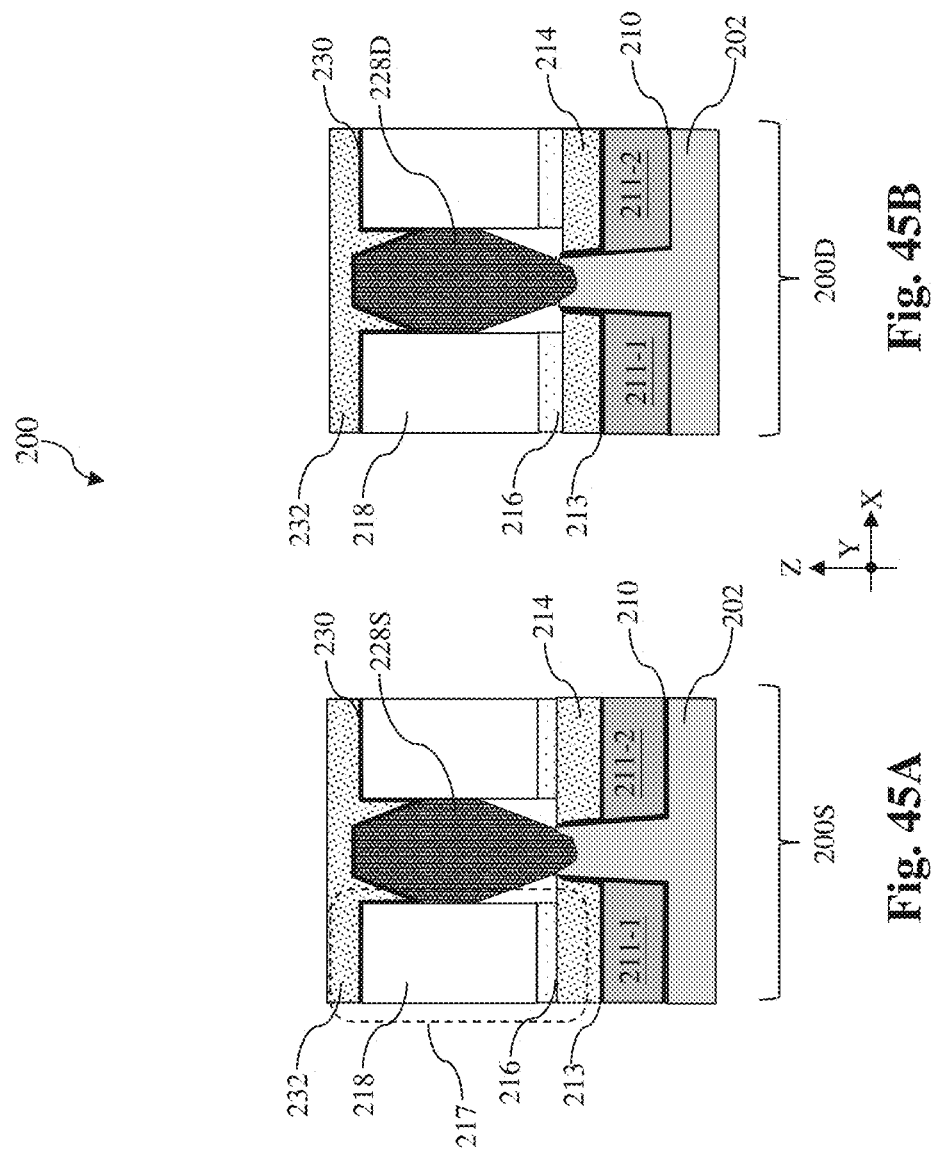

Referring to FIGS. 36, 45A and 45B, method 500 include a block 522 where a first source feature 228S and a first drain feature 228D are formed in the source/drain trenches 224. Because operations at block 522 are similar to those at block 120, detailed descriptions thereof are omitted for brevity.

Referring to FIGS. 36, 45A and 45B, method 500 include a block 524 where the dummy gate stack 222 is replaced with a first gate structure (its view blocked by the first source feature 228S). Because operations at block 524 are similar to those at block 122, detailed descriptions thereof are omitted for brevity.

Referring to FIGS. 36, 46A and 46B, method 500 includes a block 526 where a first drain contact 234, a first source contact 235, and a fourth contact via 215 are formed. In an example process, lithography processes are used to form contact openings that exposes the first source feature 228S and the first drain feature 228D. Additional lithography processes may be used to form a via opening for the fourth contact via 215 and the via opening exposes the first buried power rail 211-1. To reduce contact resistance, a silicide layer may be formed on the first source feature 228S and the first drain feature 228D by depositing a metal layer over the first source feature 228S and the first drain feature 228D and performing an anneal process to bring about silicidation between the metal layer and the first source feature 228S as well as between the metal layer and the first drain feature 228D. Here, suitable metal layer may include titanium (Ti), tantalum (Ta), nickel (Ni), cobalt (Co), or tungsten (W). The silicide layer may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer, a metal fill layer may be deposited into the contact openings and the contact via openings. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). A planarization process may follow to remove excess materials and to form the fourth contact via 215, the first source contact 235 and the first drain contact 234.

Figures 47A, 47B:
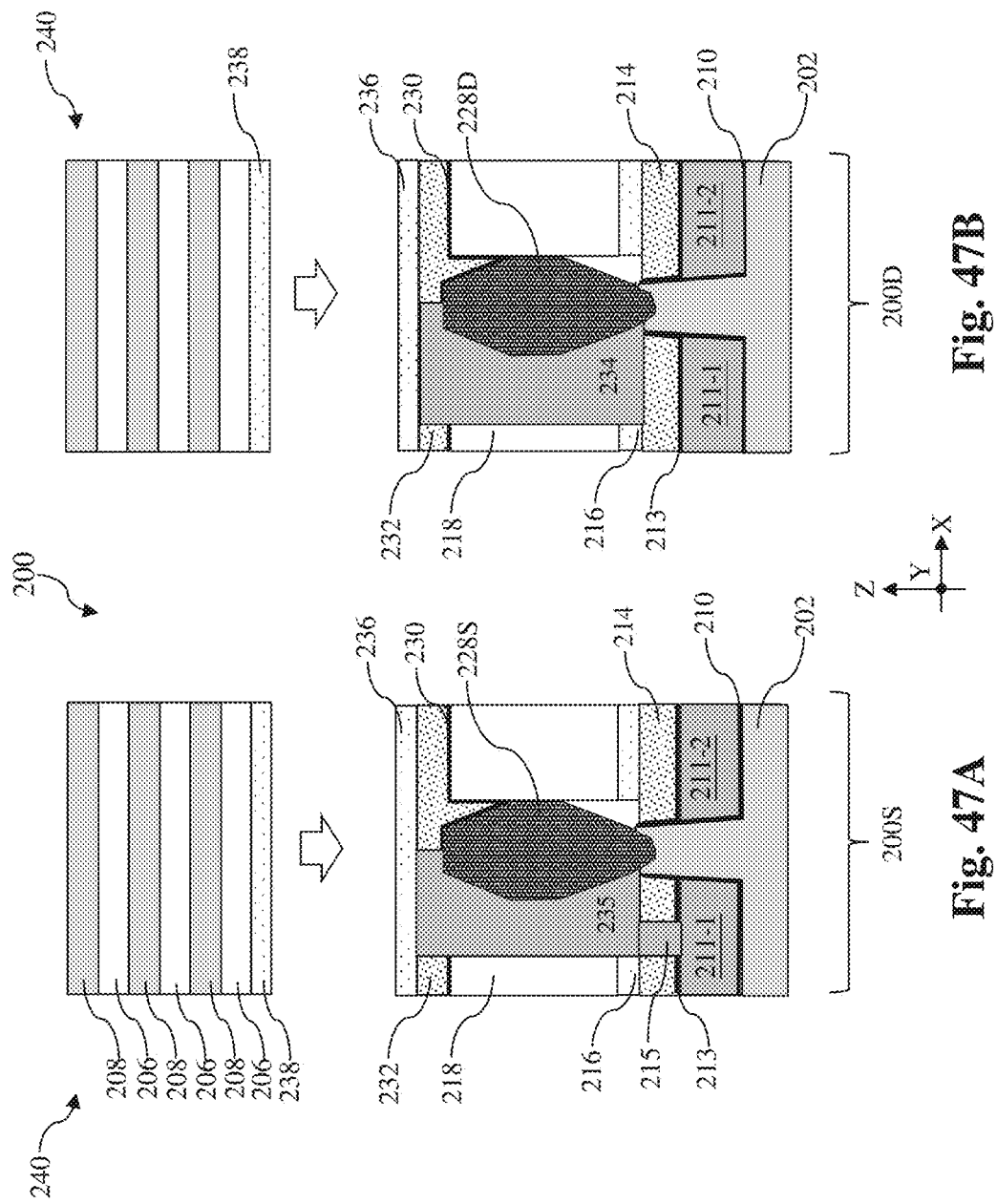

Referring to FIGS. 36, 47A and 47B, method 500 includes a block 528 where a second stack 240 are bonded over to the workpiece 200. Because operations at block 528 are similar to those at block 126, detailed descriptions thereof are omitted for brevity.

Figures 48A, 48B:
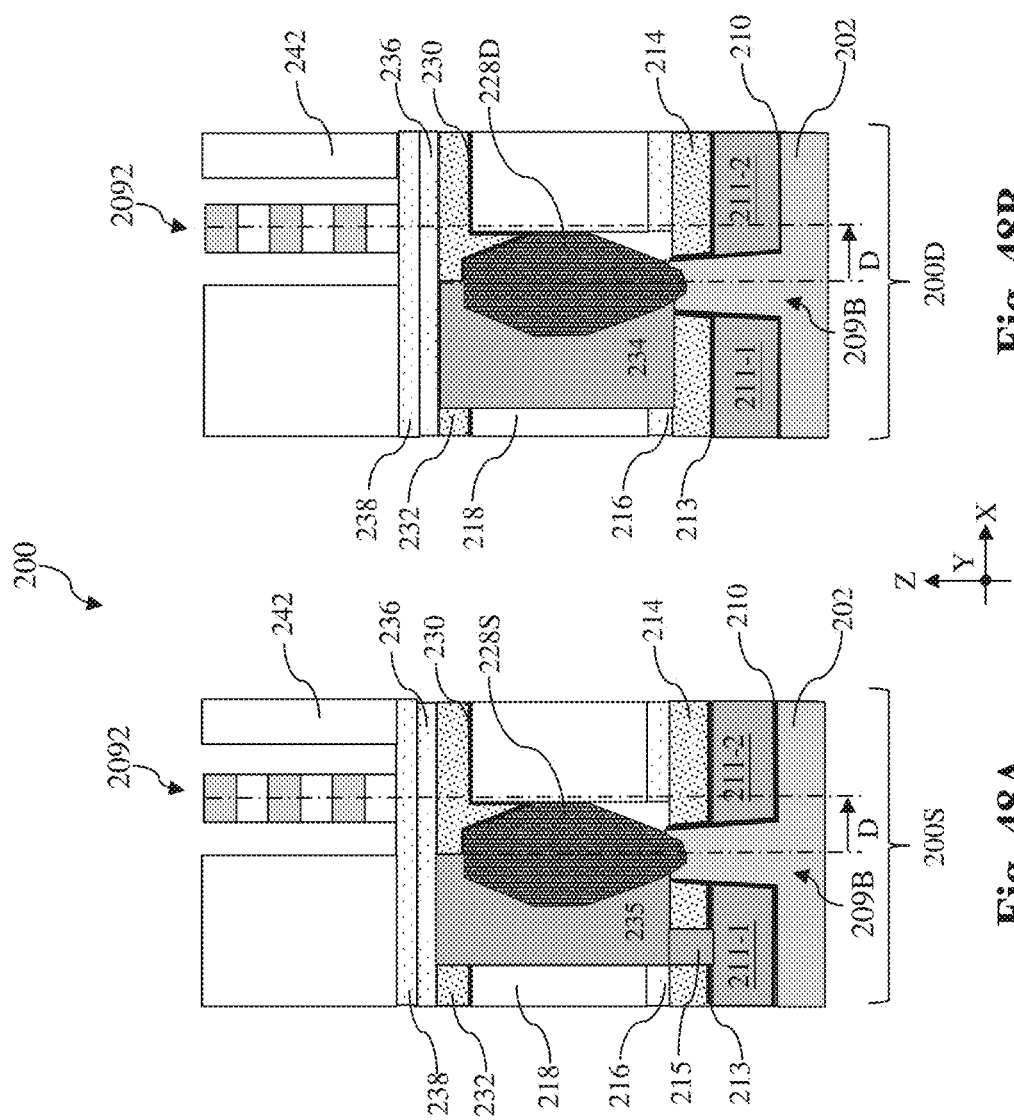

Referring to FIGS. 36, 48A, 48B, 49A, and 49B, method 500 includes a block 530 where operations in blocks 504, 510-524 are performed to the second stack 240. Operations at block 530 are only summarized where such operations are similar to those described above. Referring to FIGS. 48A and 48B, at block 504, the second stack 240 is patterned to form a third fin-shaped structure 2092. Different from the second fin-shaped structure 2090, the third fin-shaped structure 2092 is not vertically aligned with the first fin-shaped structure 209 (its position is marked by the base portion 209B). Measured from respective middle line, the third fin-shaped structure 2092 is intentionally offset from the first fin-shaped structure 209 by a shift distance D. In some instances, the shift distance D may be between about 5 nm and about 150 nm. In this regard, a shift distance less than 5 nm falls within the general misalignment range and may not be significant enough to yield benefits. The shift distance is smaller than 150 nm, which is about the largest dimension of the hybrid fin 217. If the shift distance is greater than 150 nm, benefits of reducing parasitic capacitance from the intentional may reduce. Operations at block 506 are omitted buried power rails 211 are already formed. Because the third fin-shaped structure 2092 is insulated by the capping layer 236 and the base layer 238, operations at block 508 may be omitted. Still referring to FIGS. 48A and 48B, at blocks 510, 512 and 514, top hybrid fins 242 are formed on both sides of the third fin-shaped structure 2092. At block 516, a counterpart dummy gate stack is formed over the channel region of the third fin-shaped structure 2092 to serve as a placeholder for a functional second gate structure. At block 518, the source/drain portion of the third fin-shaped structure 2092 are recessed to form source/drain recesses, similar to the source/drain trenches 224. At block 520, the sacrificial layers 206 in the channel region are selectively and partially etched to form inner spacer recesses and inner spacer features are formed in such inner spacer recesses. Referring to FIGS. 49A and 49B, at block 522, a second source feature 244S and a second drain feature 244D are formed in the source/drain recesses. At block 524, the dummy gate stack over the third fin-shaped structure is replaced by a second gate structure. The sacrificial layers 206 in the channel region are selectively removed to release the channel layers 208 as channel members and the second gate structure wraps around each of the channel members. Before the replacement of the dummy gate stack, a second CESL 246 and a second ILD layer 248 are sequentially deposited over the top hybrid fins 242, the second source feature 244S and the second drain feature 244D, as illustrated in FIGS. 49A and 49B.

Figures 50A, 50B:
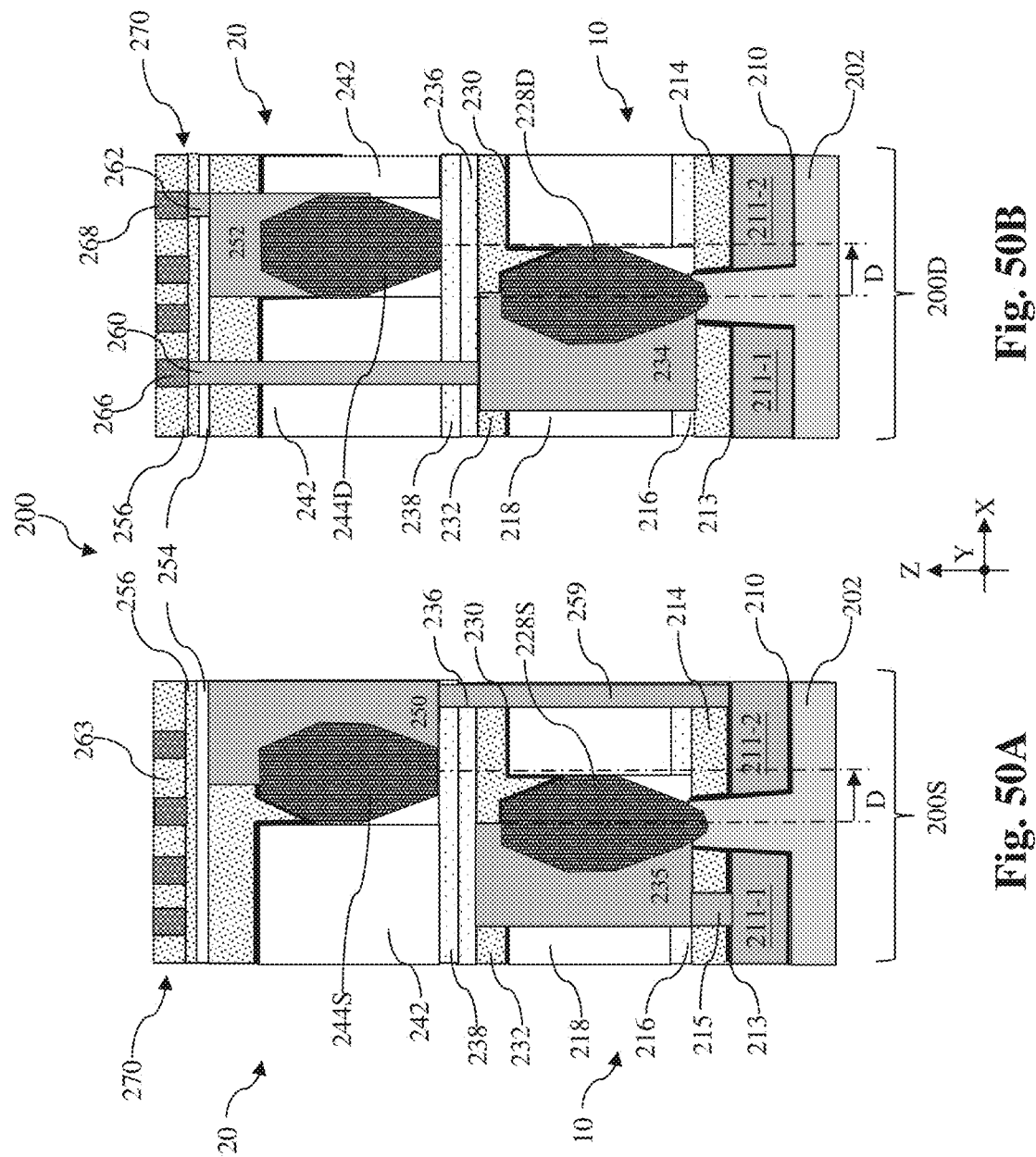

Referring to FIGS. 36, 50A and 50B, method 500 includes a block 532 where a fifth contact via 259, a top source contact 250, a second drain contact 252, a second contact via 260, and a third contact via 262 are formed. As shown in FIG. 50A, the top source contact 250 is formed over and in contact with the second source feature 244S. Similar to the first drain contact 234, a contact opening is first made to expose the second source feature 244S. Then, a via opening for the fifth contact via 259 is formed through the base layer 238, the capping layer 236, a hybrid fin 217, the isolation feature 214, and the second liner 213, to expose the second buried power rail 211-2. After the formation of the contact openings and the via opening, a silicide layer is formed on the second source feature 244S, and a metal fill layer is deposited to fill the rest of the contact opening. The fifth contact via 259 serves to couple the top source contact 250 and the second buried power rail 211-2. In a similar fashion, a second drain contact 252 is formed over and in contact with the second drain feature 244D. The top source contact 250 and the second drain contact 252 may be formed in the same process step. After the formation of the top source contact 250 and the second drain contact 252, an etch stop layer (ESL) 254 and a third ILD layer 256 are deposited over the top source contact 250 and the second drain contact 252 to passivate the same.

Formation of the second contact via 260 and the third contact via 262 may include formation of via openings through at least the ESL 254 and the third ILD layer 256 and deposition of a metal fill layer. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). In some embodiments, each of the second contact via 260 and the third contact via 262 may include a liner between the metal fill layer and neighboring dielectric material to improve electrical integrity. Such liner may include titanium (Ti), tantalum (Ta), titanium nitride (TiN), cobalt nitride (CoN), nickel nitride (NiN), or tantalum nitride (TaN). Because formation of the second contact via 260 requires forming a via opening that extends through not only the ESL 254 and the third ILD layer 256 but also the second ILD layer 248, the CESL 246, the top hybrid fin 242, the base layer 238, and the capping layer 236, the via opening for the second contact via 260 is not simultaneously formed with the via opening for the third contact via 262. In some other embodiments, the via opening for the second contact via 260 is separately formed and is etched in several etch stages.

Referring to FIGS. 36, 50A and 50B, method 500 includes a block 534 where a top interconnect structure 270 is formed. The top interconnect structure 270 includes a first passivation layer 263 and conductive features in the first passivation layer 263. In the depicted embodiments, the conductive features include a first conductive line 266 and a second conductive line 268. In an example process, the first passivation layer 263 is deposited over the workpiece 200, the first passivation layer 263 is then patterned, and a conductive material is deposited over the patterned first passivation layer 263. Although the top interconnect structure 270 in FIGS. 50A and 50B includes only one interconnect layer, the top interconnect structure 270 may include more interconnect layers and may include all interconnect layers over the workpiece 200. As shown in FIG. 50B, the second contact via 260 is in direct contact with the first conductive line 266 and the third contact via 262 is in direct contact with the second conductive line 268.

Reference is now made to FIGS. 50A and 50B. Upon conclusion of the operations in method 500, a first MBC transistor 10 and a second MBC transistor 20 over the first MBC transistor 10 are formed. The first MBC transistor 10 includes channel members sandwiched between the first source feature 228S and the first drain feature 228D. A first gate structure (its view blocked by the first source feature 228S) of the first MBC transistor 10 wraps around each of its channel members. The second MBC transistor 20 includes channel members sandwiched between the second source feature 244S and the second drain feature 244D. A second gate structure (its view blocked by the second source feature 244S) of the second MBC transistor 20 wraps around each of its channel members. The first source feature 228S is coupled to the first buried power rails 211-1 by way of the first source contact 235 and the fourth contact via 215. The second source feature 244S is coupled to the second buried power rails 211-2 by way of the top source contact 250 and the fifth contact via 259. Both the first drain feature 228D and the second drain feature 244D are electrically coupled to conductive features in the top interconnect structure 270. The first drain feature 228D is coupled to the first conductive line 266 by way of the first drain contact 234 and the second contact via 260. The second contact via 260 extends through the top hybrid fin 242 along the Z direction. The second drain feature 244D is coupled to the second conductive line 268 by way of the third contact via 262. Because the third fin-shaped structure 2092 is vertically shifted from the first fin-shaped structure 209 along the X direction by the shift distance D, the distance between the fifth contact via 259 and the first source feature 228S and the distance between the second contact via 260 and the second drain feature 244D are enlarged by the shift distance D as well. These enlarged distances reduce parasitic capacitance and may improve process windows.

FIGS. 51A and 51B illustrate an alternative embodiment where structures formed using method 100 and structures formed using method 500 are combined. According to the alternative embodiment, the semiconductor device 200 is structurally similar to the semiconductor device 200 shown in FIGS. 17A and 17B but the channel members of the second MBC transistor 20 are vertically offset from the channel members of the first MBC transistor 10 by the shift distance D. In this alternative embodiment, the distance between the second contact via 260 and the second drain feature 244D is increased by the shift distance D to reduce parasitic capacitance and to increase process window.

As shown in FIGS. 17A, 17B, 35A, and 35B, in methods 100 and 300, the channel members of the first MBC transistor 10 are vertically aligned with the channel members of the second MBC transistor 20. This vertical alignment allows formation of a common gate structure that wraps around each of the channel members in the first MBC transistor 10 and the second MBC transistor 20. FIG. 52 illustrates a method 600 for forming a common gate structure when the channel members of the first MBC transistor 10 are vertically aligned with the channel members of the second MBC transistor 20.

Figure 53:
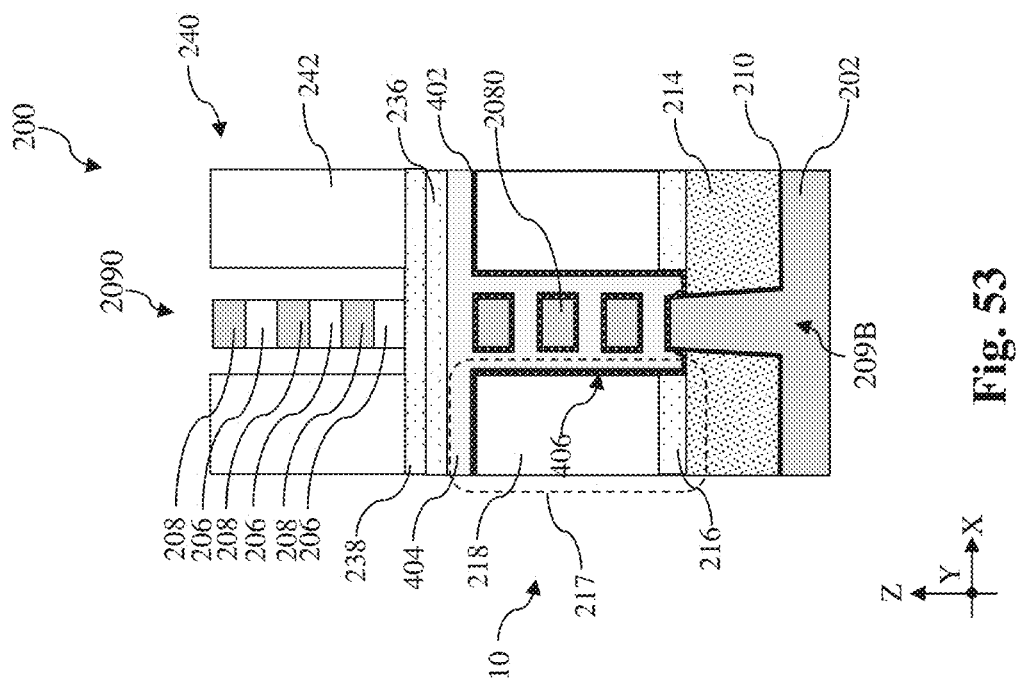

Referring to FIGS. 52 and 53, method 600 includes a block 602 where a first MBC transistor 10 is received and the first MBC transistor 10 includes first channel members 2080 and a gate structure 406 wrapping around each of the first channel members 2080. In some embodiments, the first MBC transistor 10 may be structurally similar to the first MBC transistor 10 shown in FIGS. 17A and 17B or FIGS. 35A and 35B. The gate structure 406 includes a first gate dielectric layer 402 and a first gate electrode layer 404. In some embodiments, an interfacial layer is disposed between each of the first channel members 2080 and the first gate dielectric layer 402. The compositions and formation of the interfacial layer, the first gate dielectric layer 402 and the first gate electrode layer 404 are described above and will not be repeated here. When method 100 is adopted, as shown in FIG. 53, the first channel members 2080 and at least a portion of the gate structure 406 are disposed between two hybrid fins 217, each of which includes the sacrificial spacer layer 216 and a first dielectric layer 218 over the sacrificial spacer layer 216. When method 300 is adopted (not explicitly shown), the first channel members 2080 and at least a portion of the gate structure 406 are disposed between two modular hybrid fins 2170, each of which includes a conductive feature embedded in a second dielectric layer and a third dielectric layer. The base portion 209B is disposed in the isolation feature 214.

Figure 54:
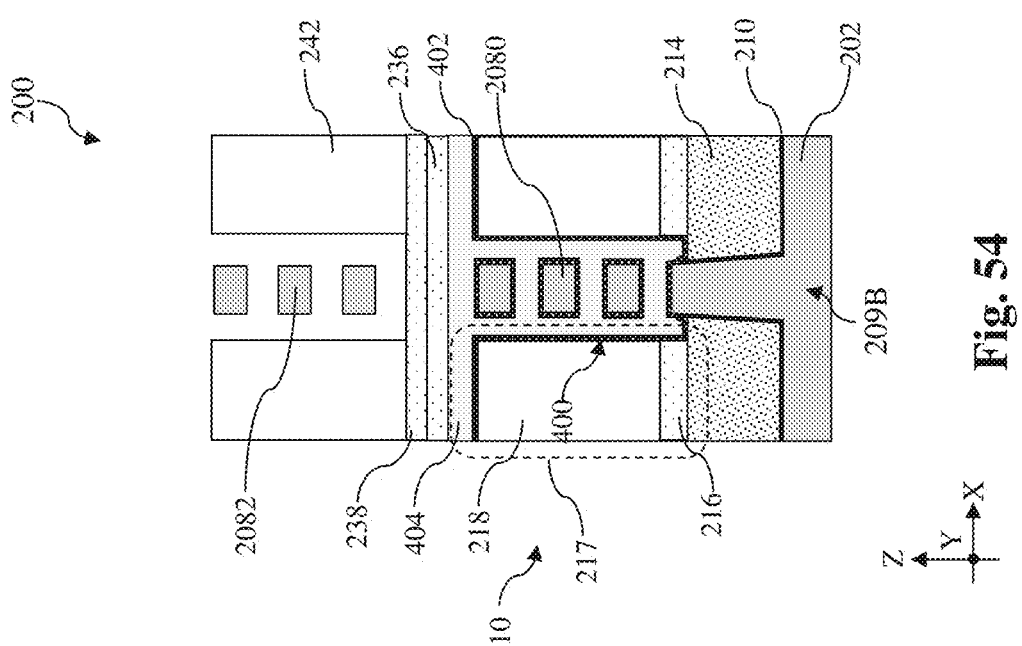

Referring to FIGS. 52, 53 and 54, method 600 includes a block 604 where second channel members 2082 is formed over the first channel members 2080. In an example process, a second fin-shaped structure 2090 is formed from a second stack 240. The second stack 240, which includes sacrificial layers 206 and channel layers 208, is bonded to the first MBC transistor 10 by direct bonding a capping layer 236 on the first MBC transistor 10 and a base layer 238 on a bottom surface of the second stack 240. When method 100 is adopted, as shown in FIG. 53, the second fin-shaped structure 2090 is disposed between but spaced apart from two top hybrid fins 242. When method 300 is adopted (not explicitly shown), the second fin-shaped structure 2090 is disposed between but spaced apart from two top modular hybrid fins 2172. After the second fin-shaped structure 2090 is formed, a dummy gate structure is formed over a channel region of the second-fin shaped structure, source/drain regions of the second fin-shaped structure are recessed to form source/drain recesses, and inner spacer features are formed, source/drain features are formed in the source/drain recesses. After the dummy gate structure is removed, the sacrificial layers 206 are selectively removed to release the channel layers 208 as second channel members 2082, as shown in FIG. 54. The second channel members 2082 are vertically aligned with the first channel members 2080.

Figure 55:
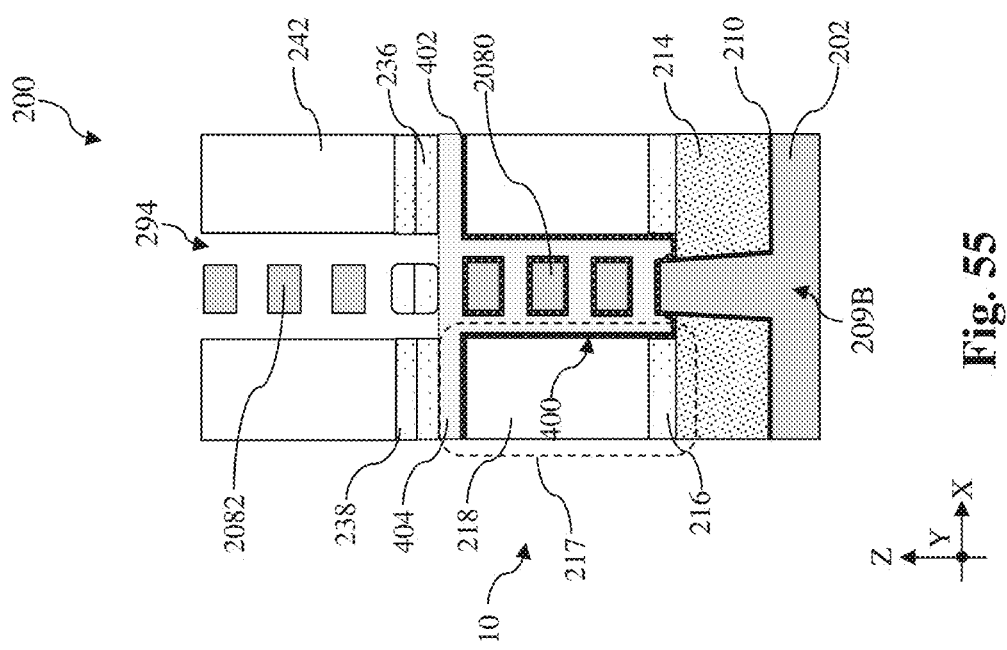

Referring to FIGS. 52 and 55, method 600 includes a block 606 where an access opening 294 to the gate structure 406 is formed. By using an anisotropic etching, such as RIE or other suitable dry etch process, the access opening 294 is formed through the base layer 238 and the capping layer 236, thereby exposing the gate structure 400 of the first MBC transistor 10 in the access opening 294.

Figure 56:
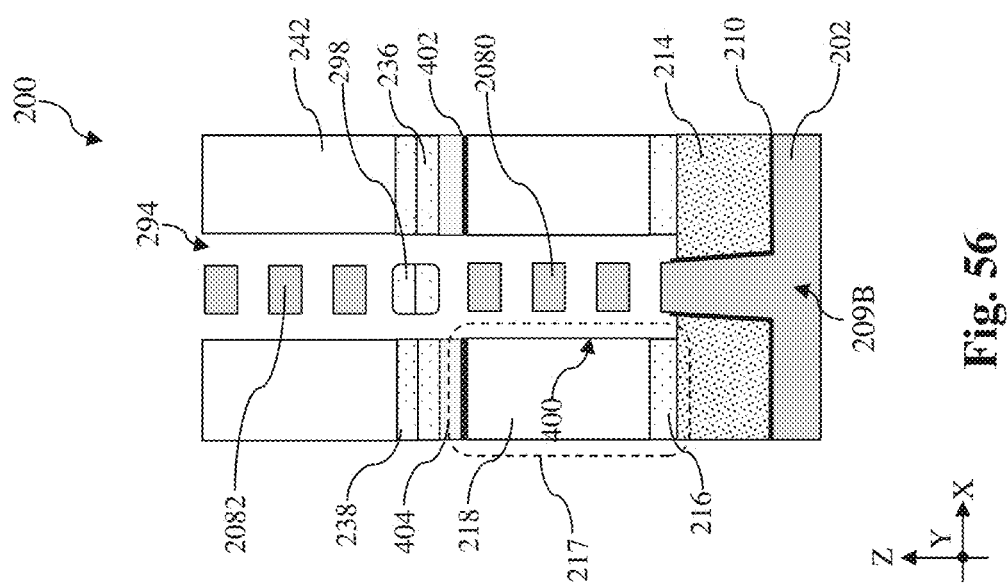

Referring to FIGS. 52 and 56, method 600 includes a block 608 where the gate structure 406 is selectively removed to expose the first channel members 2080. With the gate structure 406 exposed in the access opening 294, the gate structure 406 in the access opening 294 is selectively removed to release the first channel members 2080 while the first channel members 2080 are substantially undamaged. In some embodiments represented in FIG. 56, a portion of the base layer 238 and the capping layer 236 may remain to form a dielectric channel feature 298. In some other embodiments not explicitly shown, the dielectric channel feature 298 may not be present. It is noted that a portion of the gate structure 406 may be present between the capping layer 236 and the hybrid fin 217 in some implementations. In other implementations where a gate cut dielectric feature is present, the gate structure 406 does not come between the capping layer and the hybrid fin 217.

Referring to FIGS. 52 and 57, method 600 includes a block 610 where a common gate structure 412 is formed to wrap around each of the first channel members 2080 and the second channel members 2082. The common gate structure 412 includes an interfacial layer, a common gate dielectric layer 408 over the interfacial layer, and a common gate electrode layer 410 over the common gate dielectric layer 408. The interfacial layer of the common gate structure 412 is disposed around and in contact with each of the first channel members 2080, the dielectric channel feature 298, and each of the second channel member 2082. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The common gate dielectric layer 408 is then deposited over the interfacial layer using ALD, CVD, and/or other suitable methods. The common gate dielectric layer 408 may be formed of high-K dielectric materials. As used and described herein, high-k dielectric materials include dielectric materials having a high dielectric constant, for example, greater than that of thermal silicon oxide (~3.9). The common gate dielectric layer 408 may include hafnium oxide. Alternatively, the common gate dielectric layer 408 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), $(Ba,Sr)TiO_3$ (BST), silicon nitride (SiN), silicon oxynitride (SiON), combinations thereof, or other suitable material.

The common gate electrode layer 410 is then deposited over the common gate dielectric layer 408 using ALD, PVD, CVD, e-beam evaporation, or other suitable methods. The common gate electrode layer 410 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the common gate electrode layer 410 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different common gate electrode layers may be formed separately for n-type transistors and p-type transistors, which may include different metal layers (e.g., for providing different n-type and p-type work function metal layers).

Embodiments of the present disclosure provide advantages. The present disclosure provides different contact structure schemes that can be combined in different embodiments. The contact structure schemes according to the present disclosure include, for example, dual interconnect structures, hybrid fins with embedded conductive features, and offset device stacking. In "dual interconnect structures", a source feature of the first MBC transistor is coupled to a power rail in a first interconnect structure by a backside source contact and a source feature of the second MBC transistor (which is disposed over the first MBC transistor) is coupled to a power rail in a second interconnect structure over the second MBC transistor. In "hybrid fins with embedded conductive features," a conductive feature is embedded in each of the hybrid fins to provide contact modules that serve as conductive path ways to interconnect structures. In "offset device stacking," the source/drain regions of the first MBC transistor and the second MBC transistor are offset to one another to increase spacing between contact vias and drain features. These contact structure schemes provide process flexibility and may improve device performance by reducing contact resistance or parasitic capacitance.

In one exemplary aspect, the present disclosure is directed to a semiconductor device. The semiconductor device includes a first interconnect structure, a first transistor over the first interconnect structure, a second transistor over the first transistor, and a second interconnect structure over the second transistor. The first transistor includes first nanostructures, and a first source feature adjoining the first nanostructures. The second transistor includes second nanostructures and a second source feature adjoining the second nanostructures. The first source feature is coupled to a first power rail in the first interconnect structure, and the second source feature is coupled to a second power rail in the second interconnect structure.

In some embodiments, the second nanostructures are vertically aligned with the first nanostructures. In some implementations, the first transistor further includes a first gate structure wrapping around each of the first nanostructures and the first gate structure extends lengthwise along a direction, the second transistor further includes a second gate structure wrapping around each of the second nanostructures and the second gate structure extends lengthwise along the direction, and the second nanostructures are offset from the first nanostructures along the direction. In some embodiments, the semiconductor device may further include a gate structure that wraps around each of the first nanostructures and each of the second nanostructures. In some embodiments, the first transistor further includes a first drain feature and a first drain contact over and in contact with the first drain feature and the first drain contact is coupled to a first conductive line in the second interconnect structure by way of a first contact via. In some implementations, the second transistor further includes a second drain feature and a second drain contact over and in contact with the second drain feature, and the second drain contact is coupled to a second conductive line in the second interconnect structure by way of a second contact via. In some instances, the first source feature is coupled to the first power rail in the first interconnect structure by way of a backside source contact disposed directly below the first source feature.

In another exemplary aspect, the present disclosure is directed to a semiconductor device. The semiconductor device includes a first interconnect structure, a first transistor over the first interconnect structure, a second transistor over the first transistor, and a second interconnect structure over the second transistor. The first transistor includes first nanostructures and a first source feature adjoining the first nanostructures. The second transistor includes second nanostructures and a second source feature adjoining the second nanostructures. The first source feature is coupled to a first power rail in the first interconnect structure, and the second source feature is coupled to a second power rail in the first interconnect structure.

In some embodiments, the first transistor further includes a first drain feature and a first drain contact over and in contact with the first drain feature and the first drain contact is coupled to a first conductive line in the second interconnect structure by way of a first contact via. In some implementations, the second transistor further includes a second drain feature and a second drain contact over and in contact with the second drain feature and the second drain contact is coupled to a second conductive line in the second interconnect structure by way of a second contact via. In some instances, the first nanostructures are disposed between a first hybrid fin and a second hybrid fin, the first hybrid fin includes a first conductive feature embedded in a first dielectric feature, and the second hybrid fin includes a second conductive feature embedded in a second dielectric feature. In some embodiments, the first source feature is coupled to the first power rail in the first interconnect structure by way of the first conductive feature and the second source feature is coupled to the second power rail in the first interconnect structure by way of the second conductive feature. In some instances, the first transistor further includes a first drain feature and a first drain contact over and in contact with the first drain feature. The first drain feature and the first drain contact are disposed between the first hybrid fin and the second hybrid fin. The first drain feature and the first drain contact are electrically isolated from the first conductive feature and the second conductive feature. In some embodiments, the second nanostructures are disposed between a third hybrid fin and a fourth hybrid fin, the third hybrid fin includes a third conductive feature embedded in a first dielectric feature, and the fourth hybrid fin includes a fourth conductive feature embedded in a second dielectric feature. In some instances, the first transistor further includes a first drain feature and a first drain contact over and in contact with the first drain feature, the first drain contact is coupled to a first conductive line in the second interconnect structure by way of a first contact via, and the first contact via extends through the first dielectric feature and is electrically isolated from the third conductive feature.

In yet another exemplary aspect, the present disclosure is directed to a method. The method includes receiving a workpiece including a first substrate and a first stack over the first substrate, the first stack including a first plurality of channel layers interleaved by a first plurality of sacrificial layers, forming a first fin-shaped structure from the first stack and a portion of the first substrate, the first fin-shaped structure including a first source region and a first drain region, forming a first hybrid fin and a second hybrid fin that extend parallel to the first fin-shaped structure, the first hybrid fin including a first conductive feature embedded in a first dielectric feature and the second hybrid fin including a second conductive feature embedded in a second dielectric feature, forming a first source feature over the first source region and a first drain feature over the first drain region, forming a first source contact in direct contact with the first source feature and the first conductive feature, forming a first drain contact in direct contact with the first drain feature, depositing a capping layer over the first source contact and the first drain contact, bonding a second stack over the capping layer, the second stack including a second plurality of channel layers interleaved by a second plurality of sacrificial layers, forming a second fin-shaped structure from the second stack, the second fin-shaped structure including a second source region and a second drain region, forming a third hybrid fin and a fourth hybrid fin that extend parallel to the second fin-shaped structure, the third hybrid fin including a third conductive feature embedded in a third dielectric feature and the fourth hybrid fin including a fourth conductive feature embedded in a fourth dielectric feature, forming a second source feature over the second source region and a second drain feature over the second drain region, forming a second source contact in direct contact with the second source feature and the third conductive feature, and forming a second drain contact in direct contact with the second drain feature.

In some embodiments, the method may further include forming a first contact via coupling the fourth conductive feature and the second conductive feature, forming a second contact via below and in contact with the first conductive feature, and forming a third contact via below and in contact with the second conductive feature. In some implementations, the method may further include forming a first interconnect structure over the second source contact and the second drain contact, where the first interconnect structure includes a first conductive line and a second conductive line, forming a fourth contact via coupling the first drain contact and the first conductive line, and forming a fifth contact via coupling the second drain contact and the second conductive line. In some implementations, the fourth contact via extends through the third dielectric feature and is electrically isolated from the third conductive feature. In some embodiments, the method may further include forming a second interconnect structure below the first substrate, the second interconnect structure includes a first power rail and a second power rail, and the first power rail is coupled to the second contact via and the second power rail is coupled to the third contact via.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first interconnect structure;
   a first transistor over the first interconnect structure and comprising:
     first nanostructures, and
     a first source feature adjoining the first nanostructures;
   a second transistor over the first transistor and comprising:
     second nanostructures, and
     a second source feature adjoining the second nanostructures; and
   a second interconnect structure over the second transistor,
   wherein the first source feature is vertically spaced apart from the second source feature by an interlayer dielectric layer and a base dielectric layer over the interlayer dielectric layer,
   wherein the base dielectric layer extends continuously from between the first source feature and the second source feature to between the first nanostructures and the second nanostructures,
   wherein the first source feature is coupled to a first power rail in the first interconnect structure, and the second source feature is coupled to a second power rail in the second interconnect structure.

2. The semiconductor device of claim 1, wherein the second nanostructures are vertically aligned with the first nanostructures.

3. The semiconductor device of claim 1,
   wherein the first transistor further comprises a first gate structure wrapping around each of the first nanostructures and the first gate structure extends lengthwise along a direction,
   wherein the second transistor further comprises a second gate structure wrapping around each of the second nanostructures and the second gate structure extends lengthwise along the direction,
   wherein the second nanostructures are offset from the first nanostructures along the direction.

4. The semiconductor device of claim 1, further comprising:
   a gate structure that wraps around each of the first nanostructures and each of the second nanostructures.

5. The semiconductor device of claim 1,
   wherein the first transistor further comprises a first drain feature and a first drain contact over and in contact with the first drain feature,
   wherein the first drain contact is coupled to a first conductive line in the second interconnect structure by way of a first contact via.

6. The semiconductor device of claim 1,
   wherein the second transistor further comprises a second drain feature and a second drain contact over and in contact with the second drain feature,
   wherein the second drain contact is coupled to a second conductive line in the second interconnect structure by way of a second contact via.

7. The semiconductor device of claim 1, wherein the first source feature is coupled to the first power rail in the first interconnect structure by way of a backside source contact disposed directly below the first source feature.

8. A semiconductor device, comprising:
a first interconnect structure comprising a passivation layer and a first power rail disposed in the passivation layer;
an isolation feature disposed on the first interconnect structure;
a first transistor over the isolation feature and comprising:
   first nanostructures, and
   a first source feature adjoining the first nanostructures along a first direction;
a second transistor over the first transistor and comprising:
   second nanostructures, and
   a second source feature adjoining the second nanostructures along the first direction;
a second interconnect structure over the second transistor; and
a backside source contact extending from a top surface of the first power rail, through the isolation feature to electrically couple to the first source feature,
wherein the backside source contact is directly below the first source feature,
wherein the first source feature is sandwiched directly between a first hybrid fin and a second hybrid fin along a second direction perpendicular to the first direction,
wherein the second source feature is coupled to a second power rail in the first interconnect structure.

9. The semiconductor device of claim 8,
wherein the first transistor further comprises a first drain feature and a first drain contact over and in contact with the first drain feature,
wherein the first drain contact is coupled to a first conductive line in the second interconnect structure by way of a first contact via.

10. The semiconductor device of claim 8,
wherein the second transistor further comprises a second drain feature and a second drain contact over and in contact with the second drain feature,
wherein the second drain contact is coupled to a second conductive line in the second interconnect structure by way of a second contact via.

11. The semiconductor device of claim 8,
wherein the first nanostructures are disposed between the first hybrid fin and the second hybrid fin,
wherein the first hybrid fin comprises a first conductive feature embedded in a first dielectric feature,
wherein the second hybrid fin comprises a second conductive feature embedded in a second dielectric feature.

12. The semiconductor device of claim 11,
wherein the first source feature is coupled to the first power rail in the first interconnect structure by way of the first conductive feature,
wherein the second source feature is coupled to the second power rail in the first interconnect structure by way of the second conductive feature.

13. The semiconductor device of claim 11,
wherein the first transistor further comprises a first drain feature and a first drain contact over and in contact with the first drain feature,
wherein the first drain feature and the first drain contact are disposed between the first hybrid fin and the second hybrid fin,
wherein the first drain feature and the first drain contact are electrically isolated from the first conductive feature and the second conductive feature.

14. The semiconductor device of claim 8,
wherein the second nanostructures are disposed between a third hybrid fin and a fourth hybrid fin,
wherein the third hybrid fin comprises a third conductive feature embedded in a first dielectric feature,
wherein the fourth hybrid fin comprises a fourth conductive feature embedded in a second dielectric feature.

15. The semiconductor device of claim 14,
wherein the first transistor further comprises a first drain feature and a first drain contact over and in contact with the first drain feature,
wherein the first drain contact is coupled to a first conductive line in the second interconnect structure by way of a first contact via,
wherein the first contact via extends through the first dielectric feature and is electrically isolated from the third conductive feature.

16. A method, comprising:
receiving a workpiece comprising a first substrate and a first stack over the first substrate, the first stack including a first plurality of channel layers interleaved by a first plurality of sacrificial layers;
forming a first fin-shaped structure from the first stack and a portion of the first substrate, the first fin-shaped structure comprising a first source region and a first drain region;
forming a first hybrid fin and a second hybrid fin that extend parallel to the first fin-shaped structure, the first hybrid fin comprising a first conductive feature embedded in a first dielectric feature and the second hybrid fin comprising a second conductive feature embedded in a second dielectric feature;
forming a first source feature over the first source region and a first drain feature over the first drain region;
forming a first source contact in direct contact with the first source feature and the first conductive feature;
forming a first drain contact in direct contact with the first drain feature;
depositing a capping layer over the first source contact and the first drain contact;
bonding a second stack over the capping layer, the second stack including a second plurality of channel layers interleaved by a second plurality of sacrificial layers;
forming a second fin-shaped structure from the second stack, the second fin-shaped structure comprising a second source region and a second drain region;
forming a third hybrid fin and a fourth hybrid fin that extend parallel to the second fin-shaped structure, the third hybrid fin comprising a third conductive feature embedded in a third dielectric feature and the fourth hybrid fin comprising a fourth conductive feature embedded in a fourth dielectric feature;
forming a second source feature over the second source region and a second drain feature over the second drain region;
forming a second source contact in direct contact with the second source feature and the third conductive feature; and
forming a second drain contact in direct contact with the second drain feature.

17. The method of claim 16, further comprising:
forming a first contact via coupling the fourth conductive feature and the second conductive feature;
forming a second contact via below and in contact with the first conductive feature; and
forming a third contact via below and in contact with the second conductive feature.

18. The method of claim 17, further comprising:
forming a first interconnect structure over the second source contact and the second drain contact, the first interconnect structure comprising a first conductive line and a second conductive line;
forming a fourth contact via coupling the first drain contact and the first conductive line; and
forming a fifth contact via coupling the second drain contact and the second conductive line.

19. The method of claim 18, wherein the fourth contact via extends through the third dielectric feature and is electrically isolated from the third conductive feature.

20. The method of claim 18, further comprising:
forming a second interconnect structure below the first substrate,
wherein the second interconnect structure comprises a first power rail and a second power rail,
wherein the first power rail is coupled to the second contact via and the second power rail is coupled to the third contact via.

* * * * *